United States Patent
Lee et al.

(10) Patent No.: US 12,317,737 B2
(45) Date of Patent: *May 27, 2025

(54) POLYMER AND ORGANIC SOLAR CELL INCLUDING THE SAME

(71) Applicant: LG CHEM, LTD., Seoul (KR)

(72) Inventors: Jiyoung Lee, Daejeon (KR); Doowhan Choi, Daejeon (KR); Songrim Jang, Daejeon (KR); Bogyu Lim, Daejeon (KR)

(73) Assignee: LG Chem, LTD., Seoul (KR)

( * ) Notice: Subject to any disclaimer, the term of this patent is extended or adjusted under 35 U.S.C. 154(b) by 908 days.

This patent is subject to a terminal disclaimer.

(21) Appl. No.: 16/500,112

(22) PCT Filed: Feb. 22, 2019

(86) PCT No.: PCT/KR2019/002227
§ 371 (c)(1),
(2) Date: Oct. 2, 2019

(87) PCT Pub. No.: WO2019/172561
PCT Pub. Date: Sep. 12, 2019

(65) Prior Publication Data
US 2021/0111347 A1    Apr. 15, 2021

(30) Foreign Application Priority Data
Mar. 9, 2018 (KR) .................. 10-2018-0028092

(51) Int. Cl.
*H01L 31/00*     (2006.01)
*C08G 61/12*     (2006.01)
(Continued)

(52) U.S. Cl.
CPC ......... *H10K 85/113* (2023.02); *C08G 61/126* (2013.01); *H10K 85/151* (2023.02);
(Continued)

(58) Field of Classification Search
CPC ............. H01L 51/0036; H01L 51/0043; H01L 51/4253; C08G 61/126; C08G 2261/124;
(Continued)

(56) References Cited

U.S. PATENT DOCUMENTS 11,283,033 B2 *  3/2022  Lee .................... C08K 5/45
2017/0256728 A1  9/2017  Nanson et al.
2018/0033970 A1  2/2018  Lee et al.

FOREIGN PATENT DOCUMENTS

CN    104140521       11/2014
CN    106905306 A     6/2017
(Continued)

OTHER PUBLICATIONS

Li et al., "Donor polymer design enables efficient non-fullerene organic solar cells", Nature Communications, pp. 1-9, Oct. 26, 2016. (Year: 2016).*

(Continued)

*Primary Examiner* — Thanh Truc Trinh
(74) *Attorney, Agent, or Firm* — Saliwanchik, Lloyd & Eisenschenk

(57) ABSTRACT

The present specification relates to a polymer including a first unit of Chemical Formula 1; a second unit of Chemical Formula 2; and a third unit of Chemical Formula 3 or 4, and an organic solar cell including the same.

5 Claims, 2 Drawing Sheets

(51) Int. Cl.
*H10K 85/10* (2023.01)
*H10K 30/30* (2023.01)

(52) U.S. Cl.
CPC .......... *C08G 2261/124* (2013.01); *C08G 2261/1424* (2013.01); *C08G 2261/149* (2013.01); *C08G 2261/91* (2013.01); *H10K 30/30* (2023.02)

(58) Field of Classification Search
CPC ...... C08G 2261/1424; C08G 2261/149; C08G 2261/91; H10K 85/113; H10K 85/151; H10K 30/30
See application file for complete search history.

(56) References Cited

FOREIGN PATENT DOCUMENTS

| | | |
|---|---|---|
| CN | 106715519 B | 9/2020 |
| KR | 20130119916 | 11/2013 |
| KR | 1020140125924 A | 10/2014 |
| KR | 20160075370 | 6/2016 |
| KR | 20160097950 | 8/2016 |
| KR | 20180010065 | 1/2018 |
| KR | 20180009547 | 1/2019 |
| WO | 2012/030942 | 3/2012 |
| WO | 2017047808 A1 | 3/2017 |

OTHER PUBLICATIONS

Chakravarthi et al., "Synthesis and Photovoltaic Properties of 2D p-Conjugated Polymers Based on Alkylbenzothiophene Substituted Benzodithiophene Donor Unit with Titanium Sub-Oxide (TiOx) as an Interlayer in the Bulk Heterojunction Device Structure", J Inorg Organomet Polym (2015) 25:107-117. (Year: 2014).*

Fan et al., "Synergistic effect of fluorination on both donor and acceptor materials for high performance non-fullerene polymer solar cells with 13.5% efficiency", Sci China Chem, May 2018 Vo. 61 No. 5, 531-537 (Year: 2018).*

International Search Report corresponding to PCT/KR2019/002227, mailed May 31, 2019 (5 pages including English translation).

Hu et al. "Influence of Donor Polymer on the Molecular Ordering of Small Molecular Acceptors in Nonfullerene Polymer Solar Cells" Advanced Energy Materials, 8(5): 1701674 (2017) 9 pp.

Lee et al. "A feasible random copolymer approach for high-efficiency polymeric photovoltaic cells" Journal of Materials Chemistry A, 4(29): 11439-11445 (2016).

Tang, C.W. "Two=layer organic photovoltaic cell" Appl. Phys. Lett., 48(2):183-185 (1986).

Yu et al. "Polymer Photovoltaic Cells: Enhanced Efficiencies via a Network of Internal Donor-Acceptor Heterojunctions" Science, 270:1789-1791 (1995).

Liu et al. "Highly Efficient Photovoltaic Polymers Based on Benzodithiophene and Quinoxaline with Deeper HOMO Levels" Macromolecules, 48:5172-5178 (2015).

Wang et al. "Efficient Fullerene-Free Polymer Solar Cells based on Alkylthio Substituted Conjugated Polymers" The Journal of Physical Chemistry C, 121:4825-4833 (2017).

Zhang et al. "Fluorinated and Alkylthiolated Polymeric Donors Enable both Efficient Fullerene and Nonfullerene Polymer Solar Cells" Advanced Functional Materials, 28:1706404 (2018).

* cited by examiner

POLYMER AND ORGANIC SOLAR CELL INCLUDING THE SAME

CROSS REFERENCE TO RELATED APPLICATIONS

This application is a 35 U.S.C. § 371 national stage application of PCT International Application No. PCT/KR2019/002227, filed Feb. 22, 2019, which claims priority from Korean Patent Application No. 10-2018-0028092, filed Mar. 9, 2018, the contents of which are incorporated herein in their entireties by reference. The above-referenced PCT International Application was published in the Korean language as International Publication No. WO 2019/172561 on Sep. 12, 2019.

TECHNICAL FIELD

The present specification relates to a polymer and an organic solar cell including the same.

BACKGROUND ART

An organic solar cell is a device capable of directly converting solar energy to electric energy by applying a photovoltaic effect. Solar cells are divided into inorganic solar cells and organic solar cells depending on the materials forming a thin film. Typical solar cells are fabricated using a p-n junction by doping crystalline silicon (Si), an inorganic semiconductor. Electrons and holes generated by light absorption spread to p-n junction points, are accelerated by the electric field, and migrate to an electrode. Power conversion efficiency of this process is defined as a ratio of power given to an external circuit and solar power put into a solar cell, and the ratio has been accomplished up to approximately 24% when measured under a currently standardized hypothetical solar irradiation condition. However, existing inorganic solar cells already have limits in economic feasibility and material supplies, and therefore, organic material semiconductor solar cells that are readily processed, inexpensive and have various functions have been highly favored as a long-term alternative energy source.

For solar cells, it is important to increase efficiency so as to output as much electric energy as possible from solar energy. In order to increase efficiency of such solar cells, generating as much excitons as possible inside a semiconductor is important, however, taking the generated charges outside without loss is also important. One of the reasons for the charge loss is the dissipation of the generated electrons and holes by recombination. Various methods for delivering the generated electrons or holes to an electrode without loss have been proposed, however, most of the methods require additional processes, and accordingly, the fabricating costs may increase.

DISCLOSURE

Technical Problem

The present specification is directed to providing a polymer and an organic solar cell including the same.

Technical Solution

One embodiment of the present specification provides a polymer including a first unit represented by the following Chemical Formula 1; a second unit represented by the following Chemical Formula 2; and a third unit represented by the following Chemical Formula 3 or 4.

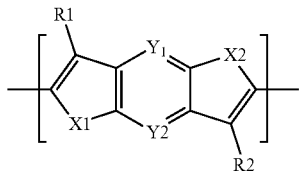

[Chemical Formula 1]

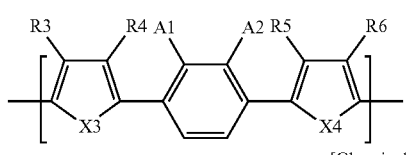

[Chemical Formula 2]

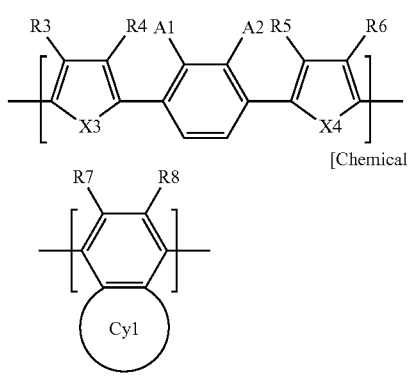

[Chemical Formula 3]

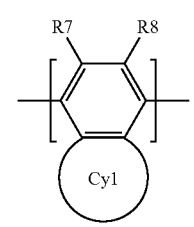

[Chemical Formula 4]

In Chemical Formulae 1 to 4,

X1 to X6 are the same as or different from each other, and each independently CRR', NR, O, SiRR', PR, S, GeRR', Se or Te, Y1 and Y2 are the same as or different from each other, and each independently CR", N, SiR", P or GeR", A1 and A2 are the same as or different from each other, and each independently a halogen group, Cy1 is a substituted or unsubstituted heteroring, Q1 and Q2 are the same as or different from each other, and each independently O or S, and R, R', R" and R1 to R8 are the same as or different from each other, and each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted alkylsulfoxy group; a substituted or unsubstituted arylsulfoxy group; a substituted or unsubstituted alkenyl group; a substituted or unsubstituted amine group; a substituted or unsubstituted aryl group; or a substituted or unsubstituted heterocyclic group.

Another embodiment of the present specification provides an organic solar cell including a first electrode; a second electrode disposed opposite to the first electrode; and one or more organic material layers disposed between the first electrode and the second electrode and including a photoactive layer, and one or more layers of the organic material layers include the polymer described above.

Advantageous Effects

A polymer according to one embodiment of the present specification is an electroconductive material, and has thermal stability, excellent solubility and high electron mobility. Accordingly, excellent electrical properties can be obtained when used in an organic solar cell.

In addition, the polymer according to one embodiment of the present specification has a high HOMO energy level, and when obtaining an organic solar cell including the same, excellent efficiency properties are obtained.

REFERENCE NUMERAL

Figures 1, 2:
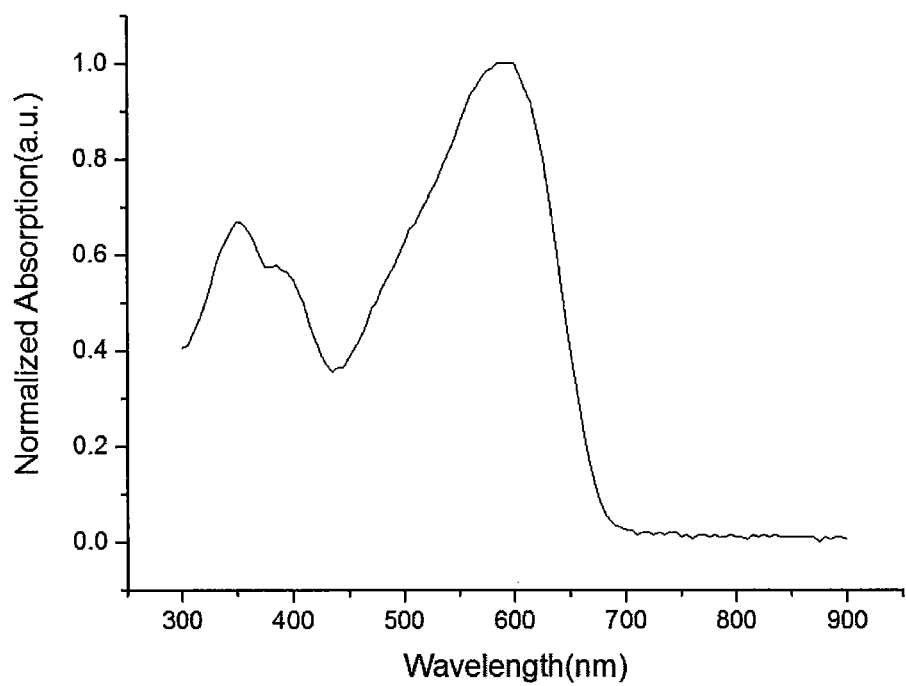
FIG. 1 is a diagram illustrating an organic solar cell according to one embodiment of the present specification.
FIG. 2 is a diagram presenting a UV-Vis spectrum of Polymer 5 in a film state.

101: First Electrode
102: Electron Transfer Layer
103: Photoactive Layer
104: Hole Transfer Layer
105: Second Electrode

MODE FOR DISCLOSURE

Hereinafter, the present specification will be described in more detail.

In the present specification, a 'unit' is a repeated structure included in a monomer of a polymer, and means a structure in which the monomer bonds in the polymer by polymerization.

In the present specification, the meaning of 'including a unit' means being included in a main chain in a polymer.

In the present specification, a description of a certain part "including" certain constituents means capable of further including other constituents, and does not exclude other constituents unless particularly stated on the contrary.

In the present specification, an energy level means energy magnitude. Therefore, even when an energy level is expressed in a negative (−) direction from a vacuum level, the energy level is interpreted to mean an absolute value of the corresponding energy value. For example, a HOMO energy level means a distance from a vacuum level to the highest occupied molecular orbital. In addition, a LUMO energy level means a distance from a vacuum level to the lowest unoccupied molecular orbital.

A polymer according to one embodiment of the present specification includes a first unit represented by the following Chemical Formula 1; a second unit represented by the following Chemical Formula 2; and a third unit represented by the following Chemical Formula 3 or 4.

The polymer according to one embodiment of the present specification includes a second unit represented by Chemical Formula 2. In one embodiment of the present specification, A1 and A2 substitute an ortho position of the benzene ring. This results in low crystallinity forming a small domain.

Accordingly, an organic solar cell including the same exhibits excellent electrical properties, and has excellent efficiency.

Examples of the substituents are described below, however, the substituents are not limited thereto.

The term "substitution" means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

In the present specification, the term "substituted or unsubstituted" means being substituted with one or more substituents selected from the group consisting of deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted aryl group; and a substituted or unsubstituted heterocyclic group, being substituted with a substituent linking two or more substituents among the substituents illustrated above, or having no substituents. For example, "a substituent linking two or more substituents" may include a biphenyl group. In other words, a biphenyl group may be an aryl group, or interpreted as a substituent linking two phenyl groups.

In the present specification, the number of carbon atoms of the imide group is not particularly limited, but is preferably from 1 to 30. Specifically, compounds having structures as below may be included, however, the imide group is not limited thereto.

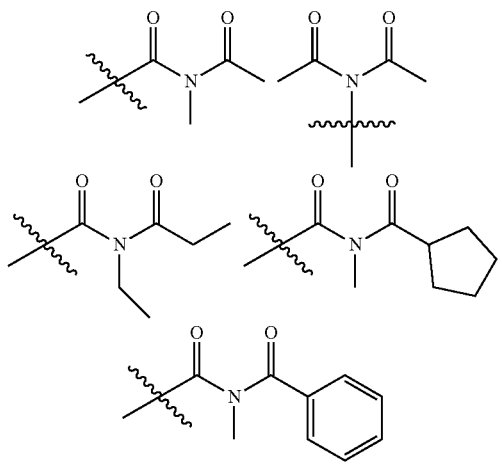

In the present specification, in the amide group, the nitrogen of the amide group may be substituted once or twice with a linear, branched or cyclic alkyl group having 1 to 30 carbon atoms or an aryl group having 6 to 30 carbon atoms. Specifically, compounds having the following structural formulae may be included, however, the amide group is not limited thereto.

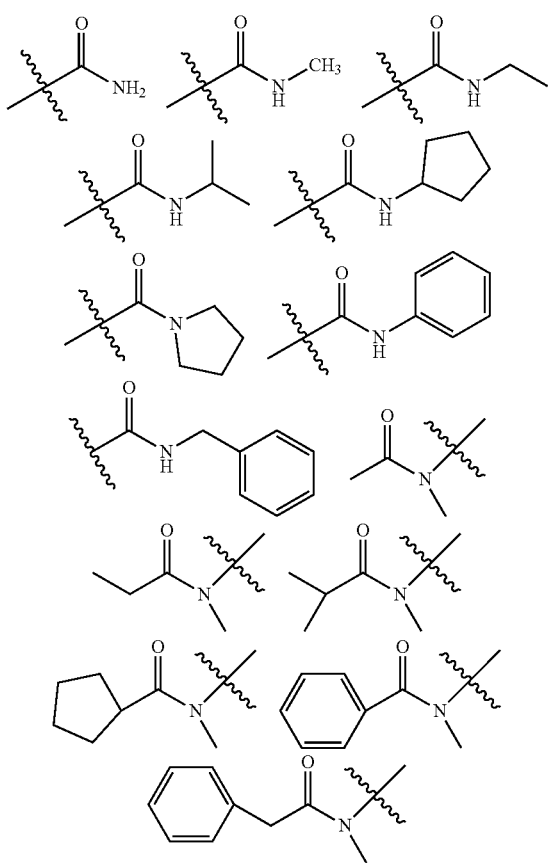

In the present specification, examples of the halogen group may include fluorine, chlorine, bromine or iodine.

In the present specification, the alkyl group may be linear or branched, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 60 carbon atoms. Specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy and the like, but are not limited thereto.

In the present specification, the alkenyl group may be linear or branched, and although not particularly limited thereto, the number of carbon atoms is preferably from 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

When the aryl group is a monocyclic aryl group in the present specification, the number of carbon atoms is not particularly limited, but is preferably from 6 to 25. Specific examples of the monocyclic aryl group may include a phenyl group, a biphenyl group, a terphenyl group and the like, but are not limited thereto.

When the aryl group is a polycyclic aryl group in the present specification, the number of carbon atoms is not particularly limited, but is preferably from 10 to 24. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

When the fluorenyl group is substituted,

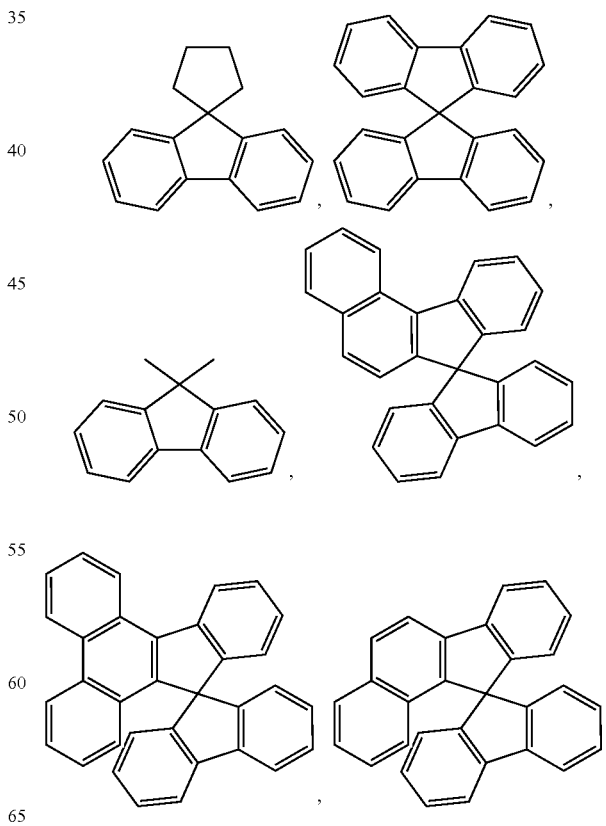

-continued

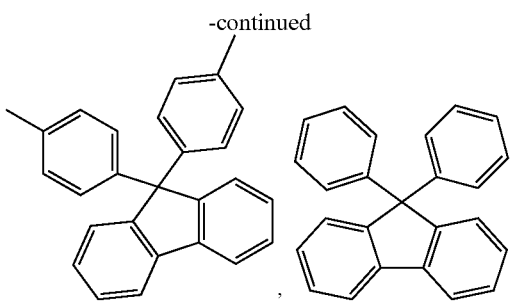

and the like may be included. However, the structure is not limited thereto.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms of the heterocyclic group is not particularly limited, but is preferably from 2 to 60. Examples of the heterocyclic group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthridyl group, a phenanthroline group, a thiazolyl group, an isoxazolyl group, an oxadiazolyl group, a thiadiazolyl group, a benzothiazolyl group, a phenothiazinyl group, a dibenzofuranyl group and the like, but are not limited thereto.

In the present specification, the number of carbon atoms of the amine group is not particularly limited, but is preferably from 1 to 30. In the amine group, the N atom may be substituted with an aryl group, an alkyl group, an arylalkyl group, a heterocyclic group and the like, and specific examples of the amine group may include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenyhlnaphthylamine group, a ditolylamine group, a phenyltolylamine group, a tiphenylamine group and the like, but are not limited thereto.

In the present specification, the aryl group in the aryloxy group, the arylthio group and the arylsulfoxy group is the same as the examples of the aryl group described above. Specific examples of the aryloxy group may include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, benzyloxy, p-methylbenzyloxy and the like, examples of the arylthio group may include a phenylthio group, a 2-methylphenylthio group, a 4-tert-butylphenylthio group and the like, and examples of the arylsulfoxy group may include a benzenesulfoxy group, p-toluenesulfoxy group and the like, however, the aryloxy group, the arylthio group and the arylsulfoxy group are not limited thereto.

In the present specification, the alkyl group in the alkylthio group and the alkylsulfoxy group is the same as the examples of the alkyl group described above. Specific examples of the alkylsulfoxy group may include a methylsulfoxy group, an ethylsulfoxy group, a propylsulfoxy group, a butylsulfoxy group and the like, but are not limited thereto.

In the present specification, the alkylthio group means a substituent represented by —S—R (R is an alkyl group), and may be linear, branched or cyclic. The number of carbon atoms of the alkylthio group is not particularly limited, but is preferably from 1 to 20. Specific examples thereof may include methylthio, ethylthio, n-propylthio, isopropylthio, i-propylthio, n-butylthio, isobutylthio, tert-butylthio, sec-butylthio, n-pentylthio, neopentylthio, isopentylthio, n-hexylthio, 3,3-dimethylbutylthio, 2-ethylbutylthio, n-octylthio, n-nonylthio, n-decylthio, benzylthio, p-methylbenzylthio and the like, but are not limited thereto.

In the present specification, the hydrocarbon ring or the heteroring may be cycloheteroalkyl, cycloheteroalkenyl, cycloheteroketone, an aliphatic heteroring, an aromatic heteroring or a fused ring thereof, and may be selected from among the examples of the heterocyclic group except for those that are not monovalent.

According to one embodiment of the present specification, in Chemical Formula 1, X1 is S.

According to one embodiment of the present specification, in Chemical Formula 1, X2 is S.

According to one embodiment of the present specification, in Chemical Formula 1, X1 is O.

According to one embodiment of the present specification, in Chemical Formula 1, X2 is O.

According to one embodiment of the present specification, in Chemical Formula 1, Y1 is CR".

According to one embodiment of the present specification, in Chemical Formula 1, Y2 is CR".

According to one embodiment of the present specification, in Chemical Formula 1, R1 is hydrogen.

According to one embodiment of the present specification, in Chemical Formula 1, R2 is hydrogen.

According to one embodiment of the present specification, the first unit is represented by the following Chemical Formula 1-1.

[Chemical Formula 1-1]

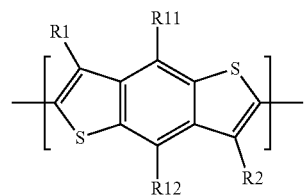

In Chemical Formula 1-1,
R1 and R2 have the same definitions as in Chemical Formula 1, and
R11 and R12 are the same as or different from each other, and each independently a substituted or unsubstituted alkyl group; a substituted or unsubstituted alkoxy group; a substituted or unsubstituted aryloxy group; a substituted or unsubstituted alkylthio group; a substituted or unsubstituted arylthio group; a substituted or unsubstituted aryl group; or a substituted or unsubstituted heterocyclic group.

According to one embodiment of the present specification, in Chemical Formula 1-1, R11 is a substituted or unsubstituted linear or branched alkoxy group; a substituted or unsubstituted aryl group; or a substituted or unsubstituted heterocyclic group.

According to one embodiment of the present specification, in Chemical Formula 1-1, R11 is a linear or branched alkoxy group; an aryl group substituted with a linear or branched alkoxy group; or a heterocyclic group substituted with one or more selected from among a linear or branched alkyl group, a linear or branched alkylthio group, and a halogen group.

According to one embodiment of the present specification, in Chemical Formula 1-1, R11 is linear or branched alkoxy group; a phenyl group substituted with a linear or branched alkoxy group; a thiophene group substituted with one or more selected from among a linear or branched alkyl group, a linear or branched alkylthio group, and a halogen group; or a benzothiophene group substituted with a linear or branched alkyl group.

According to one embodiment of the present specification, in Chemical Formula 1-1, R12 is a substituted or unsubstituted linear or branched alkoxy group; a substituted or unsubstituted aryl group; or a substituted or unsubstituted heterocyclic group.

According to one embodiment of the present specification, in Chemical Formula 1-1, R12 is a linear or branched alkoxy group; an aryl group substituted with a linear or branched alkoxy group; or a heterocyclic group substituted with one or more selected from among a linear or branched alkyl group, a linear or branched alkylthio group, and a halogen group.

According to one embodiment of the present specification, in Chemical Formula 1-1, R12 is a linear or branched alkoxy group; a phenyl group substituted with a linear or branched alkoxy group; a thiophene group substituted with one or more selected from among a linear or branched alkyl group, a linear or branched alkylthio group, and a halogen group; or a benzothiophene group substituted with a linear or branched alkyl group.

According to one embodiment of the present specification, the first unit is represented by any one of the following Chemical Formulae 1-2 to 1-7.

[Chemical Formula 1-2]

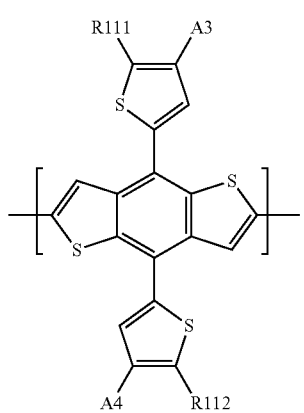

[Chemical Formula 1-3]

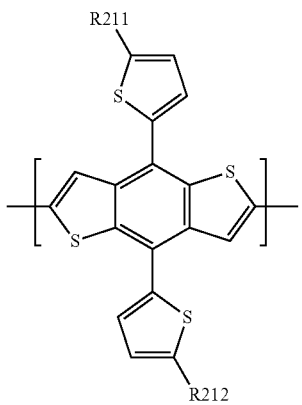

[Chemical Formula 1-4]

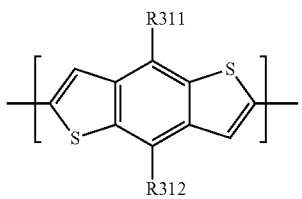

[Chemical Formula 1-5]

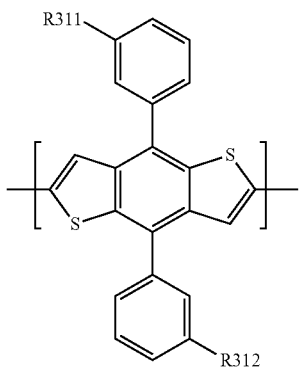

[Chemical Formula 1-6]

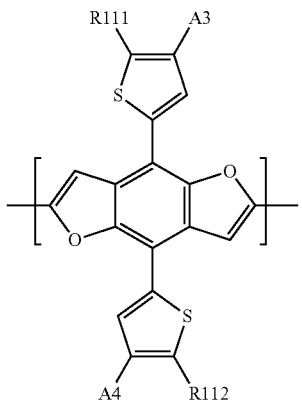

[Chemical Formula 1-7]

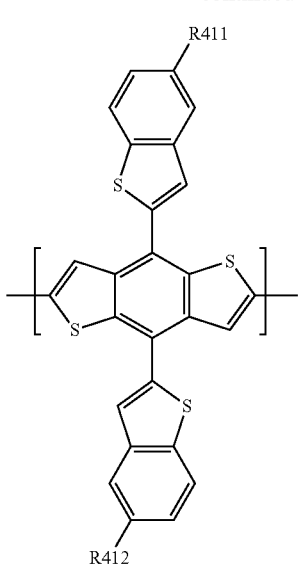

In Chemical Formulae 1-2 to 1-7,

A3 and A4 are the same as or different from each other, and each independently a halogen group, R111, R112, R211 and R212 are the same as or different from each other, and each independently a substituted or unsubstituted alkyl group; a substituted or unsubstituted silyl group; or a substituted or unsubstituted alkylthio group, and R311, R312, R411 and R412 are the same as or different from each other, and each independently a substituted or unsubstituted alkyl group; or a substituted or unsubstituted alkoxy group.

According to one embodiment of the present specification, in Chemical Formulae 1-2 and 1-6, R111 is a substituted or unsubstituted linear or branched alkyl group.

According to one embodiment of the present specification, in Chemical Formulae 1-2 and 1-6, R111 is a linear or branched alkyl group.

According to one embodiment of the present specification, in Chemical Formulae 1-2 and 1-6, R111 is a branched alkyl group.

According to one embodiment of the present specification, in Chemical Formulae 1-2 and 1-6, R111 is a 2-ethylhexyl group.

According to one embodiment of the present specification, in Chemical Formulae 1-2 and 1-6, R112 is a substituted or unsubstituted linear or branched alkyl group.

According to one embodiment of the present specification, in Chemical Formulae 1-2 and 1-6, R112 is a linear or branched alkyl group.

According to one embodiment of the present specification, in Chemical Formulae 1-2 and 1-6, R112 is a branched alkyl group.

According to one embodiment of the present specification, in Chemical Formulae 1-2 and 1-6, R112 is a 2-ethylhexyl group.

According to one embodiment of the present specification, in Chemical Formula 1-3, R211 is a substituted or unsubstituted linear or branched alkyl group; a silyl group unsubstituted or substituted with an alkyl group or an aryl group; or a substituted or unsubstituted linear or branched alkylthio group.

According to one embodiment of the present specification, in Chemical Formula 1-3, R211 is a linear or branched alkyl group; a silyl group unsubstituted or substituted with a linear alkyl group or an aryl group; or a linear or branched alkylthio group.

According to one embodiment of the present specification, in Chemical Formula 1-3, R211 is a branched alkyl group; a silyl group substituted with a linear alkyl group; or a branched alkylthio group.

According to one embodiment of the present specification, in Chemical Formula 1-3, R211 is a 2-ethylhexyl group; a tributylsilyl group; or a 2-ethylhexylthio group.

According to one embodiment of the present specification, in Chemical Formula 1-3, R212 is a substituted or unsubstituted linear or branched alkyl group; a silyl group unsubstituted or substituted with an alkyl group; or a substituted or unsubstituted linear or branched alkylthio group.

According to one embodiment of the present specification, in Chemical Formula 1-3, R212 is a linear or branched alkyl group; a silyl group unsubstituted or substituted with a linear alkyl group; or a linear or branched alkylthio group.

According to one embodiment of the present specification, in Chemical Formula 1-3, R212 is a branched alkyl group; a silyl group substituted with a linear alkyl group; or a branched alkylthio group.

According to one embodiment of the present specification, in Chemical Formula 1-3, R212 is a 2-ethylhexyl group; a tributylsilyl group; or a 2-ethylhexylthio group.

According to one embodiment of the present specification, in Chemical Formulae 1-4 and 1-5, R311 is a substituted or unsubstituted linear or branched alkoxy group.

According to one embodiment of the present specification, in Chemical Formulae 1-4 and 1-5, R311 is a linear or branched alkoxy group.

According to one embodiment of the present specification, in Chemical Formulae 1-4 and 1-5, R311 is a branched alkoxy group.

According to one embodiment of the present specification, in Chemical Formulae 1-4 and 1-5, R311 is a 2-ethylhexyloxy group.

According to one embodiment of the present specification, in Chemical Formulae 1-4 and 1-5, R312 is a substituted or unsubstituted linear or branched alkoxy group.

According to one embodiment of the present specification, in Chemical Formulae 1-4 and 1-5, R312 is a linear or branched alkoxy group.

According to one embodiment of the present specification, in Chemical Formulae 1-4 and 1-5, R312 is a branched alkoxy group.

According to one embodiment of the present specification, in Chemical Formulae 1-4 and 1-5, R312 is a 2-ethylhexyloxy group.

According to one embodiment of the present specification, in Chemical Formula 1-7, R411 and R412 are each a substituted or unsubstituted alkyl group.

According to one embodiment of the present specification, in Chemical Formula 1-7, R411 and R412 are each a substituted or unsubstituted linear or branched alkyl group.

According to one embodiment of the present specification, in Chemical Formula 1-7, R411 and R412 are each a branched alkyl group.

According to one' embodiment of the present specification, in Chemical Formula 1-7, R411 and R412 are each a branched $C_6$-$C_{15}$ alkyl group.

According to one embodiment of the present specification, in Chemical Formula 1-7, R411 and R412 are each a branched $C_8$-$C_{12}$ alkyl group.

According to one embodiment of the present specification, in Chemical Formula 1-7, R411 and R412 are each a 2-butyloctyl group.

According to one embodiment of the present specification, in Chemical Formulae 1-2 and 1-6, A3 and A4 are each fluorine or chlorine.

According to one embodiment of the present specification, in Chemical Formula 2, X3 is S.

According to one embodiment of the present specification, in Chemical Formula 2, X4 is S.

According to one embodiment of the present specification, the second unit is represented by the following Chemical Formula 2-1.

[Chemical Formula 2-1]

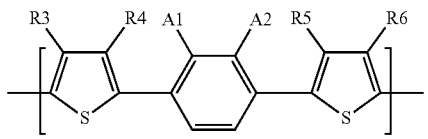

In Chemical Formula 2-1,
R3 to R6, A1 and A2 have the same definitions as in Chemical Formula 2.

According to one embodiment of the present specification, in Chemical Formula 2, R3 to R6 are hydrogen.

According to one embodiment of the present specification, in Chemical Formula 2, A1 and A2 are fluorine.

According to one embodiment of the present specification, the second unit is represented by the following Chemical Formula 2-2.

[Chemical Formula 2-2]

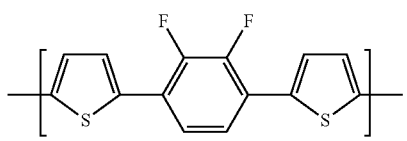

According to one embodiment of the present specification, in Chemical Formula 3, Cy is a heteroring including one or more of N, O, S, Si, Ge, Te, P and Se as a heteroatom, and substituted or unsubstituted.

According to one embodiment of the present specification, in Chemical Formula 3, Cy is a monocycle 5-membered or 6-membered heteroring including one or more of N, O, S, Si, Ge, Te, P and Se as a heteroatom, and substituted or unsubstituted.

According to one embodiment of the present specification, the third unit is represented by the following Chemical Formula 3-1 or 3-2.

[Chemical Formula 3-1]

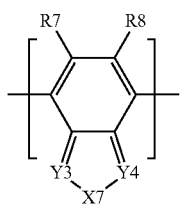

[Chemical Formula 3-2]

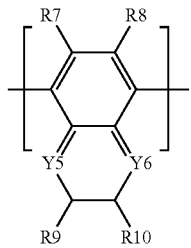

In Chemical Formulae 3-1 and 3-2,
R7 and R8 have the same definitions as in Chemical Formula 3,
X7 is CRR', NR, O, SiRR', PR, S, GeRR', Se or Te,
Y3 to Y6 are the same as or different from each other, and each independently CR'', N, SiR'', P or GeR'',
R, R', R'', R9 and R10 are the same as or different from each other, and each independently hydrogen; a substituted or unsubstituted alkyl group; a substituted or unsubstituted alkoxy group; a substituted or unsubstituted aryloxy group; a substituted or unsubstituted alkylthio group; a substituted or unsubstituted arylthio group; a substituted or unsubstituted aryl group; or a substituted or unsubstituted heterocyclic group.

According to one embodiment of the present specification, in Chemical Formula 4, X5 is S.

According to one embodiment of the present specification, in Chemical Formula 4, X6 is NR.

According to one embodiment of the present specification, in Chemical Formula 4, Q1 and Q2 are O.

According to one embodiment of the present specification, the third unit is represented by any one of the following Chemical Formulae 3-3 to 3-7.

[Chemical Formula 3-3]

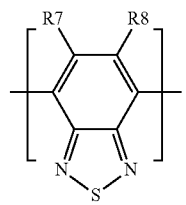

[Chemical Formula 3-4]

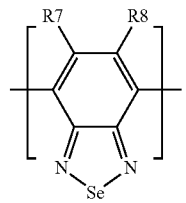

[Chemical Formula 3-5]

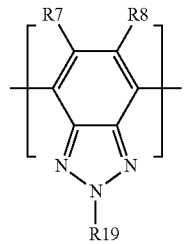

-continued

[Chemical Formula 3-6]

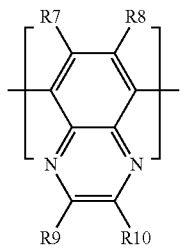

[Chemical Formula 3-7]

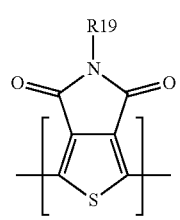

In Chemical Formulae 3-3 to 3-7,

R7 and R8 have the same definitions as in Chemical Formula 3,

R9, R10 and R19 are the same as or different from each other, and each independently hydrogen; a substituted or unsubstituted alkyl group; a substituted or unsubstituted alkoxy group; a substituted or unsubstituted aryloxy group; a substituted or unsubstituted alkylthio group; a substituted or unsubstituted arylthio group; a substituted or unsubstituted aryl group; or a substituted or unsubstituted heterocyclic group.

According to one embodiment of the present specification, in Chemical Formula 3, R7 is hydrogen; or a substituted or unsubstituted alkoxy group.

According to one embodiment of the present specification, in Chemical Formula 3, R7 is hydrogen; or a substituted or unsubstituted linear or branched alkoxy group.

According to one embodiment of the present specification, in Chemical Formula 3, R7 is hydrogen; or a linear or branched alkoxy group.

According to one embodiment of the present specification, in Chemical Formula 3, R7 is hydrogen; or a linear alkoxy group.

According to one embodiment of the present specification, in Chemical Formula 3, R7 is hydrogen; or a linear $C_1$-$C_{20}$ alkoxy group.

According to one embodiment of the present specification, in Chemical Formula 3, R7 is hydrogen; or a linear $C_{10}$-$C_{20}$ alkoxy group.

According to one embodiment of the present specification, in Chemical Formula 3, R7 is hydrogen; or an n-dodecyloxy group.

According to one embodiment of the present specification, in Chemical Formula 3, R7 is a branched alkoxy group.

According to one embodiment of the present specification, in Chemical Formula 3, R7 is a $C_3$-$C_{20}$ branched alkoxy group.

According to one embodiment of the present specification, in Chemical Formula 3, R7 is a $C_{10}$-$C_{20}$ branched alkoxy group.

According to one embodiment of the present specification, in Chemical Formula 3, R7 is a 2-butyloctyloxy group.

According to one embodiment of the present specification, in Chemical Formula 3, R8 is hydrogen; or a substituted or unsubstituted alkoxy group.

According to one embodiment of the present specification, in Chemical Formula 3, R8 is hydrogen; or a substituted or unsubstituted linear or branched alkoxy group.

According to one embodiment of the present specification, in Chemical Formula 3, R8 is hydrogen; or a linear or branched alkoxy group.

According to one embodiment of the present specification, in Chemical Formula 3, R8 is hydrogen; or a linear alkoxy group.

According to one embodiment of the present specification, in Chemical Formula 3, R8 is hydrogen; or a linear $C_1$-$C_{20}$ alkoxy group.

According to one embodiment of the present specification, in Chemical Formula 3, R8 is hydrogen; or a linear $C_{10}$-$C_{20}$ alkoxy group.

According to one embodiment of the present specification, in Chemical Formula 3, R8 is hydrogen; or an n-dodecyloxy group.

According to one embodiment of the present specification, in Chemical Formula 3, R8 is a branched alkoxy group.

According to one embodiment of the present specification, in Chemical Formula 3, R8 is a $C_3$-$C_{20}$ branched alkoxy group.

According to one embodiment of the present specification, in Chemical Formula 3, R8 is a $C_{10}$-$C_{20}$ branched alkoxy group.

According to one embodiment of the present specification, in Chemical Formula 3, R8 is a 2-butyloctyloxy group.

According to one embodiment of the present specification, in Chemical Formulae 3-3 and 3-4, R7 is a substituted or unsubstituted alkoxy group.

According to one embodiment of the present specification, in Chemical Formulae 3-3 and 3-4, R7 is a substituted or unsubstituted linear or branched alkoxy group.

According to one embodiment of the present specification, in Chemical Formulae 3-3 and 3-4, R7 is a linear or branched alkoxy group.

According to one embodiment of the present specification, in Chemical Formulae 3-3 and 3-4, R7 is a linear alkoxy group.

According to one embodiment of the present specification, in Chemical Formulae 3-3 and 3-4, R7 is hydrogen; or a linear $C_1$-$C_{20}$ alkoxy group.

According to one embodiment of the present specification, in Chemical Formulae 3-3 and 3-4, R7 is hydrogen; or a linear $C_{10}$-$C_{20}$ alkoxy group.

According to one embodiment of the present specification, in Chemical Formulae 3-3 and 3-4, R7 is an n-dodecyloxy group.

According to one embodiment of the present specification, in Chemical Formulae 3-3 and 3-4, R7 is a branched alkoxy group.

According to one embodiment of the present specification, in Chemical Formulae 3-3 and 3-4, R7 is a $C_3$-$C_{20}$ branched alkoxy group.

According to one embodiment of the present specification, in Chemical Formulae 3-3 and 3-4, R7 is a $C_{10}$-$C_{20}$ branched alkoxy group.

According to one embodiment of the present specification, in Chemical Formulae 3-3 and 3-4, R7 is a 2-butyloctyloxy group.

According to one embodiment of the present specification, in Chemical Formulae 3-3 and 3-4, R8 is a substituted or unsubstituted alkoxy group.

According to one embodiment of the present specification, in Chemical Formulae 3-3 and 3-4, R8 is a substituted or unsubstituted linear or branched alkoxy group.

According to one embodiment of the present specification, in Chemical Formulae 3-3 and 3-4, R8 is a linear or branched alkoxy group.

According to one embodiment of the present specification, in Chemical Formulae 3-3 and 3-4, R8 is a linear alkoxy group.

According to one embodiment of the present specification, in Chemical Formulae 3-3 and 3-4, R8 is hydrogen; or a linear $C_1$-$C_{20}$ alkoxy group.

According to one embodiment of the present specification, in Chemical Formulae 3-3 and 3-4, R8 is hydrogen; or a linear $C_{10}$-$C_{20}$ alkoxy group.

According to one embodiment of the present specification, in Chemical Formulae 3-3 and 3-4, R8 is an n-dodecyloxy group.

According to one embodiment of the present specification, in Chemical Formulae 3-3 and 3-4, R8 is a branched alkoxy group.

According to one embodiment of the present specification, in Chemical Formulae 3-3 and 3-4, R8 is a $C_3$-$C_{20}$ branched alkoxy group.

According to one embodiment of the present specification, in Chemical Formulae 3-3 and 3-4, R8 is a $C_{10}$-$C_{20}$ branched alkoxy group.

According to one embodiment of the present specification, in Chemical Formulae 3-3 and 3-4, R8 is a 2-butyloctyloxy group.

According to one embodiment of the present specification, in Chemical Formulae 3-5 and 3-6, R7 and R8 are hydrogen.

According to one embodiment of the present specification, in Chemical Formula 3-5, R19 is a substituted or unsubstituted alkyl group.

According to one embodiment of the present specification, in Chemical Formula 3-5, R19 is a substituted or unsubstituted linear or branched alkyl group.

According to one embodiment of the present specification, in Chemical Formula 3-5, R19 is a branched alkyl group.

According to one embodiment of the present specification, in Chemical Formula 3-5, R19 is a branched $C_6$-$C_{15}$ alkyl group.

According to one embodiment of the present specification, in Chemical Formula 3-5, R19 is a branched $C_8$-$C_{12}$ alkyl group.

According to one embodiment of the present specification, in Chemical Formula 3-5, R19 is a 2-ethylhexyl group or a 2-butyloctyl group.

According to one embodiment of the present specification, in Chemical Formula 3-6, R9 and R10 are the same as or different from each other, and each independently a substituted or unsubstituted aryl group.

According to one embodiment of the present specification, in Chemical Formula 3-6, R9 and R10 are the same as or different from each other, and each independently an aryl group substituted with a linear or branched alkoxy group.

According to one embodiment of the present specification, in Chemical Formula 3-6, R9 and R10 are the same as or different from each other, and each independently a phenyl group substituted with a linear or branched alkoxy group.

According to one embodiment of the present specification, in Chemical Formula 3-6, R9 and R10 are the same as or different from each other, and each independently a phenyl group substituted with a linear alkoxy group.

According to one embodiment of the present specification, in Chemical Formula 3-6, R9 and R10 are a phenyl group substituted with an n-octyloxy group.

According to one embodiment of the present specification, in Chemical Formula 3-7, R19 is a substituted or unsubstituted alkyl group.

According to one embodiment of the present specification, in Chemical Formula 3-7, R19 is a substituted or unsubstituted linear or branched alkyl group.

According to one embodiment of the present specification, in Chemical Formula 3-7, R19 is a branched alkyl group.

According to one embodiment of the present specification, in Chemical Formula 3-7, R19 is a 2-ethylhexyl group.

According to one embodiment of the present specification, the polymer includes a unit represented by the following Chemical Formula 5.

[Chemical Formula 5]

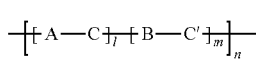

In Chemical Formula 5, l is, as a mole fraction, a real number of 0<l<1, m is, as a mole fraction, a real number of 0<m<1, l+m=1, A is the first unit represented by Chemical Formula 1, B is the second unit represented by Chemical Formula 2, C and C' are the same as or different from each other, and each independently the third unit represented by Chemical Formula 3 or Chemical Formula 4, and n is, as a repetition number of the unit, an integer of 1 to 10,000.

A1 and A2 in the second unit represented by Chemical Formula 2-1 of the present specification, and an S atom of thiophene; or A1 and A2 in the second unit represented by Chemical Formula 2-1, and an S atom of the first unit represented by Chemical Formula 1-1 interact with each other.

Herein, interacting with each other means a chemical structure or atoms forming a chemical structure having non-covalent bonding interactions that influence each other by an action other than covalent bonds, and for example, may mean chalcogen bonds.

In addition, by the third unit represented by any one of Chemical Formulae 3-3 to 3-7 including R7 and R8 in one embodiment of the present specification, an O atom of R7 and R8; A1 and A2 of the second unit represented by Chemical Formula 2; and an S atom of the first unit represented by Chemical Formula 1 may interact with each other to form a planar structure.

Accordingly, an increase in the current may be induced when including the polymer according to one embodiment of the present specification, and a device with high efficiency may be provided.

According to one embodiment of the present specification, A is the first unit represented by Chemical Formula 1-1.

According to one embodiment of the present specification, B is the second unit represented by Chemical Formula 2-1.

According to one embodiment of the present specification, C is the third unit represented by any one selected from among Chemical Formulae 3-3 to 3-7.

According to one embodiment of the present specification, C' is the third unit represented by any one selected from among Chemical Formulae 3-3 to 3-7.

According to one embodiment of the present specification, the polymer includes a unit represented by the following Chemical Formula 5-1 or 5-2.

[Chemical Formula 5-1]

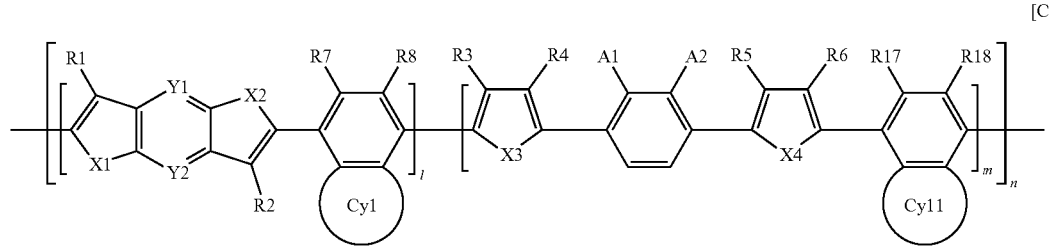

[Chemical Formula 5-2]

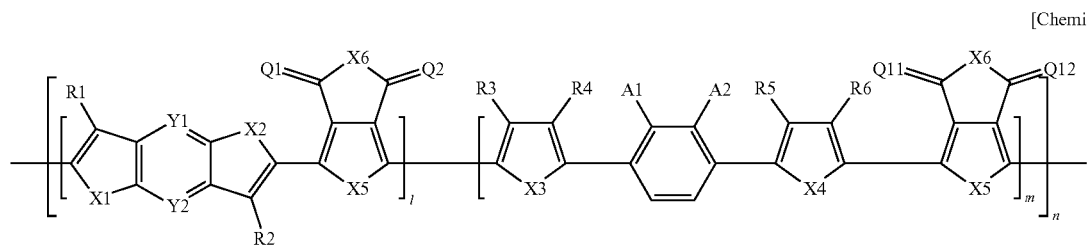

In Chemical Formulae 5-1 and 5-2,

X1 to X6, Y1, Y2, R1 to R8, Cy1, Q1, Q2, A1 and A2 have the same definitions as in Chemical Formulae 1 to 4, Cy11 is a substituted or unsubstituted heteroring, Q11 and Q12 are the same as or different from each other, and each independently O or S, X15 and X16 are the same as or different from each other, and each independently CRR', NR, O, SiRR', PR, S, GeRR', Se or Te, R, R', R17 and R18 are the same as or different from each other, and each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthio group; a substituted or unsubstituted arylthio group; a substituted or unsubstituted alkylsulfoxy group; a substituted or unsubstituted arylsulfoxy group; a substituted or unsubstituted alkenyl group; a substituted or unsubstituted amine group; a substituted or unsubstituted aryl group; or a substituted or unsubstituted heterocyclic group, l is, as a mole fraction, a real number of $0 < l < 1$, m is, as a mole fraction, a real number of $0 < m < 1$, l+m=1, and n is, as a repetition number of the unit, an integer of 1 to 10,000.

According to one embodiment of the present specification, the polymer includes a unit represented by any one of the following Chemical Formulae 5-3-1 to 5-3-3.

[Chemical Formula 5-3-1]

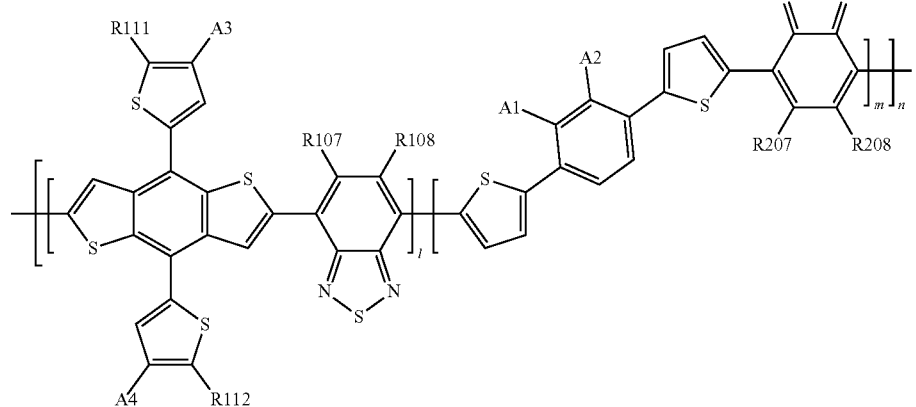

-continued

[Chemical Formula 5-3-2]

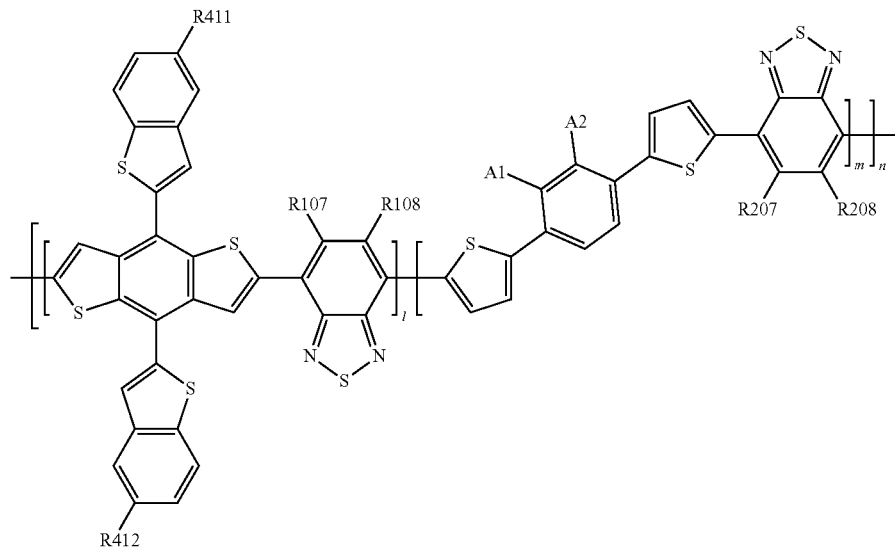

[Chemical Formula 5-3-3]

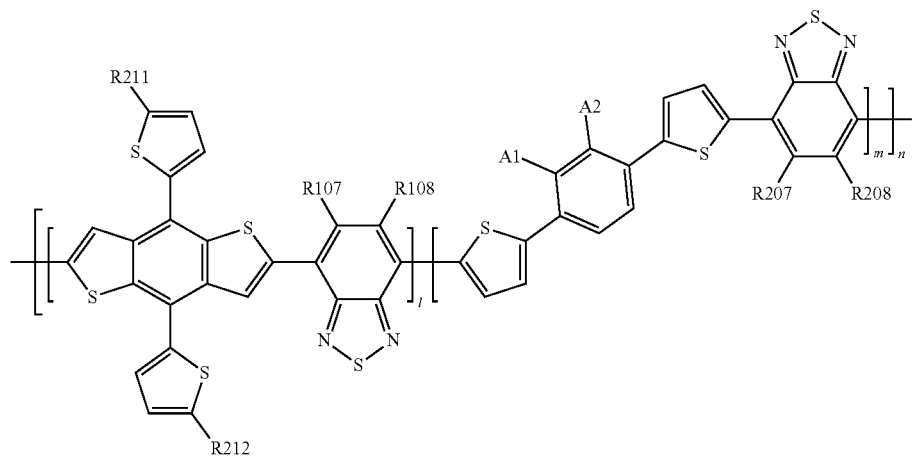

In Chemical Formulae 5-3-1 to 5-3-3,

A1 to A4 are the same as or different from each other, and each independently a halogen group, R107, R108, R207 and R208 are the same as or different from each other, and each independently a substituted or unsubstituted alkoxy group, R111, R112, R211 and R212 are the same as or different from each other, and each independently a substituted or unsubstituted alkyl group; a substituted or unsubstituted silyl group; or a substituted or unsubstituted alkylthio group, R411 and R412 are the same as or different from each other, and each independently a substituted or unsubstituted alkyl group; or a substituted or unsubstituted alkoxy group, l is, as a mole fraction, a real number of $0<l<1$, m is, as a mole fraction, a real number of $0<m<1$, l+m=1, and n is, as a repetition number of the unit, an integer of 1 to 10,000.

According to one embodiment of the present specification, the polymer includes a unit represented by any one of the following Chemical Formulae 5-4 to 5-60.

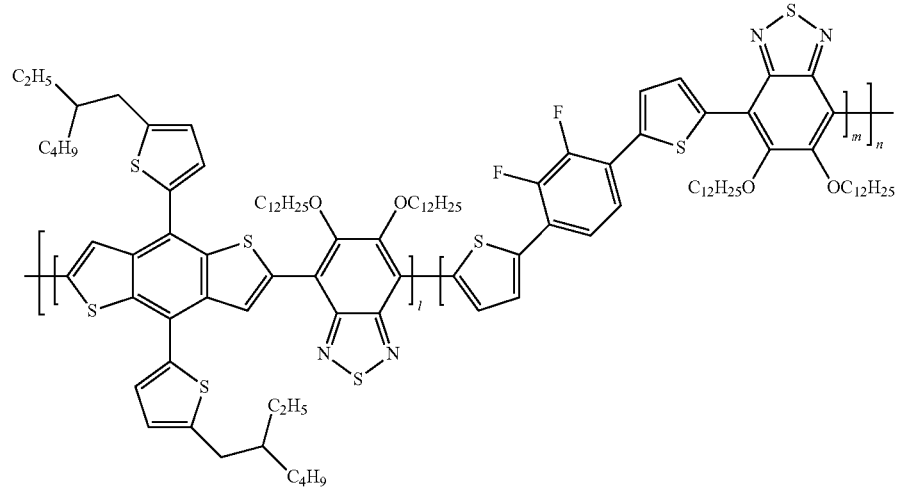
[Chemical Formula 5-4]
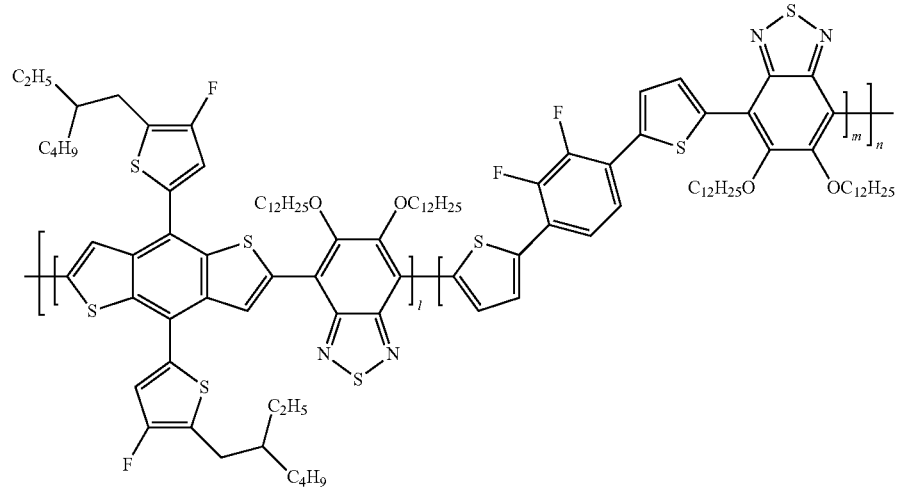
[Chemical Formula 5-5]
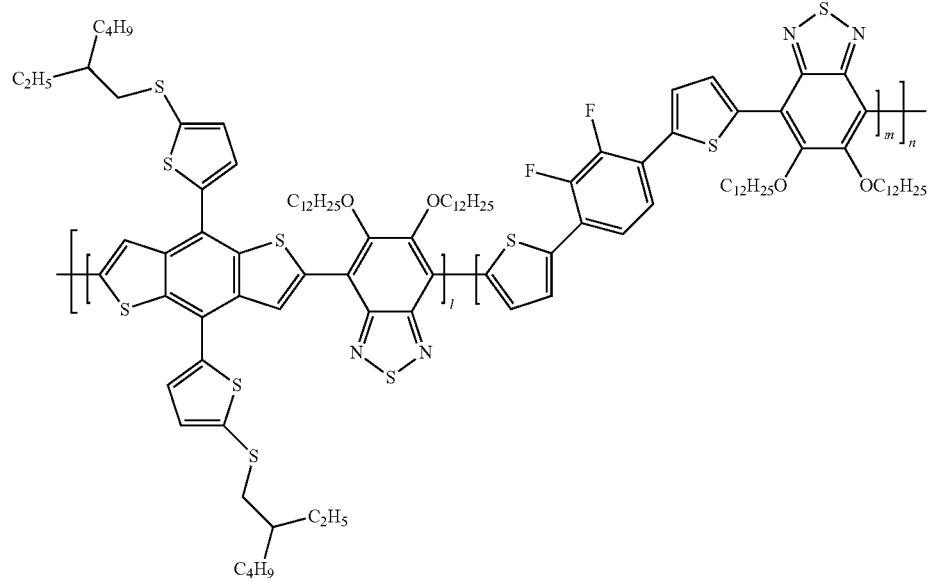
[Chemical Formula 5-6]

[Chemical Formula 5-7]
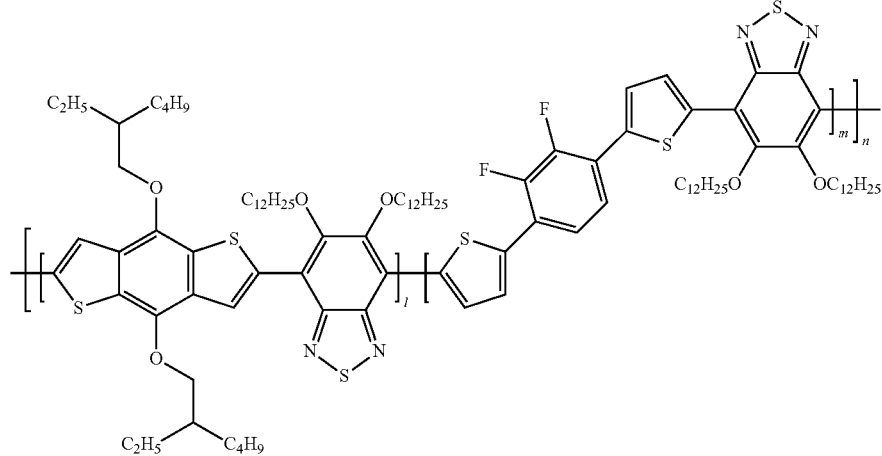
[Chemical Formula 5-8]
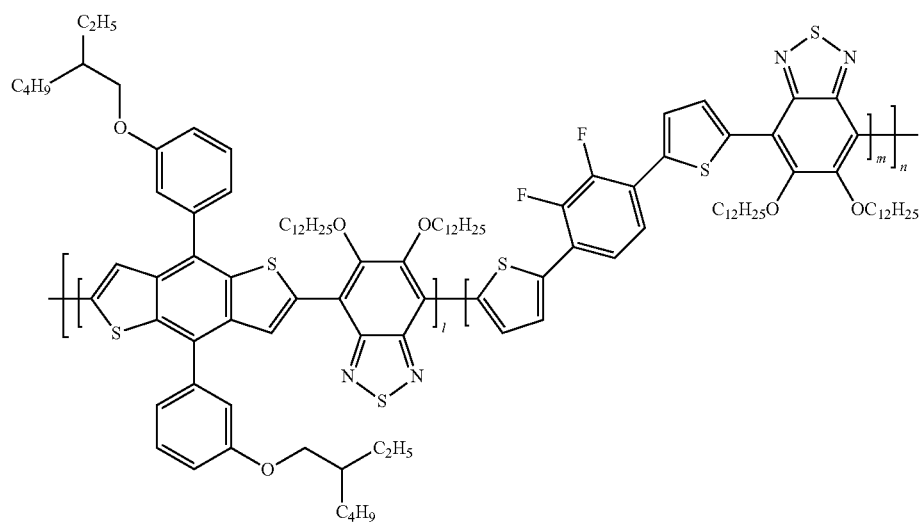
[Chemical Formula 5-9]
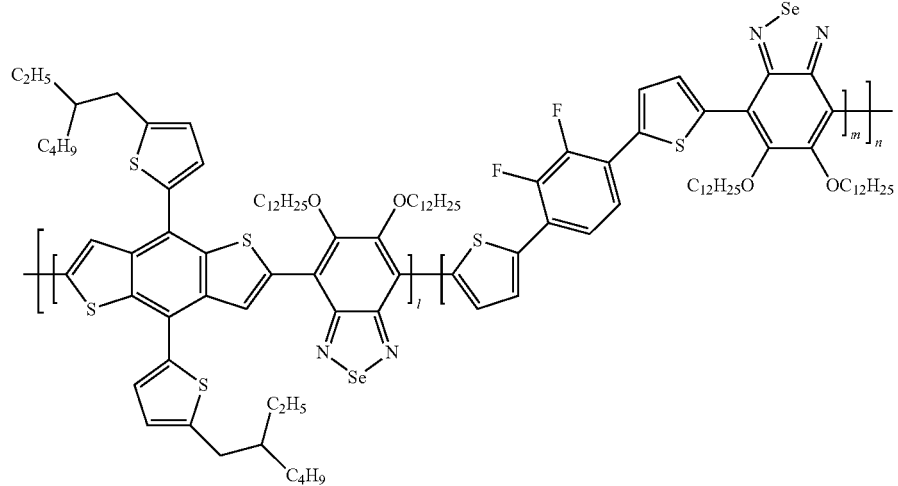

[Chemical Formula 5-10]
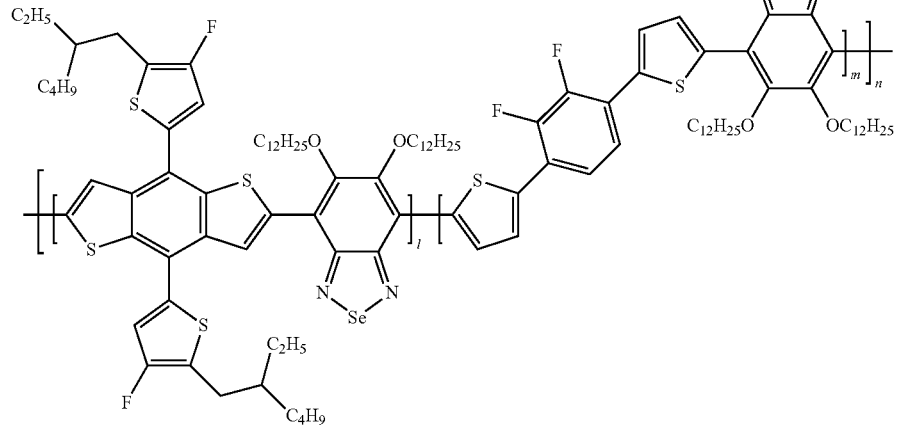
[Chemical Formula 5-11]
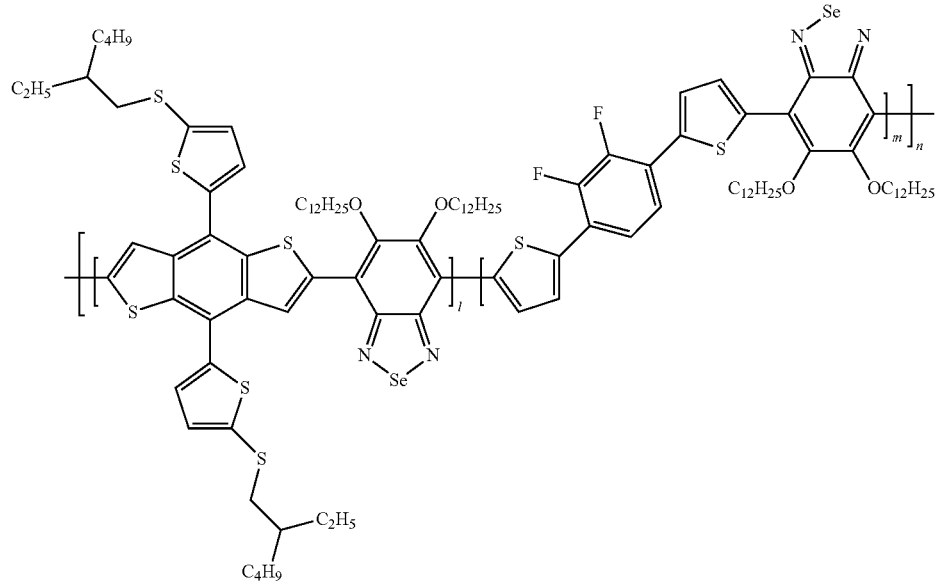
[Chemical Formula 5-12]
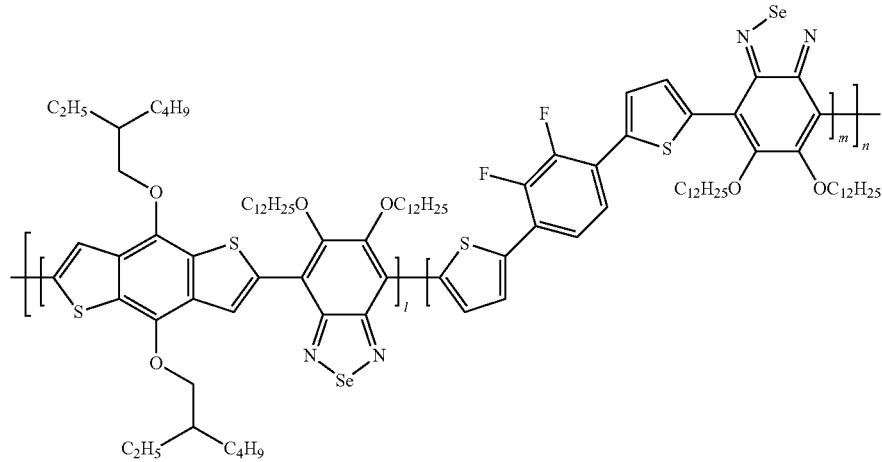

[Chemical Formula 5-13]
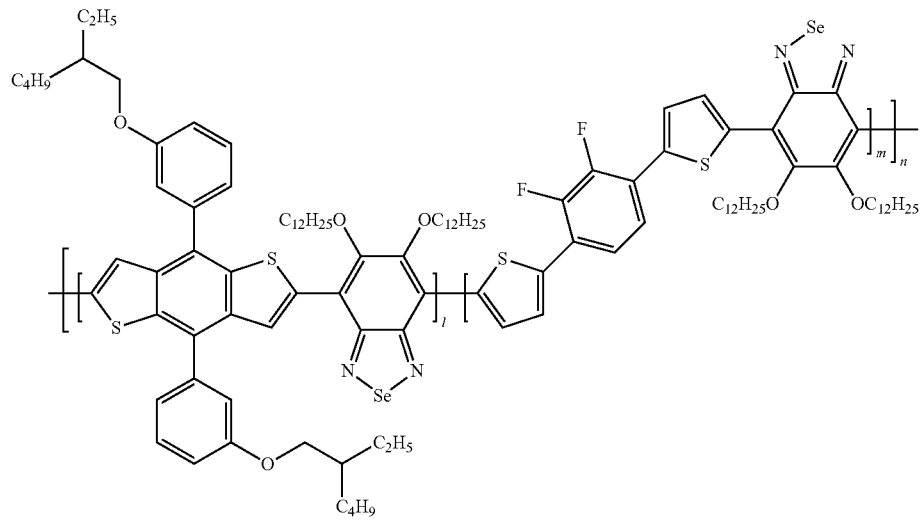
[Chemical Formula 5-14]
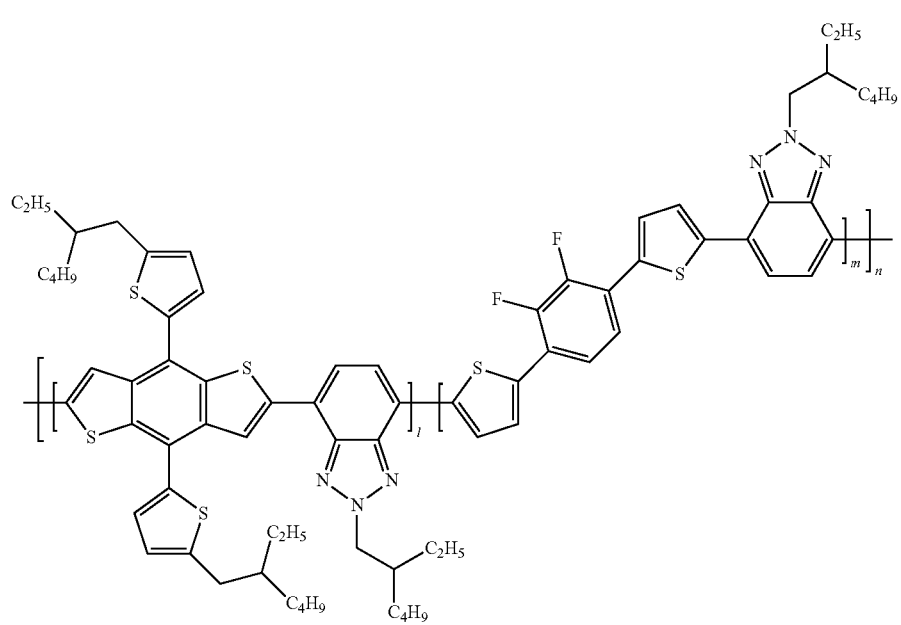

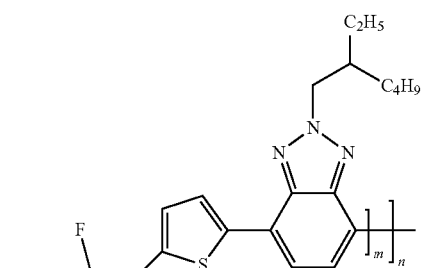
[Chemical Formula 5-15]
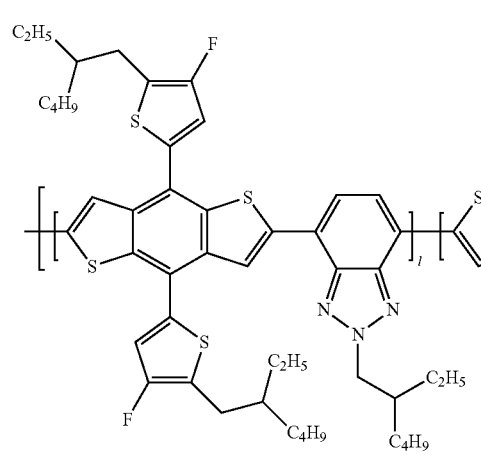
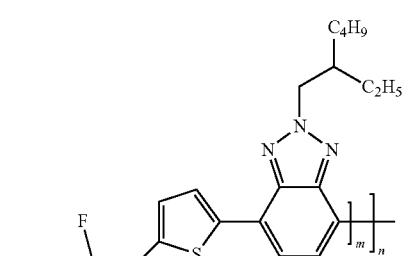
[Chemical Formula 5-16]
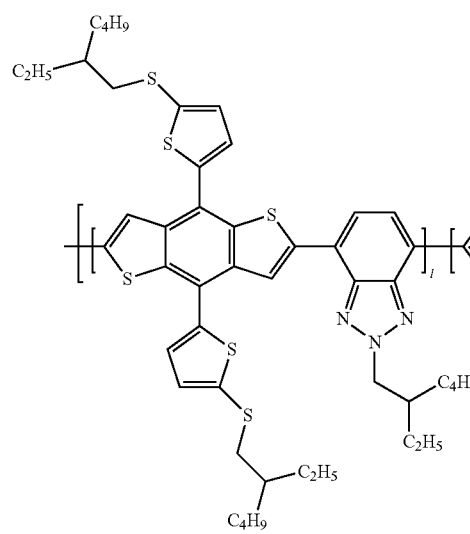

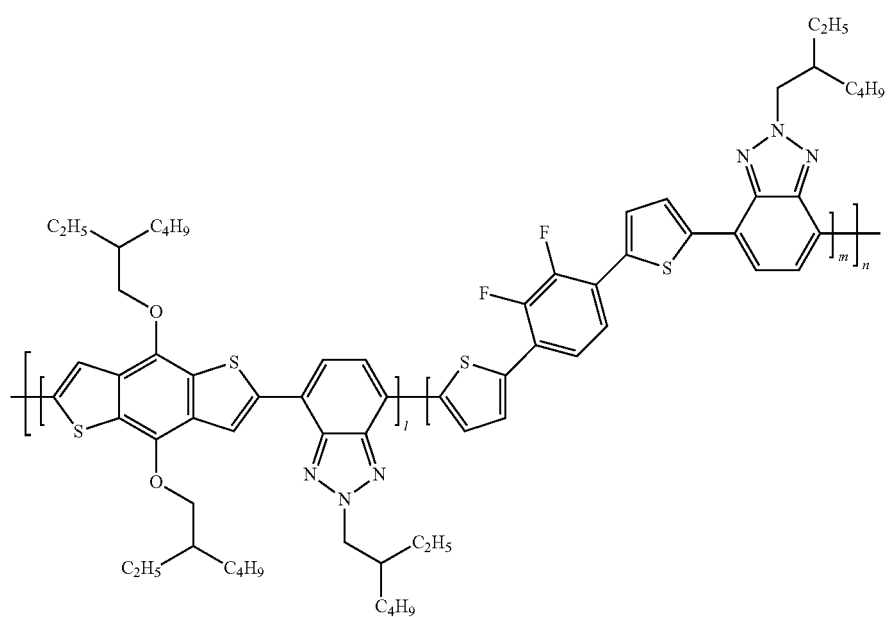
[Chemical Formula 5-17]
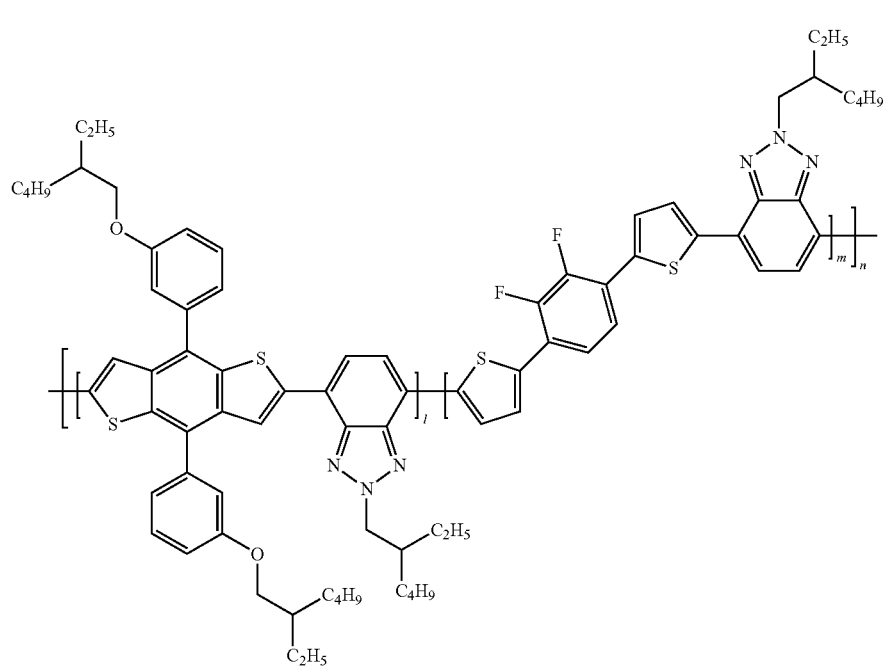
[Chemical Formula 5-18]

[Chemical Formula 5-19]
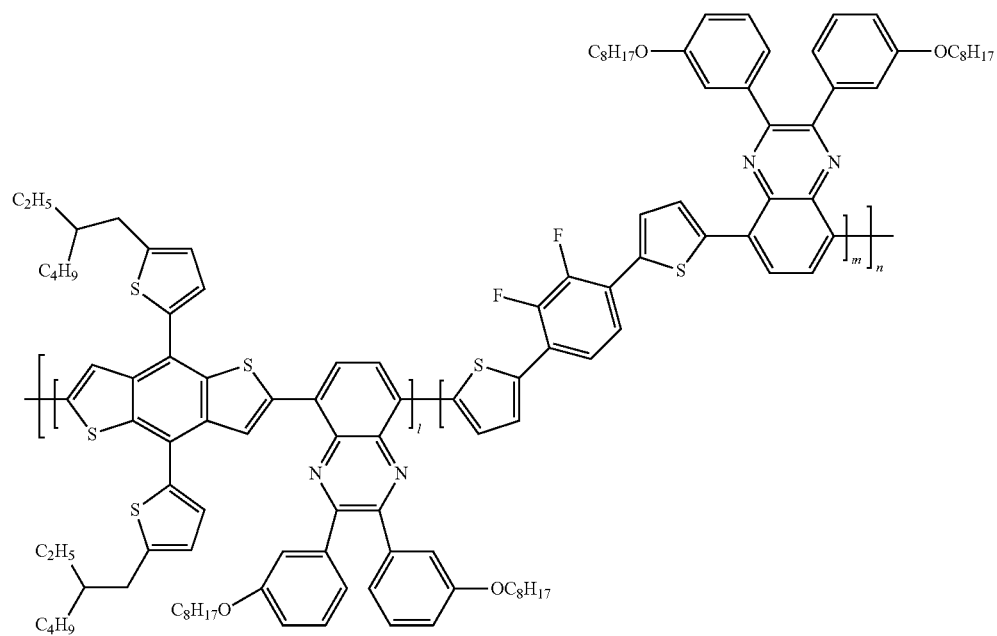
[Chemical Formula 5-20]
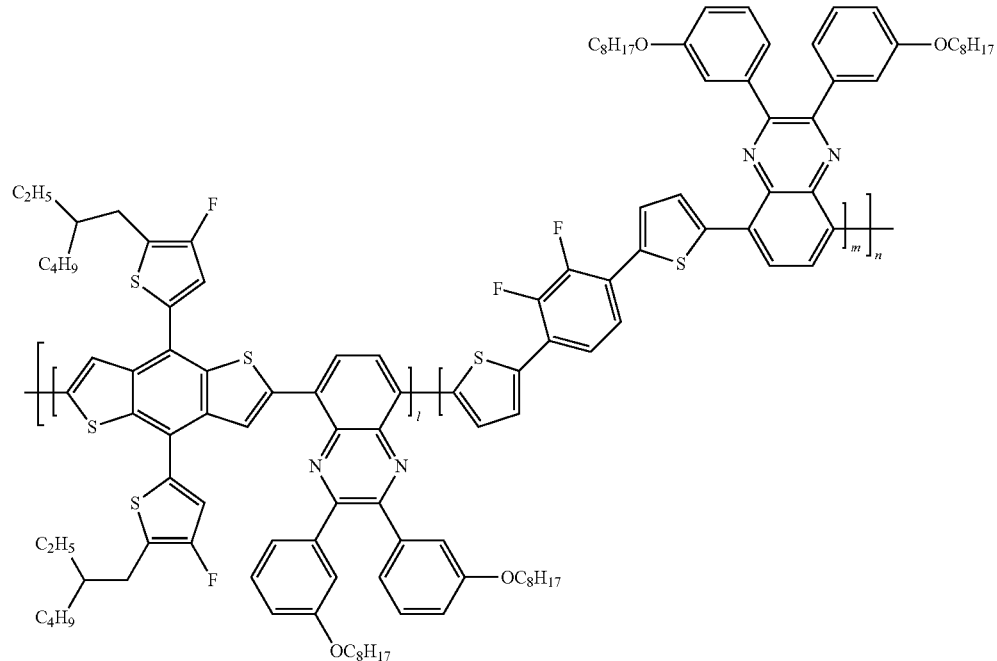

[Chemical Formula 5-21]
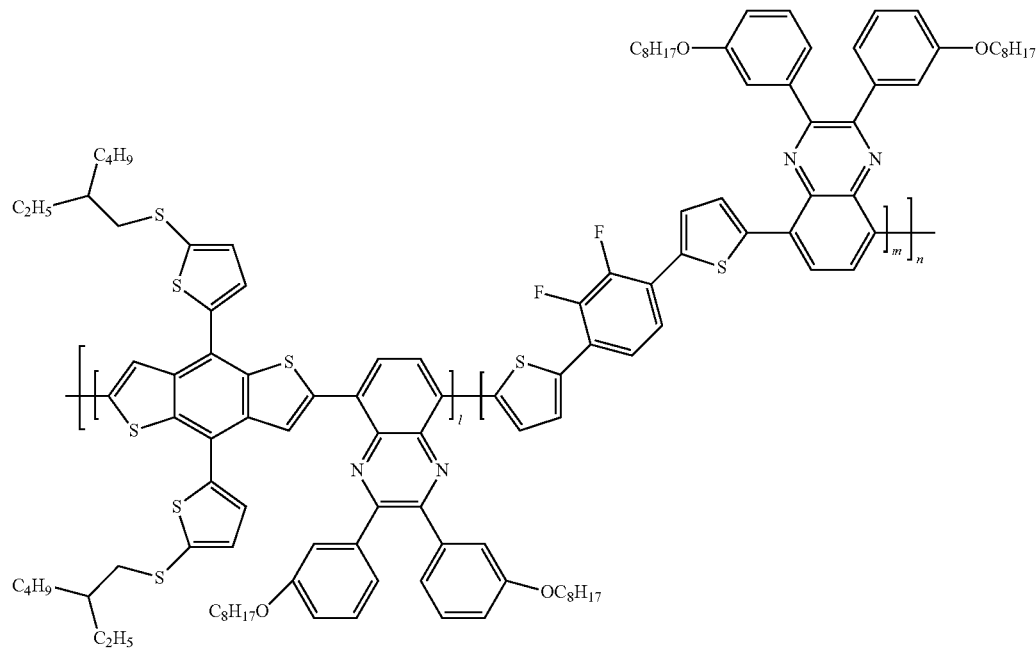
[Chemical Formula 5-22]
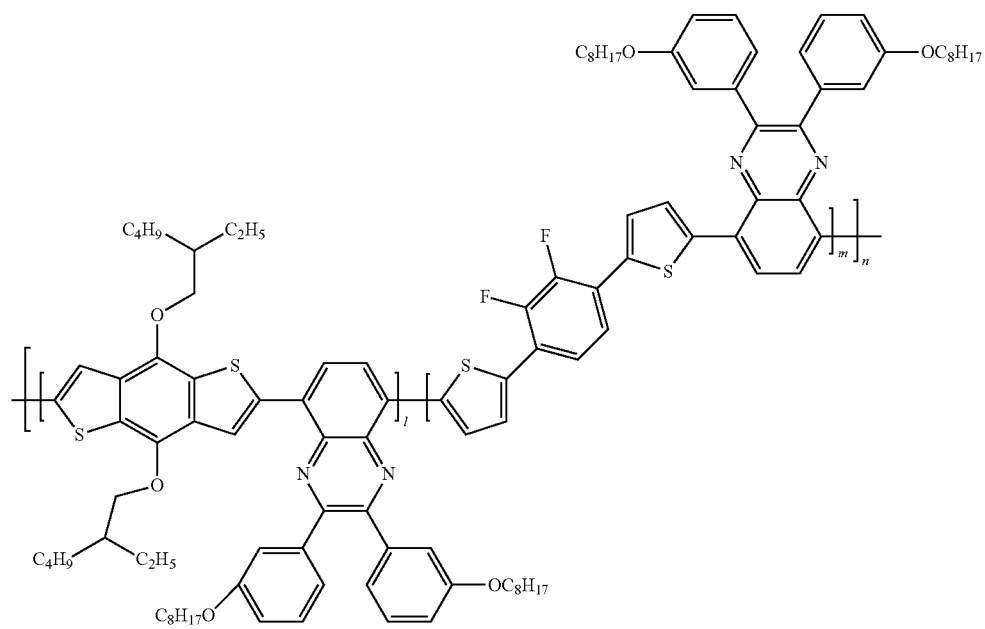

[Chemical Formula 5-23]
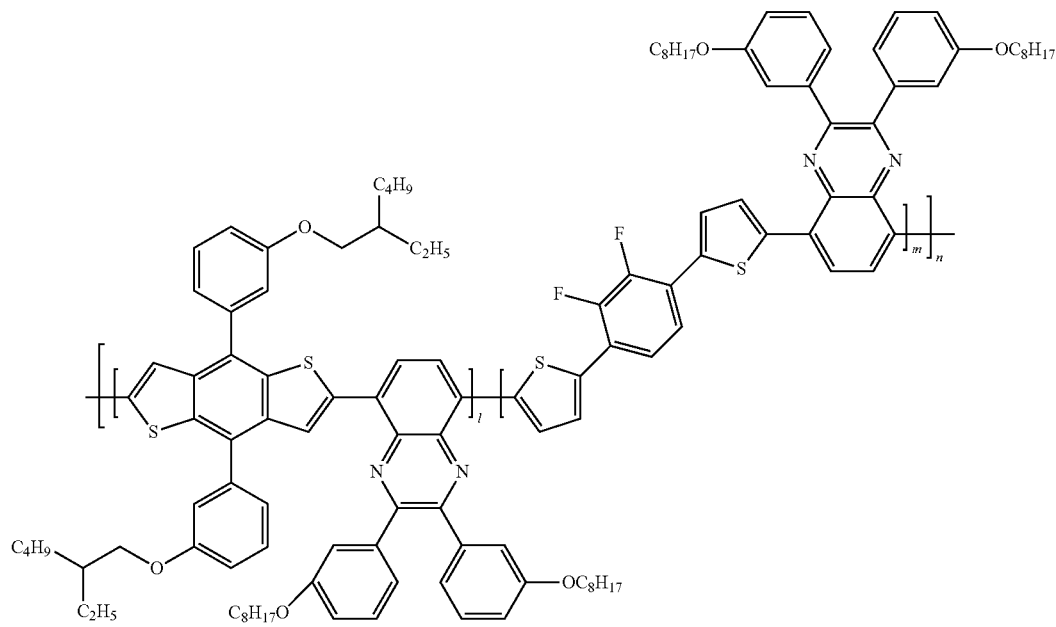
[Chemical Formula 5-24]
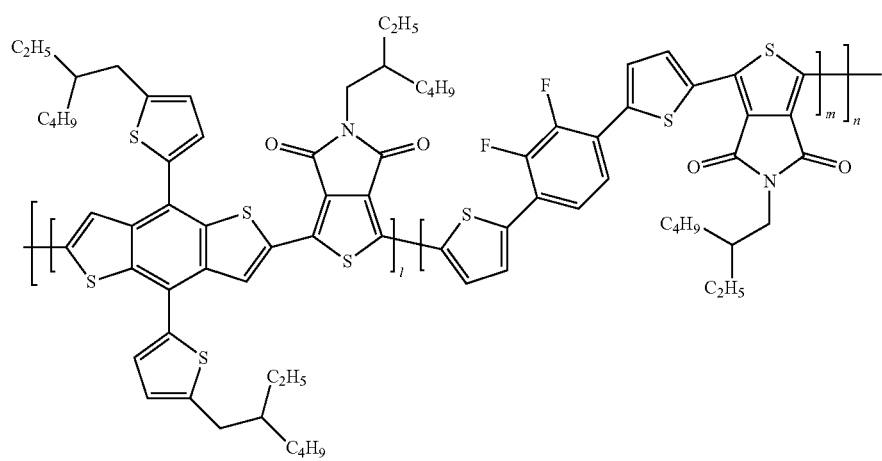
[Chemical Formula 5-25]
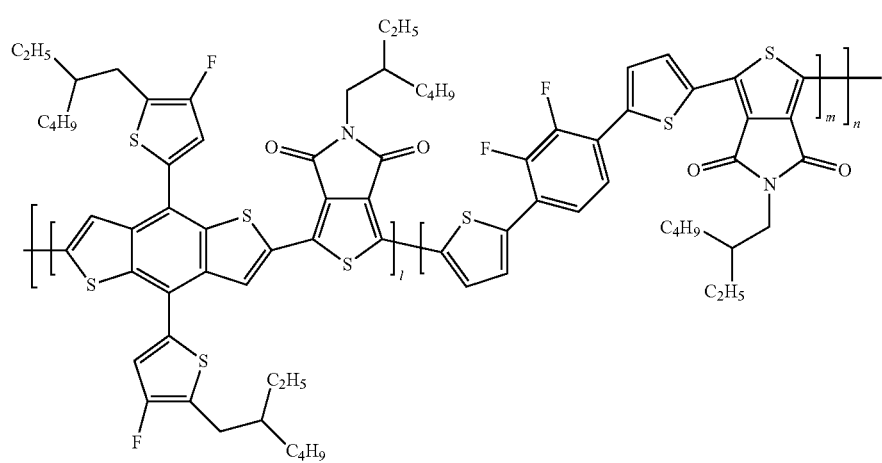

[Chemical Formula 5-26]
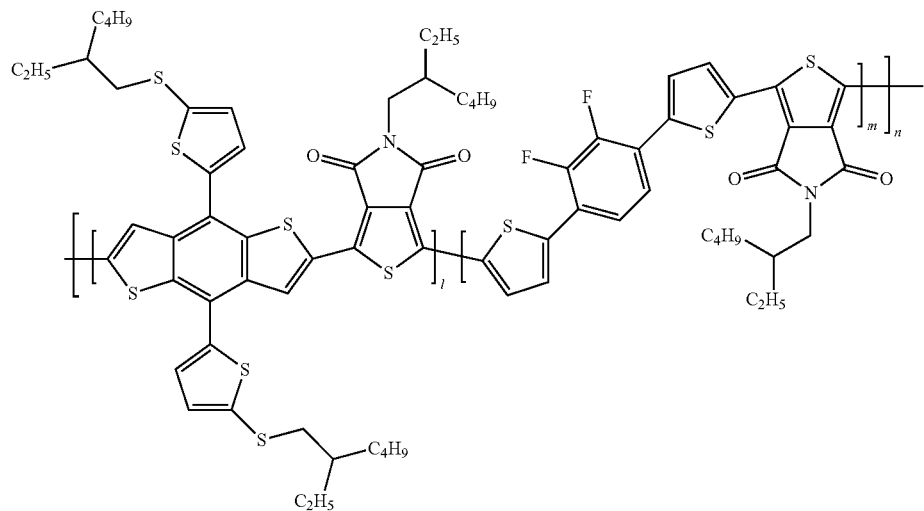
[Chemical Formula 5-27]
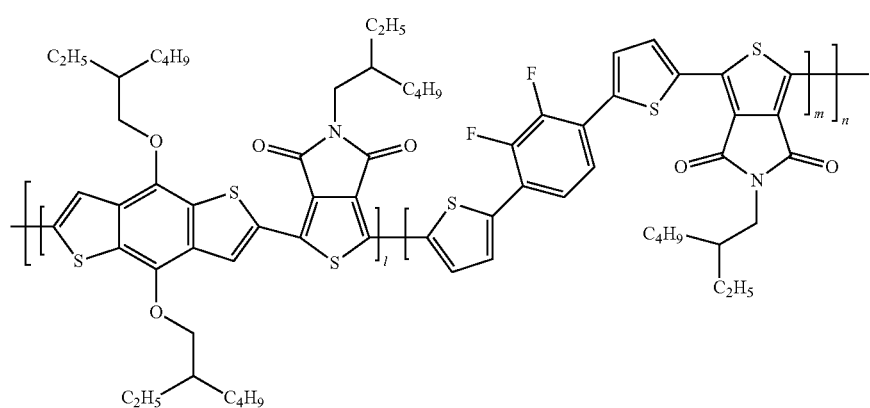
[Chemical Formula 5-28]
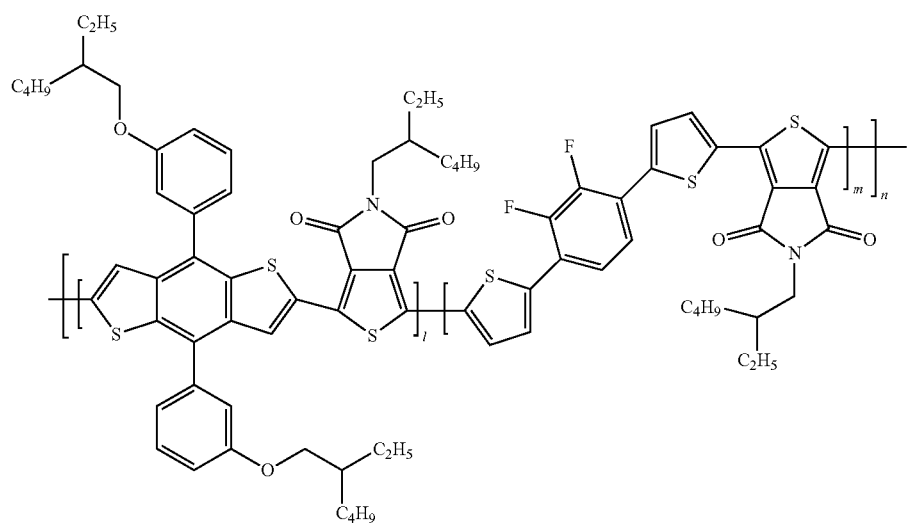

[Chemical Formula 5-29]
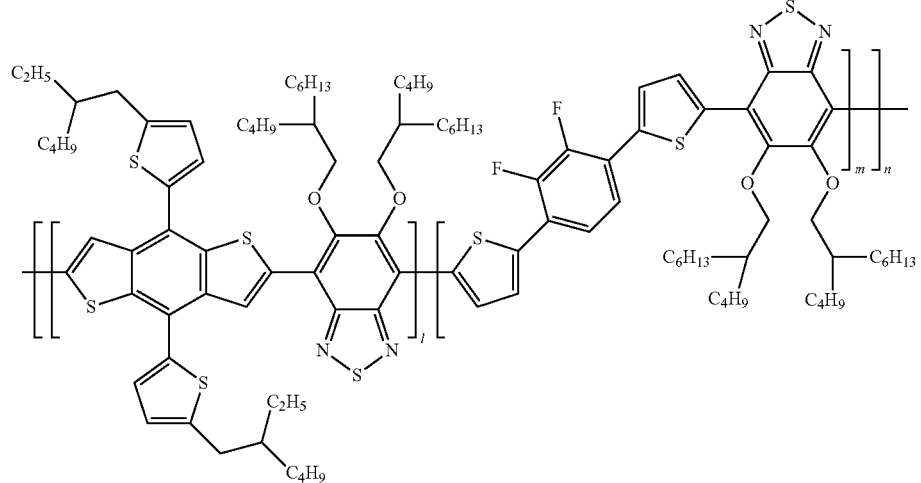
[Chemical Formula 5-30]
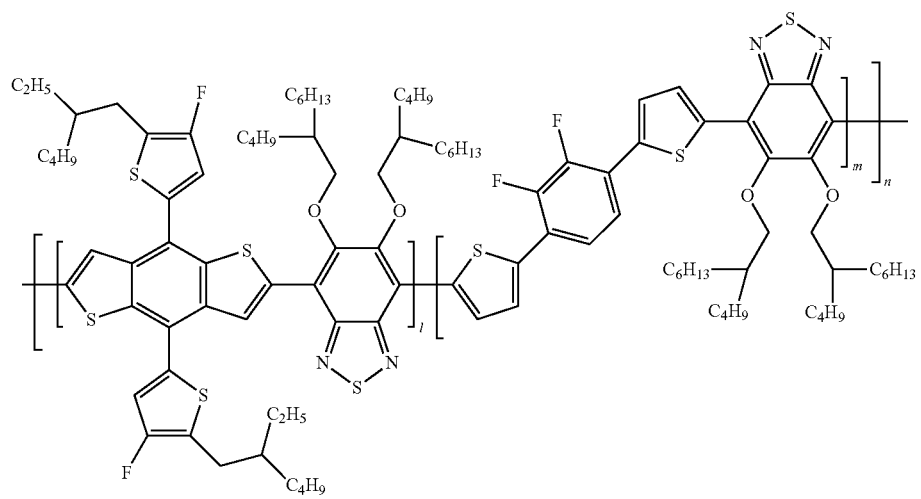
[Chemical Formula 5-31]
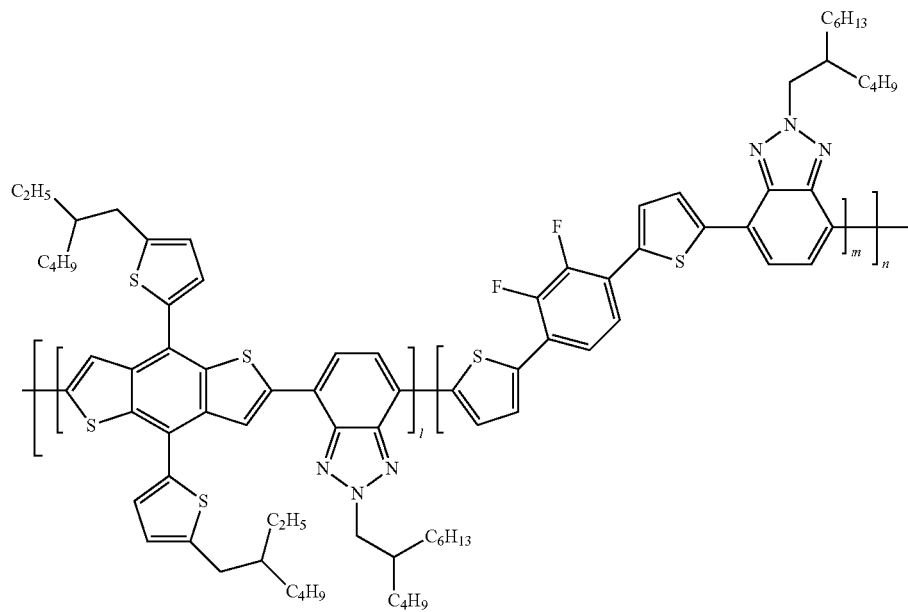

[Chemical Formula 5-32]
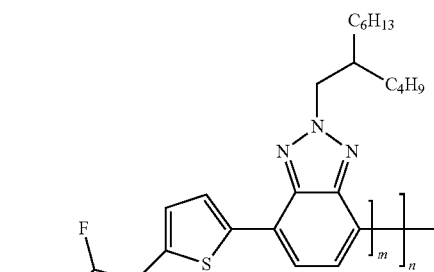
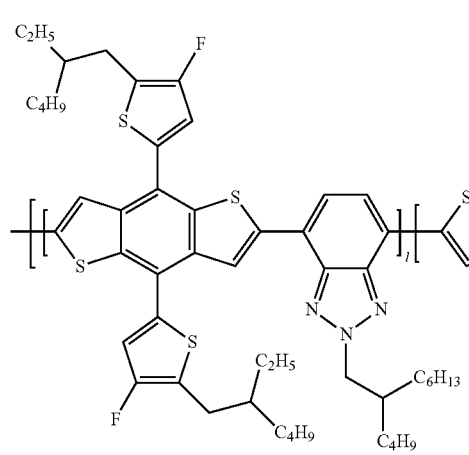
[Chemical Formula 5-33]
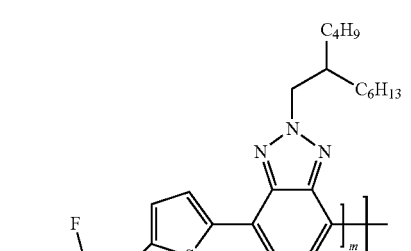
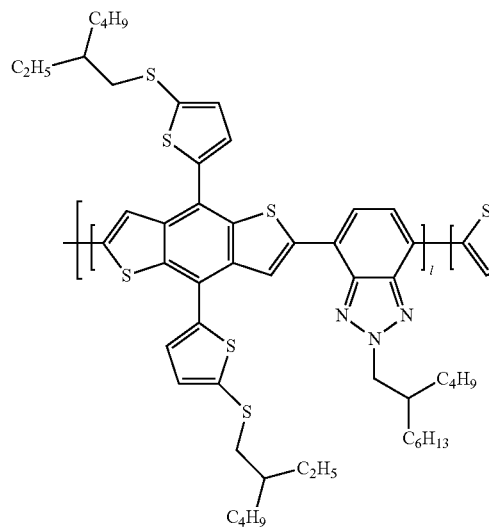

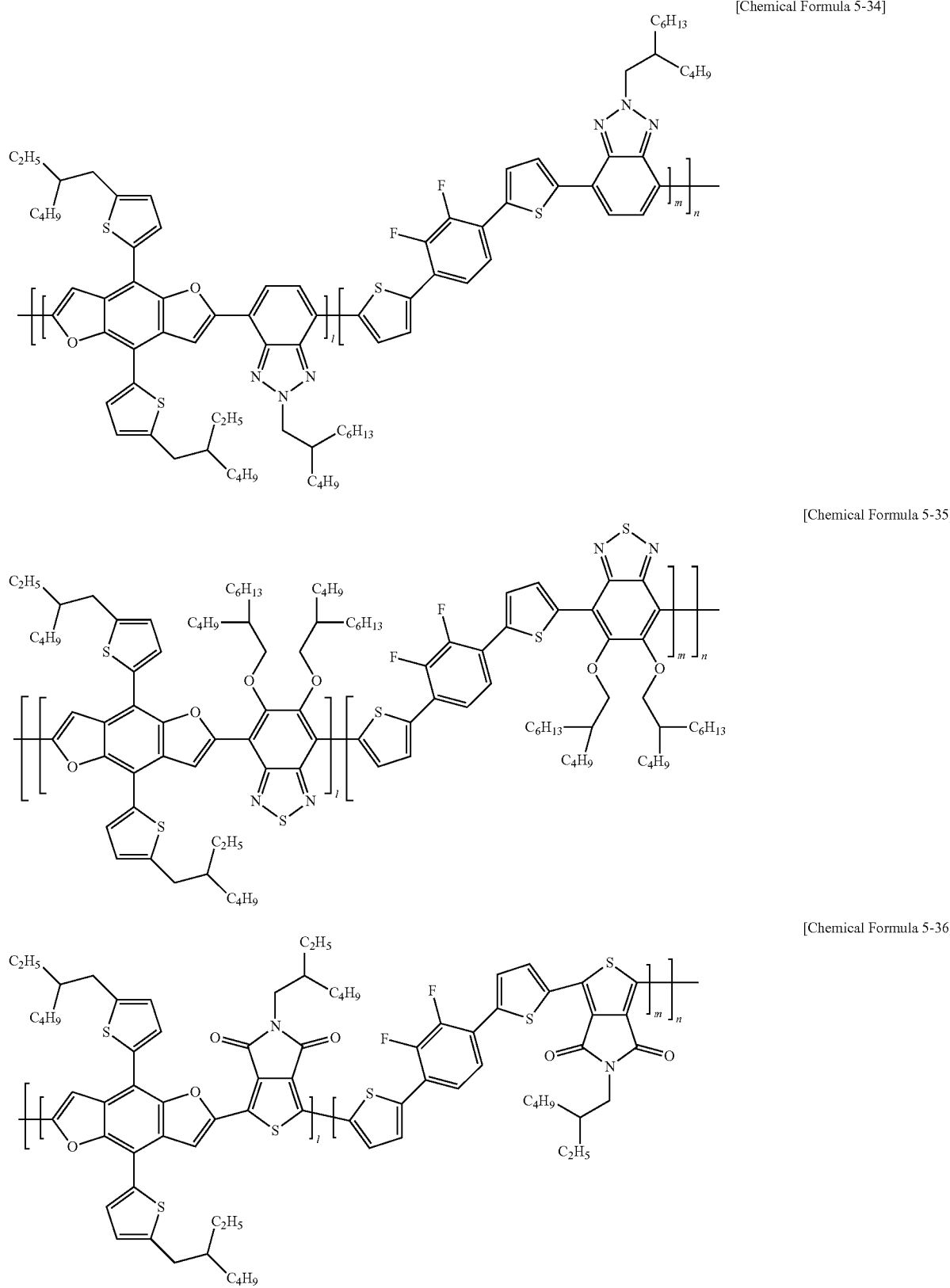
[Chemical Formula 5-34]
[Chemical Formula 5-35]
[Chemical Formula 5-36]

[Chemical Formula 5-37]
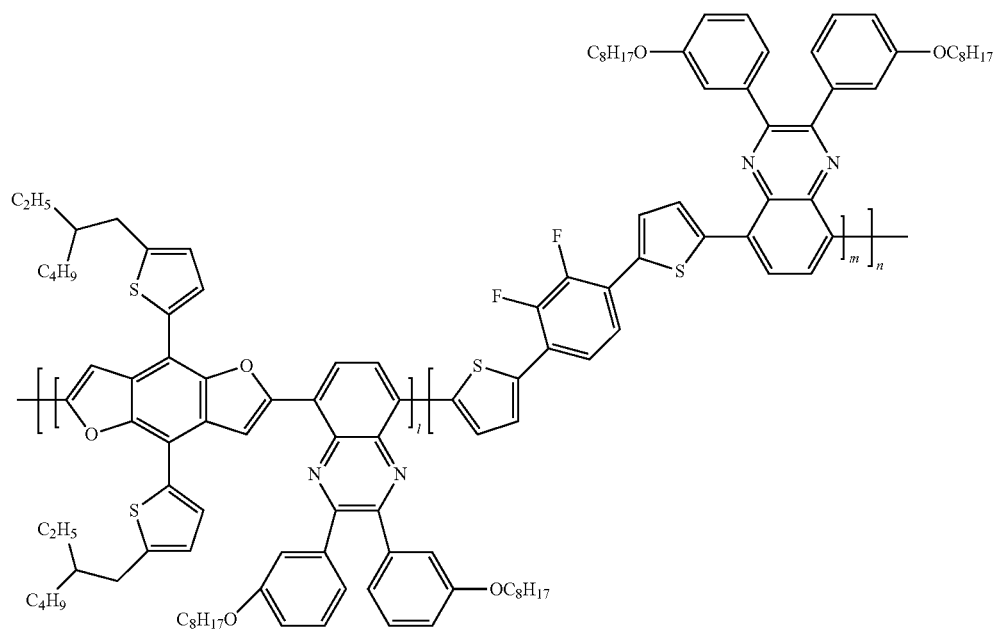
[Chemical Formula 5-38]
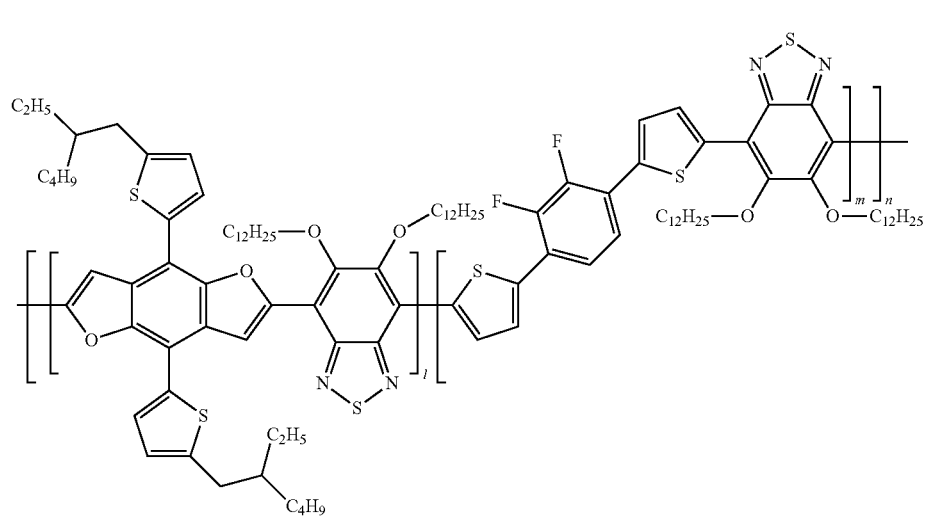

[Chemical Formula 5-39]
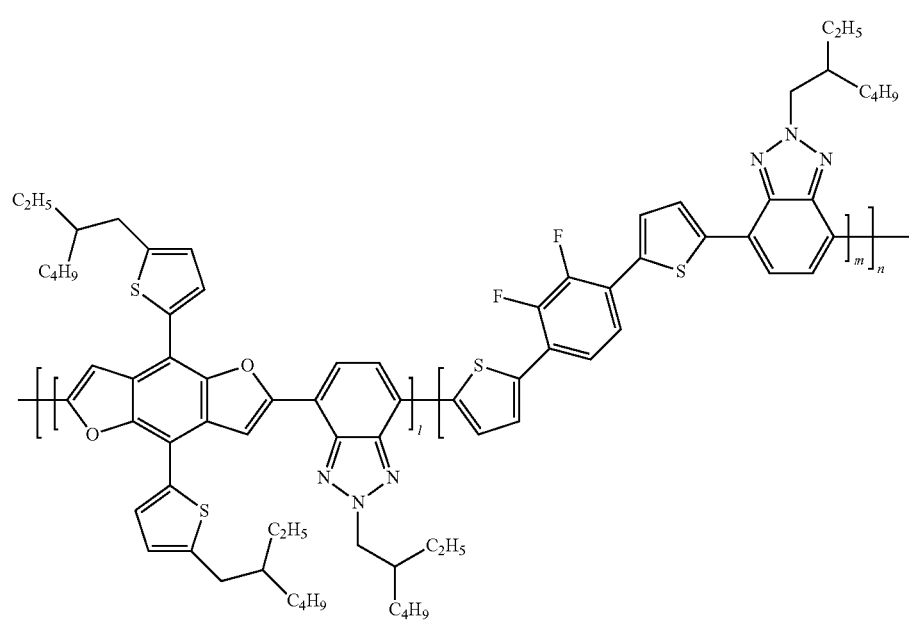
[Chemical Formula 5-40]
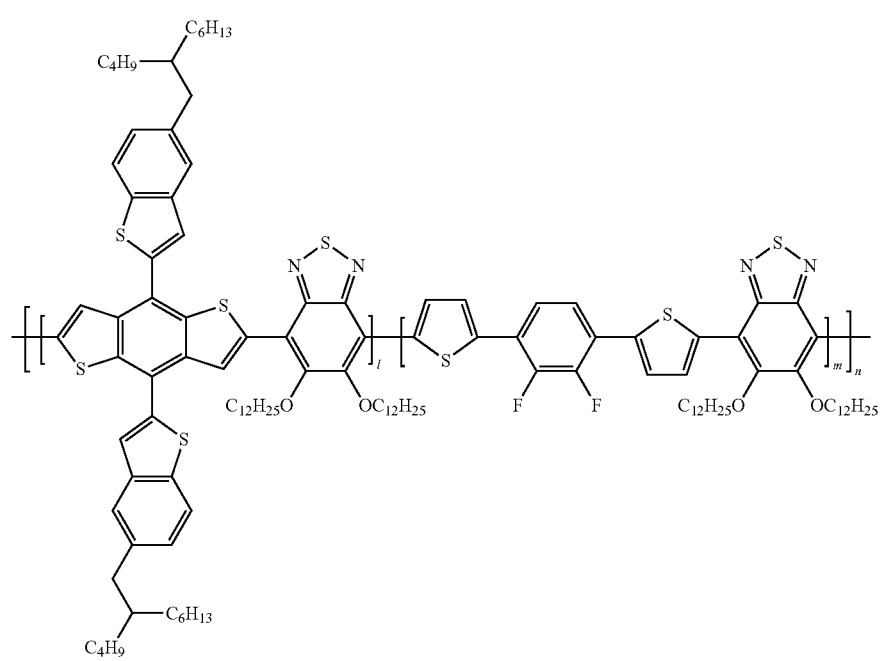

[Chemical Formula 5-41]
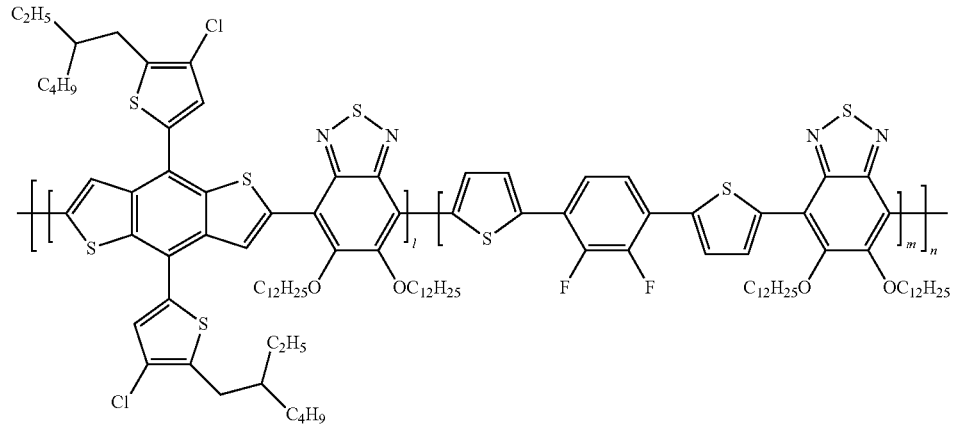
[Chemical Formula 5-42]
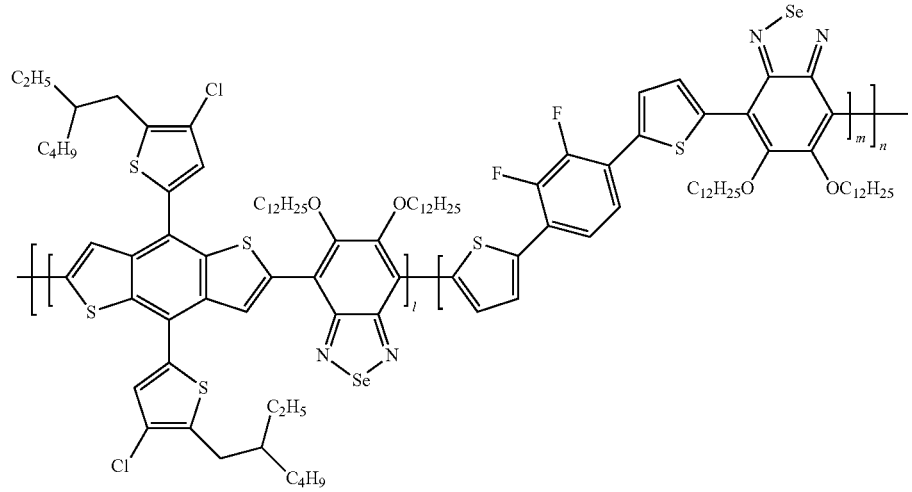
[Chemical Formula 5-43]
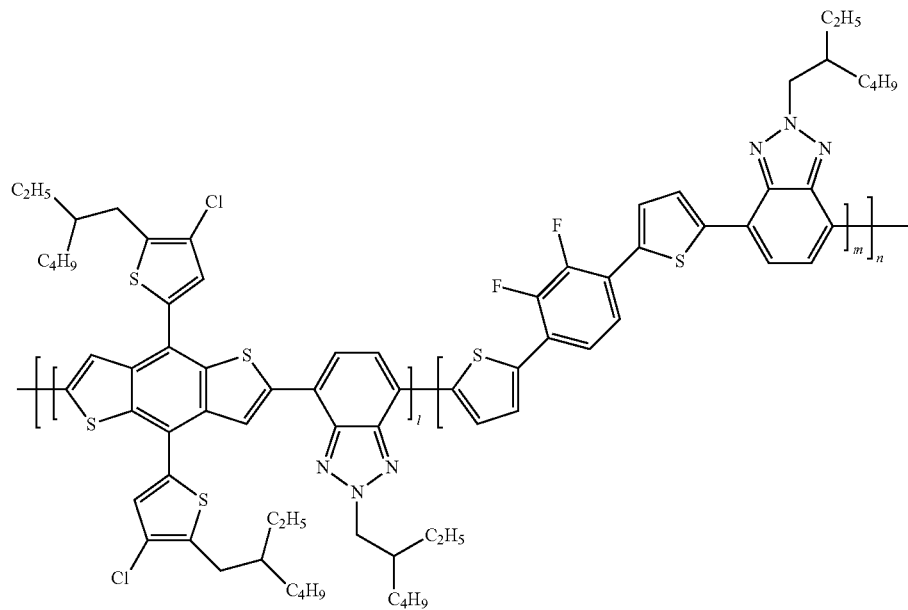

[Chemical Formula 5-44]
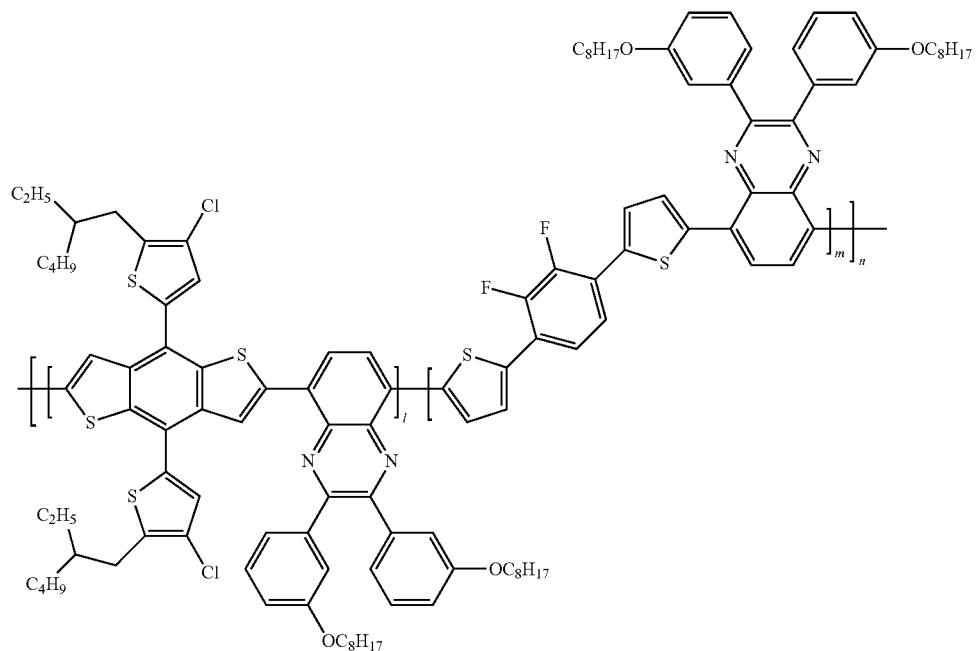
[Chemical Formula 5-45]
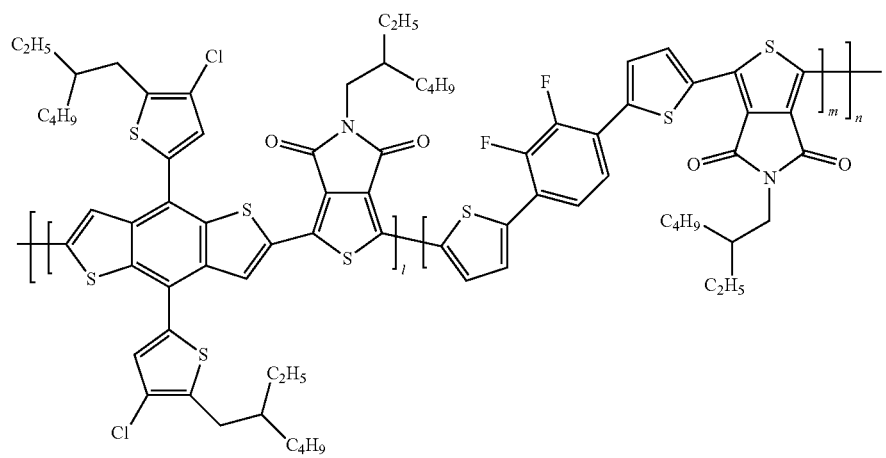
[Chemical Formula 5-46]
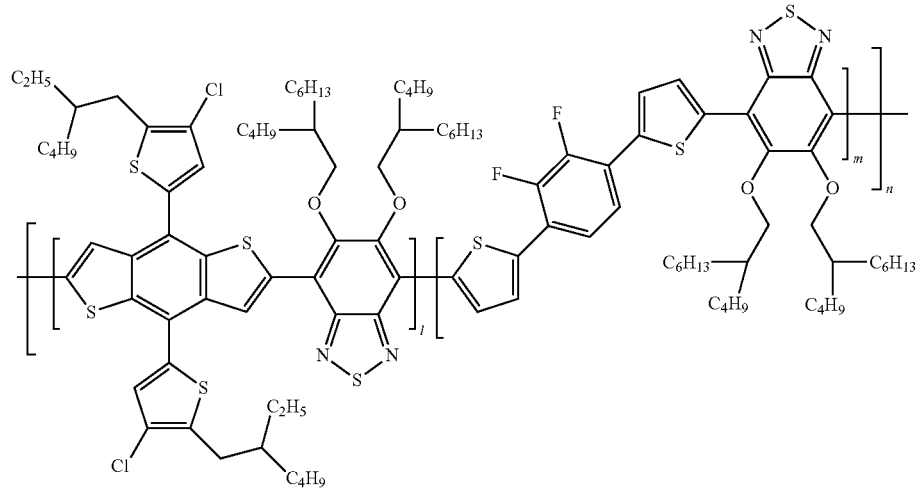

[Chemical Formula 5-47]
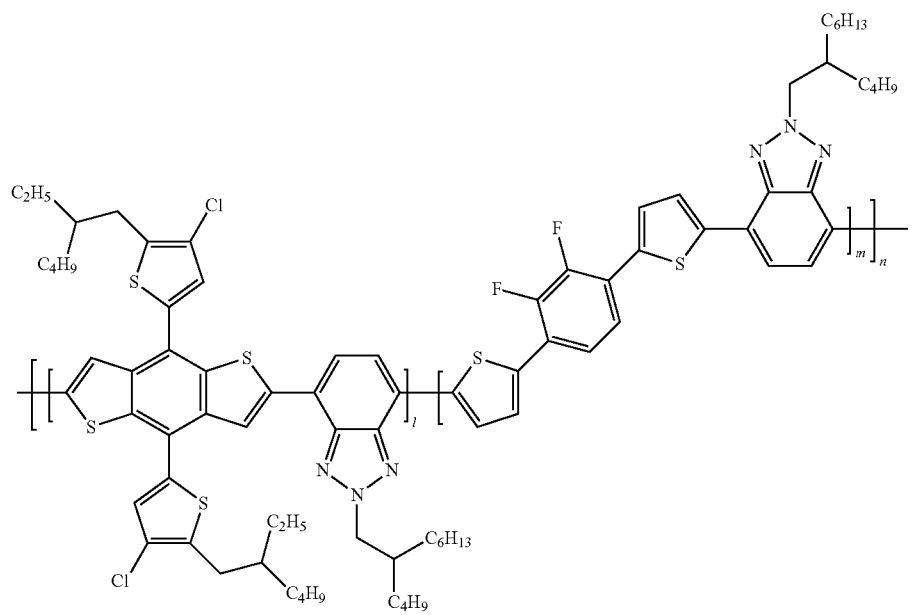
[Chemical Formula 5-48]
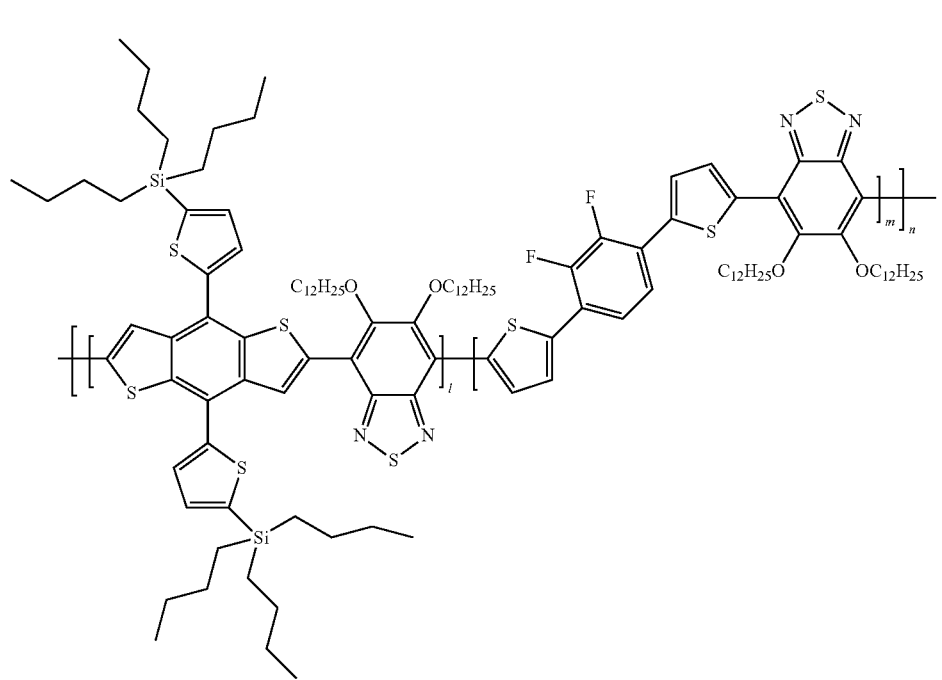

[Chemical Formula 5-49]
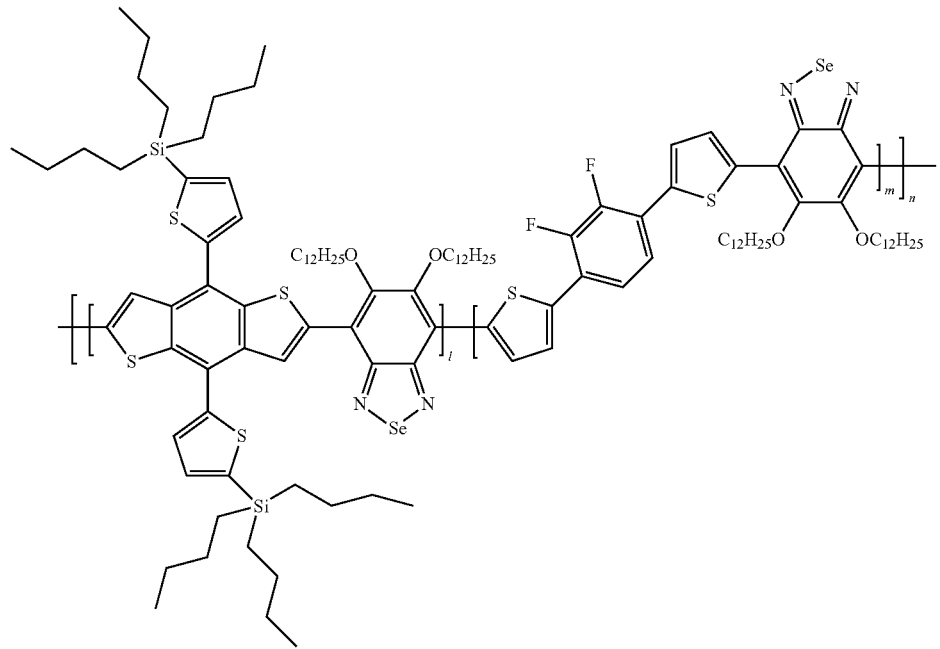
[Chemical Formula 5-50]
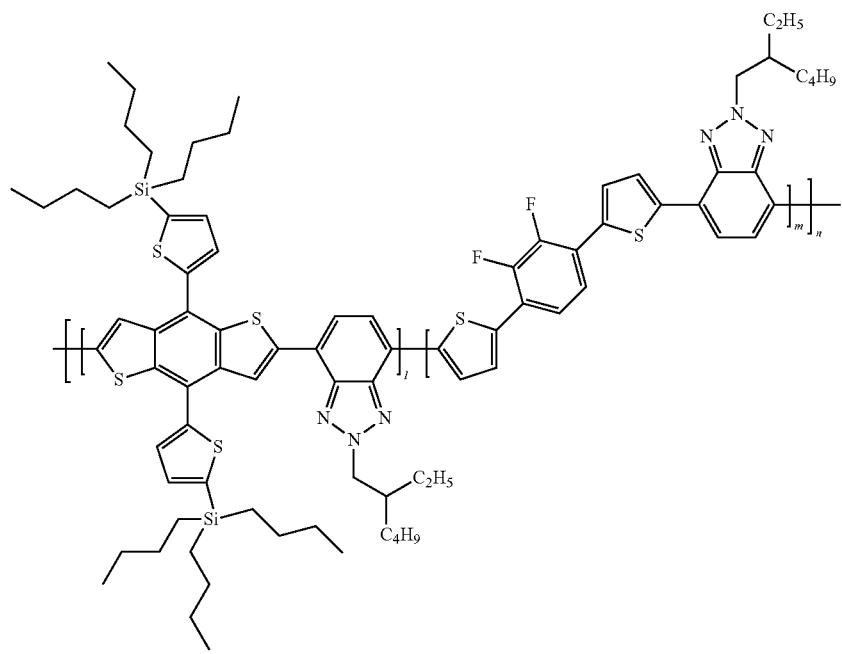

[Chemical Formula 5-51]
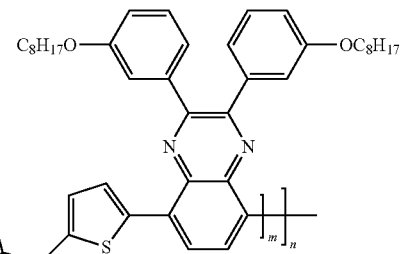
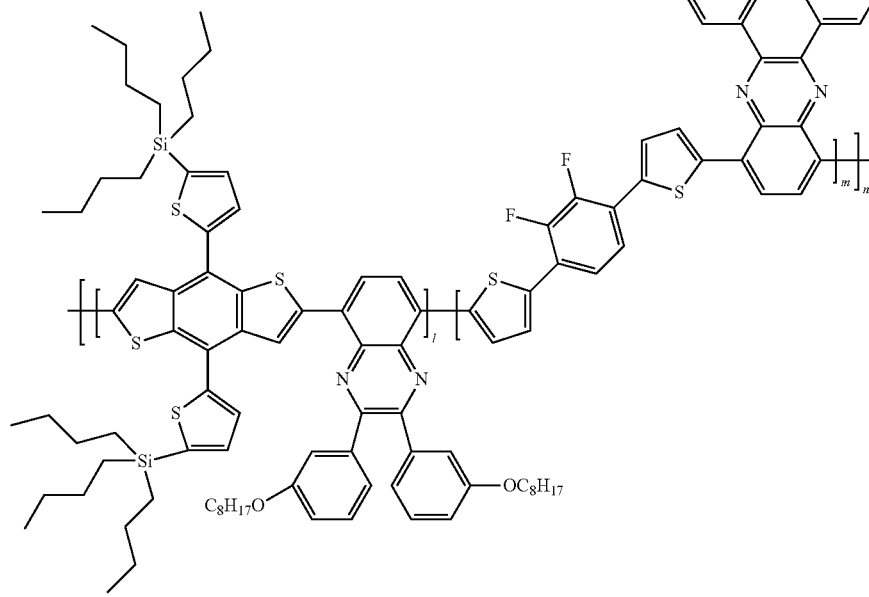
[Chemical Formula 5-52]
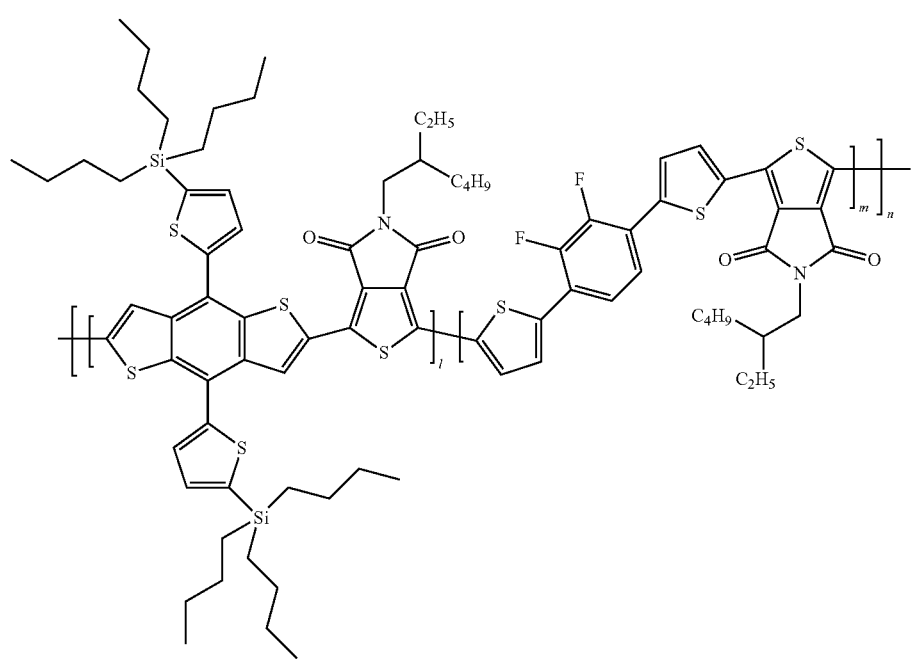

[Chemical Formula 5-53]
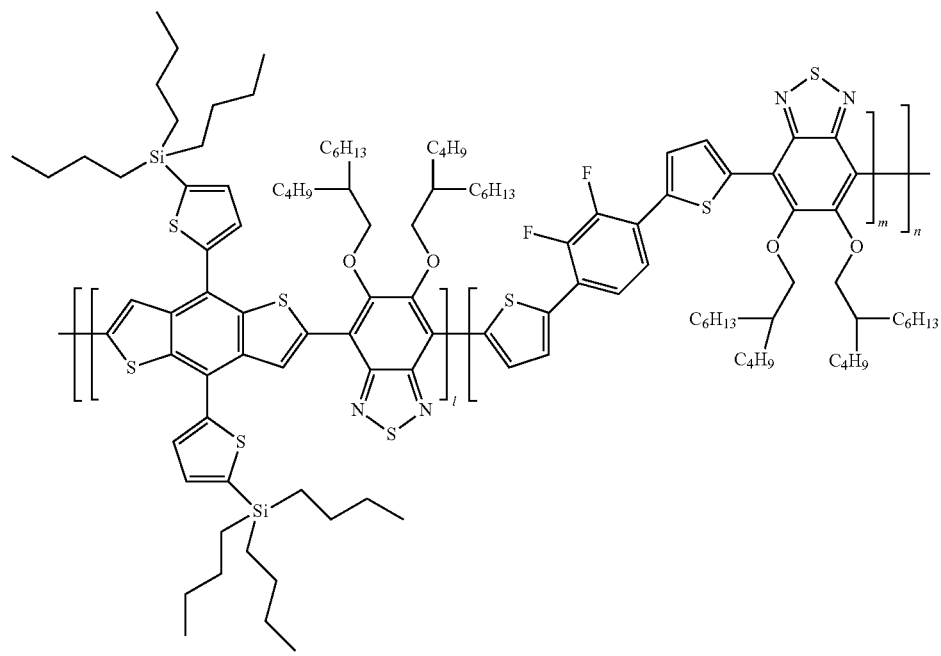
[Chemical Formula 5-54]
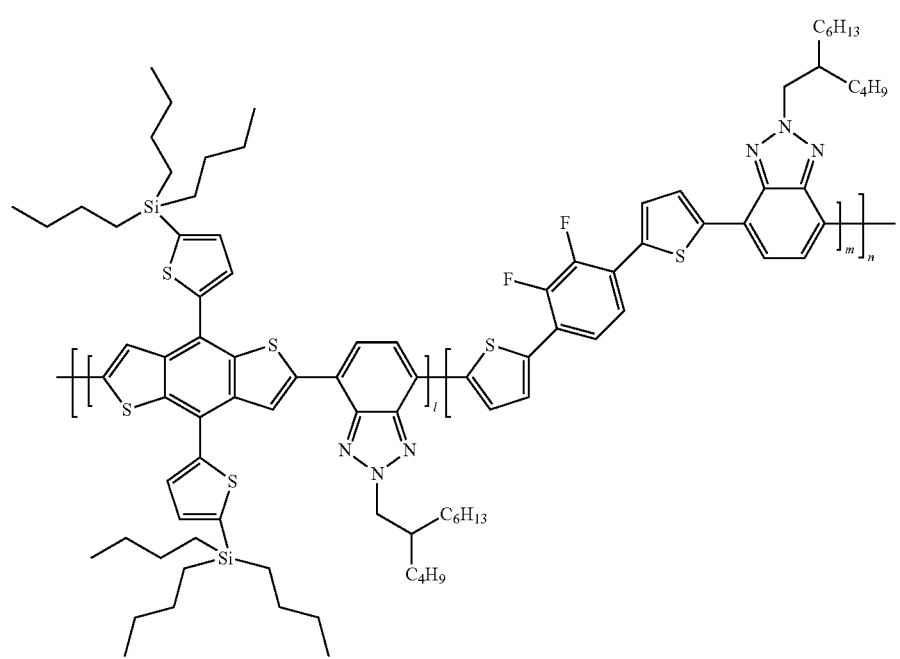

[Chemical Formula 5-55]
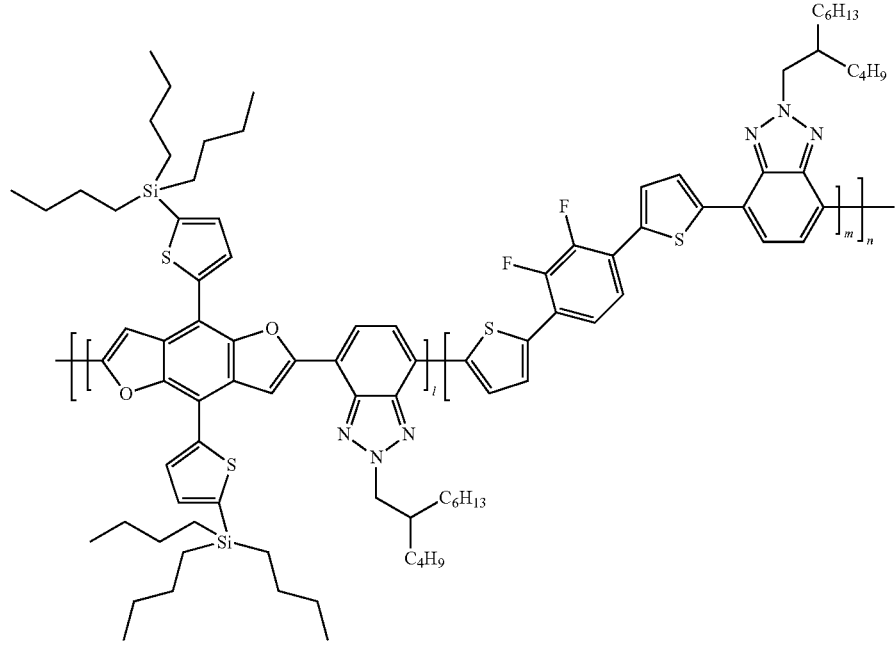
[Chemical Formula 5-56]
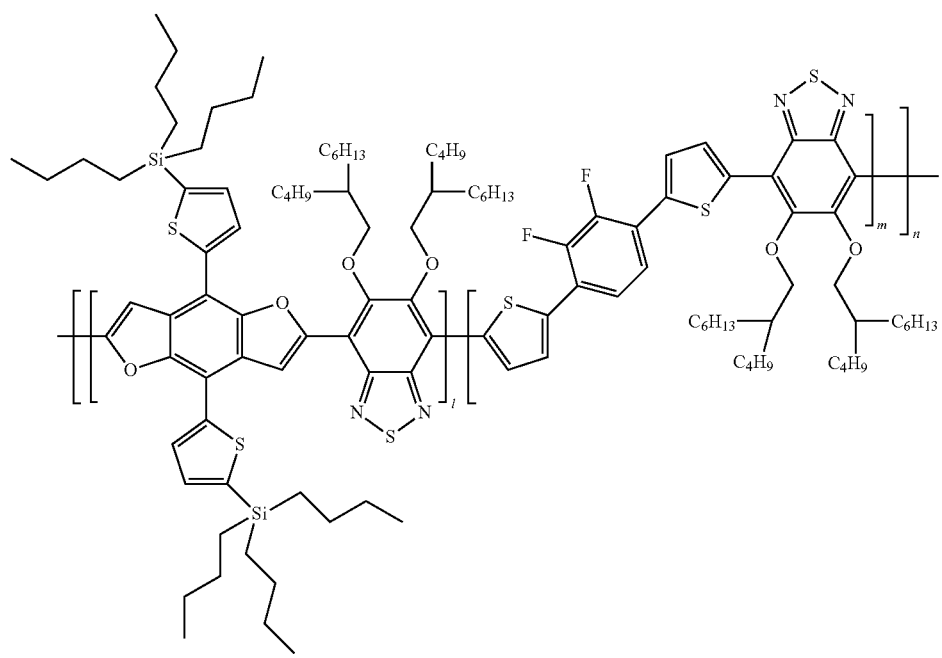

[Chemical Formula 5-57]
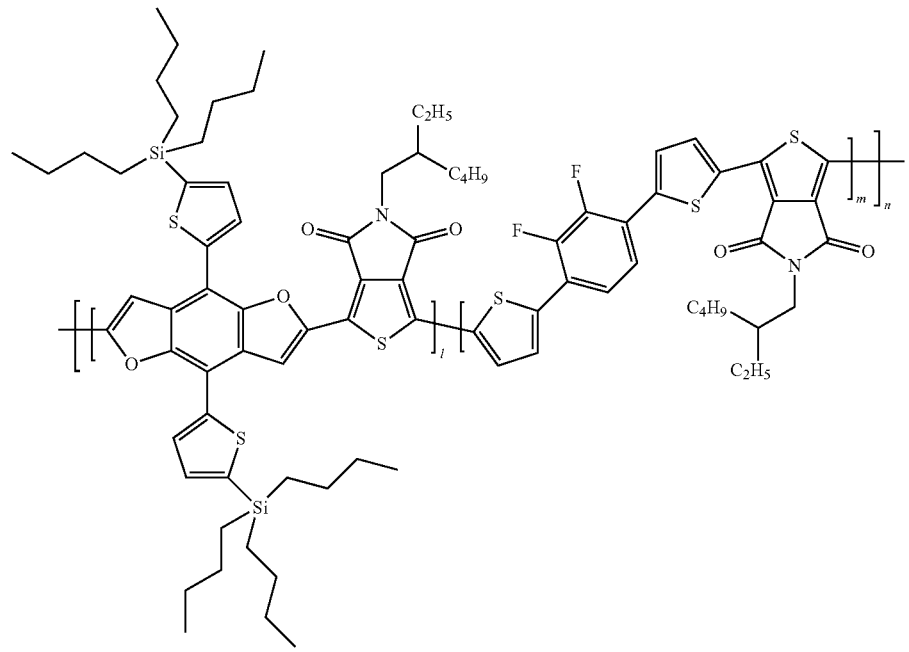
[Chemical Formula 5-58]
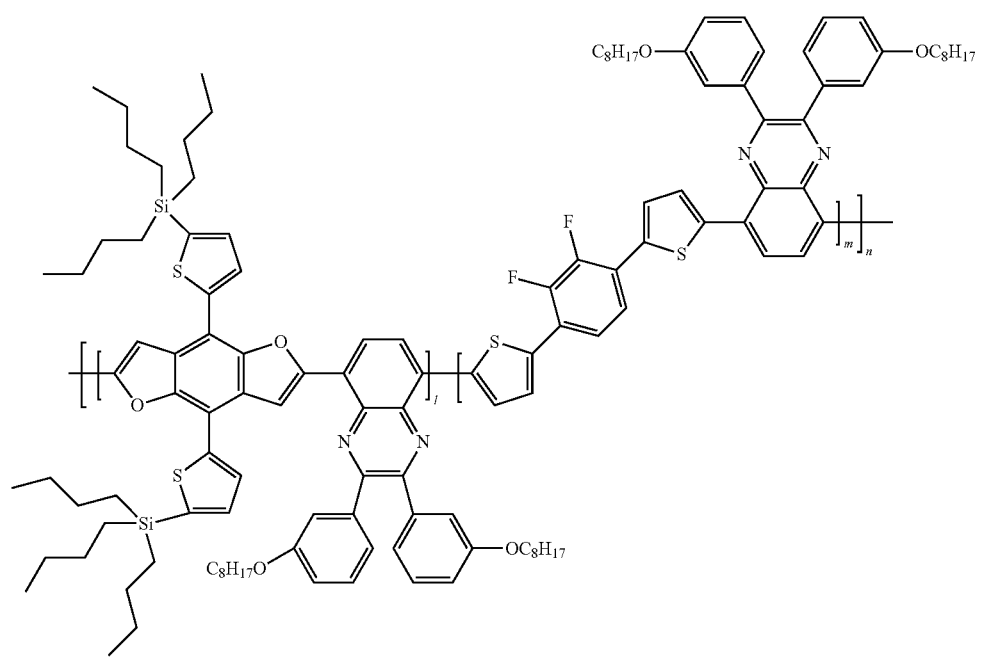

-continued

[Chemical Formula 5-59]

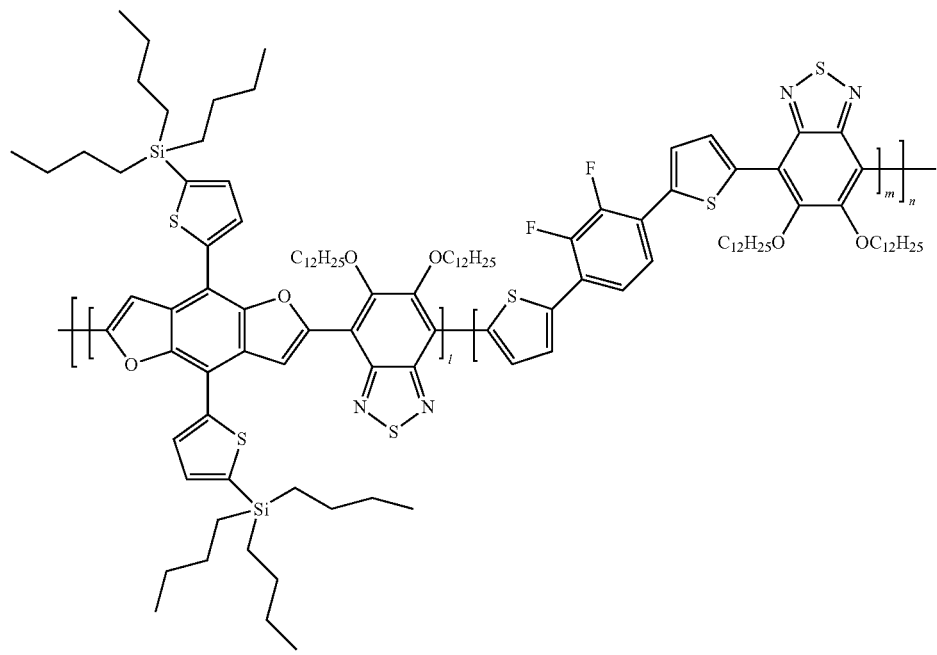

[Chemical Formula 5-60]

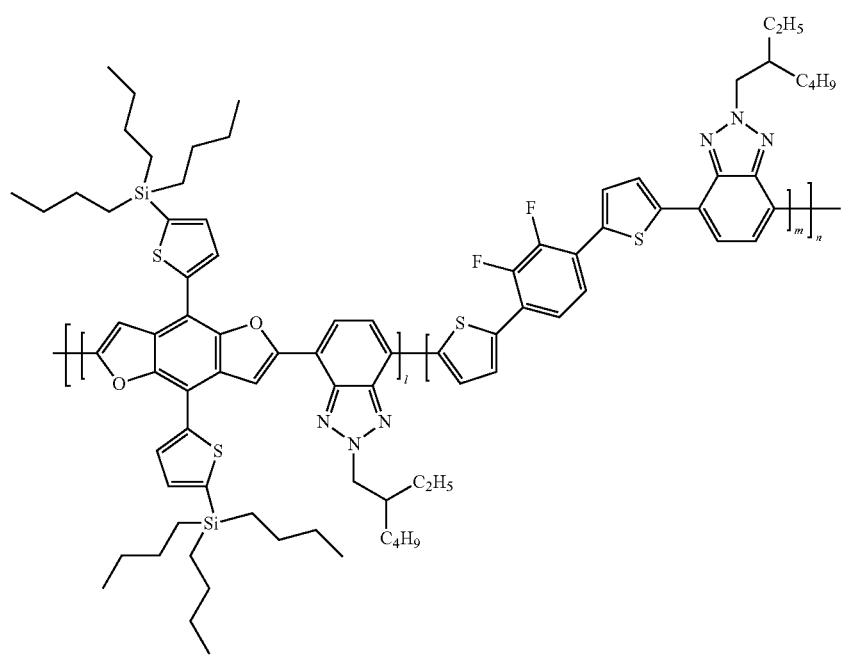

In Chemical Formulae 5-4 to 5-60, l is, as a mole fraction, a real number of 0<l<1, m is, as a mole fraction, a real number of 0<m<1, l+m=1, and n is, as a repetition number of the unit, an integer of 1 to 10,000.

In one embodiment of the present specification, l is 0.5.

In another embodiment, m is 0.5.

In another embodiment of the present specification, l is 0.75.

In one embodiment of the present specification, m is 0.25.

In one embodiment of the present specification, the polymer is a random polymer. In addition, the random polymer has enhanced solubility, which is economically effective in terms of time and costs in a device manufacturing process.

In one embodiment of the present specification, an end group of the polymer is a substituted or unsubstituted heterocyclic group or a substituted or unsubstituted aryl group.

In one embodiment of the present specification, an end group of the polymer is a heterocyclic group unsubstituted or substituted with a halogen group, an alkyl group or a haloalkyl group; or an aryl group unsubstituted or substituted with a halogen group, an alkyl group or a haloalkyl group.

In one embodiment of the present specification, an end group of the polymer is a heterocyclic group unsubstituted or substituted with a halogen group, a $C_1$-$C_6$ alkyl group or a $C_1$-$C_6$ fluoroalkyl group; or an aryl group unsubstituted or substituted with a halogen group, a $C_1$-$C_6$ alkyl group or a $C_1$-$C_6$ haloalkyl group. In one embodiment of the present specification, an end group of the polymer is a 4-(trifluoromethyl)phenyl group.

In one embodiment of the present specification, an end group of the polymer is a bromo-thiophene group.

In another embodiment, an end group of the polymer may be a trifluoro-benzene group.

According to another embodiment of the present specification, the polymer may not have an end group. In other words, the polymer may be a polymer that does not have end capping.

According to one embodiment of the present specification, the polymer preferably has a number average molecular weight of 5,000 g/mol to 1,000,000 g/mol.

According to one embodiment of the present specification, the polymer may have molecular weight distribution of 1 to 10. Preferably, the polymer has molecular weight distribution of 1 to 3. As the molecular weight distribution decreases and the number average molecular weight increases, favorable electrical properties and mechanical properties are obtained.

In addition, the number average molecular weight is preferably 100,000 g/mol or less so as to have solubility at a certain level or higher, which is advantageous in using a solution coating method.

As for the molecular weight, the number average molecular weight (Mn) and the weight average molecular weight (Mw) are measured by GPC using chlorobenzene as a solvent, and the molecular weight distribution means a number dividing the weight average molecular weight (Mw) by the number average molecular weight (Mn), that is, weight average molecular weight (Mw)/number average molecular weight (Mn).

The polymer may be prepared based on preparation examples to describe below. A monomer of each unit of the polymer is introduced together with $Pd_2(dba)_3$ and P(o-tolyl)$_3$ using chlorobenzene as a solvent, and the polymer is prepared through polymerization using a microwave reactor.

The polymer according to the present specification may be prepared using a multi-step chemical reaction. After preparing monomers through an alkylation reaction, a Grignard reaction, a Suzuki coupling reaction, a Stille coupling reaction and the like, final polymers may be prepared through a carbon-carbon coupling reaction such as a Stille coupling reaction. When a substituent to introduce is a boronic acid or a boronic ester compound, a Suzuki coupling reaction may be used, and when a substituent to introduce is a tributyltin or trimethyltin compound, a Stille coupling reaction may be used, however, the method is not limited thereto.

One embodiment of the present specification provides an organic solar cell including a first electrode; a second electrode disposed opposite to the first electrode; and one or more organic material layers disposed between the first electrode and the second electrode and including a photoactive layer, wherein one or more layers of the organic material layers include the polymer.

In the present specification, a description of one member being placed "on" another member includes not only a case of the one member adjoining the another member but a case of still another member being present between the two members.

The organic solar cell according to one embodiment of the present specification includes a first electrode, a photoactive layer and a second electrode. Herein, the photoactive layer may include the polymer according to the above-described embodiments. The organic solar cell may further include a substrate, a hole transfer layer and/or an electron transfer layer.

In one embodiment of the present specification, when the organic solar cell receives photons from an external light source, excitons are separated into electrons and holes at an interface of an electron donor and an electron acceptor of the photoactive layer. The separated holes are transferred to an anode from a photoactive layer after passing through a hole transfer layer through the electron donor, and the separated electrons are transferred to a cathode from a photoactive layer after passing through an electron transfer layer through the electron acceptor.

In one embodiment of the present specification, the organic material layer includes a hole transfer layer, a hole injection layer, or a layer carrying out hole transfer and hole injection at the same time, and the hole transfer layer, the hole injection layer, or the layer carrying out hole transfer and hole injection at the same time includes the polymer.

In another embodiment, the organic material layer includes an electron injection layer, an electron transfer layer, or a layer carrying out electron injection and electron transfer at the same time, and the electron injection layer, the electron transfer layer, or the layer carrying out electron injection and electron transfer at the same time includes the polymer.

FIG. 1 is a diagram illustrating the organic solar cell according to one embodiment of the present specification, which has structure in which an electron transfer layer (102), a photoactive layer (103), a hole transfer layer (104) and a second electrode (105) are consecutively laminated on a first electrode (101), however, the structure of the organic solar cell of the present specification is not limited thereto.

In one embodiment of the present specification, the organic solar cell may further include additional organic material layers. The organic solar cell may reduce the number of organic material layers by using an organic material having various functions at the same time.

In one embodiment of the present specification, the first electrode is an anode, and the second electrode is a cathode. In another embodiment, the first electrode is a cathode, and the second electrode is an anode.

In one embodiment of the present specification, the organic solar cell may have a structure in which a cathode, a photoactive layer and an anode are arranged in consecutive order, or may have a structure in which an anode, a photoactive layer and a cathode are arranged in consecutive order, however, the structure is not limited thereto.

In another embodiment, the organic solar cell may have a structure in which an anode, a hole transfer layer, a photoactive layer, an electron transfer layer and a cathode are arranged in consecutive order, or may have a structure in which a cathode, an electron transfer layer, a photoactive layer, a hole transfer layer and an anode are arranged in consecutive order, however, the structure is not limited thereto.

In one embodiment of the present specification, the organic solar cell has a normal structure. The normal structure may be forming an anode on a substrate. Specifically, according to one embodiment of the present specification, the first electrode formed on the substrate may be an anode when the organic solar cell has a normal structure.

In one embodiment of the present specification, the organic solar cell has an inverted structure. The inverted structure may mean forming a cathode on a substrate.

Specifically, according to one embodiment of the present specification, the first electrode formed on the substrate may be a cathode when the organic solar cell has an inverted structure.

In one embodiment of the present specification, the organic solar cell has a tandem structure. In this case, the organic solar cell may include two or more photoactive layers. The organic solar cell according to one embodiment of the present specification may have the photoactive layer in one, two or more layers.

In another embodiment, a buffer layer may be disposed between the photoactive layer and the hole transfer layer or between the photoactive layer and the electron transfer layer. Herein, a hole injection layer may be further disposed between the anode and the hole transfer layer. In addition, an electron injection layer may be further disposed between the cathode and the electron transfer layer.

In one embodiment of the present specification, the photoactive layer includes one, two or more selected from the group consisting of an electron donor and an electron acceptor, and the electron donor includes the polymer.

According to one embodiment of the present specification, the electron acceptor material is one, two or more compounds selected from the group consisting of non-fullerene-based compounds, fullerene, fullerene derivatives, bathocuproine, semiconducting elements and semiconducting compounds. Specifically, one, two or more compounds selected from the group consisting of fullerene, fullerene derivatives ((6,6)-phenyl-C61-butyric acid-methyl ester ($PC_{61}BM$), (6,6)-phenyl-C71-butyric acid-methyl ester ($PC_{71}BM$), (6,6)-phenyl-C70-butyric acid-methyl ester ($PC_{70}BM$) or (6,6)-phenyl-C61-butyric acid-cholesteryl ester ($PC_{61}BCR$)), perylene, polybenzimidazole (PBI) and 3,4,9,10-perylene-tetracarboxylic bis-benzimidazole (PTCBI) are included.

In one embodiment of the present specification, the non-fullerene-based compound is represented by the following Chemical Formula A.

In Chemical Formula A,
R201 to R204 are the same as or different from each other, and each independently a substituted or unsubstituted aryl group; or a substituted or unsubstituted heteroaryl group,
A101 to A108 are the same as or different from each other, and each independently hydrogen; a halogen group; or a substituted or unsubstituted alkyl group.

According to one embodiment of the present specification, in Chemical Formula A, R201 to R204 are the same as or different from each other, and each independently an aryl group unsubstituted or substituted with an alkyl group; or a heteroaryl group unsubstituted or substituted with an alkyl group.

According to one embodiment of the present specification, in Chemical Formula A, R201 to R204 are the same as or different from each other, and each independently a phenyl group unsubstituted or substituted with an alkyl group; or a thiophene group unsubstituted or substituted with an alkyl group.

According to one embodiment of the present specification, in Chemical Formula A, R201 to R204 are the same as or different from each other, and each independently a phenyl group substituted with an n-hexyl group; or a thiophene group substituted with an n-hexyl group.

According to one embodiment of the present specification, in Chemical Formula A, R201 to R204 are a phenyl group substituted with an n-hexyl group.

According to one embodiment of the present specification, in Chemical Formula A, R201 to R204 are a thiophene group substituted with an n-hexyl group.

According to one embodiment of the present specification, in Chemical Formula A, A101 to A108 are hydrogen; fluorine; or a linear or branched alkyl group.

According to one embodiment of the present specification, in Chemical Formula A, A101 to A104 are the same as or different from each other, and each independently hydrogen; fluorine; or a linear alkyl group.

According to one embodiment of the present specification, in Chemical Formula A, A101 to A104 are the same as or different from each other, and each independently hydrogen; fluorine; or a methyl group.

[Chemical Formula A]

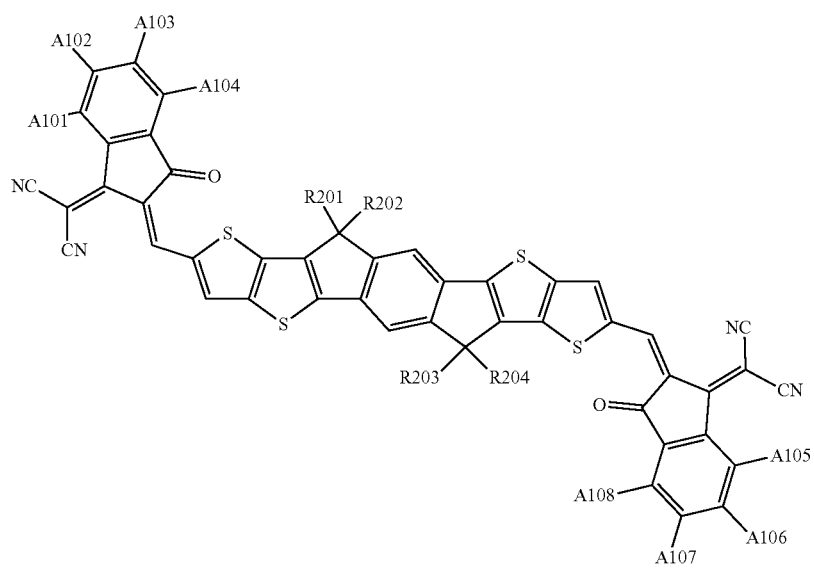

According to one embodiment of the present specification, Chemical Formula A is represented by any one of the following Chemical Formulae A-1 to A-5.
[Chemical Formula A-1]
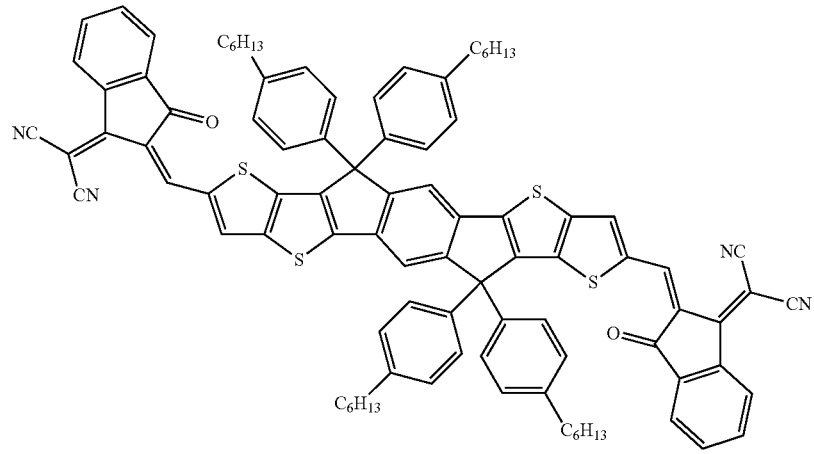
[Chemical Formula A-2]
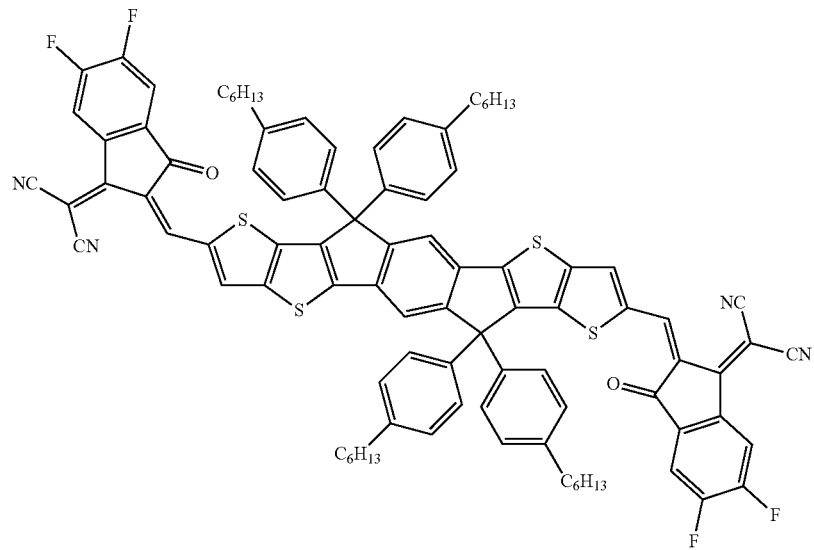
[Chemical Formula A-3]
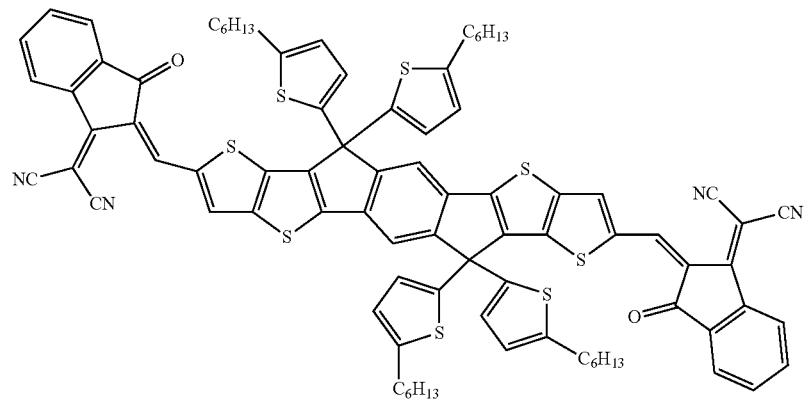

-continued

[Chemical Formula A-4]

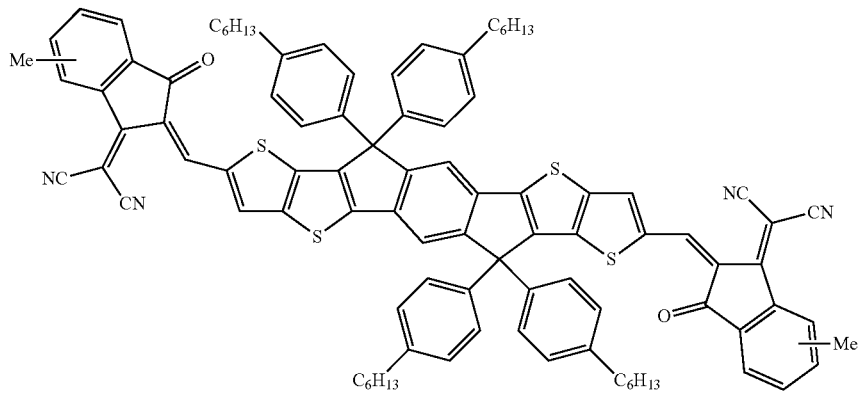

[Chemical Formula A-5]

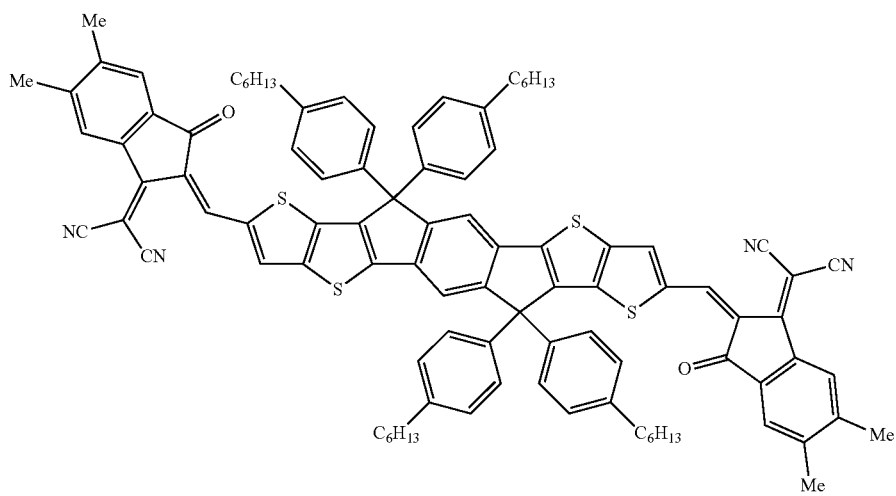

In one embodiment of the present specification, the electron donor and the electron acceptor form a bulk heterojunction (BHJ).

The bulk heterojunction means an electron donor material and an electron acceptor material being mixed together in the photoactive layer.

In one embodiment of the present specification, the photoactive layer further includes an additive.

In one embodiment of the present specification, the additive has a molecular weight of 50 g/mol to 500 g/mol.

In another embodiment, the additive is an organic material having a boiling point of 30° C. to 300° C.

In the present specification, the organic material means a material including at least one or more carbon atoms.

In one embodiment, the additive may further include one or two types of additives among additives selected from the group consisting of 1,8-diiodooctane (DIO), 1-chloronaphthalene (1-CN), diphenyl ether (DPE), octanedithiol and tetrabromothiophene.

The additive may be included in 0.1 v/v % to 5 v/v % and specifically in 0.3 v/v % to 0.8 v/v % with respect to the total volume of the photoactive layer.

In one embodiment of the present specification, the photoactive layer has a bilayer structure including an n-type organic material layer and a p-type organic material layer, and the p-type organic material layer includes the polymer.

The substrate in the present specification may include a glass substrate or a transparent plastic substrate having excellent transparency, surface smoothness, handling easiness and water resistance, but is not limited thereto, and substrates commonly used in organic solar cells may be used without limit Specific examples thereof include glass, polyethylene teraphthalate (PET), polyethylene naphthalate (PEN), polypropylene (PP), polyimide (PI), triacetyl cellulose (TAC) and the like, but are not limited thereto.

The first electrode may include a material that is transparent and has excellent conductivity, but is not limited thereto. Examples of the first electrode material include metals such as vanadium, chromium, copper, zinc or gold, or alloys thereof; metal oxides such as zinc oxides, indium oxides, indium tin oxides (ITO) or indium zinc oxides (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, and the like, but are not limited thereto.

A method of forming the first electrode is not particularly limited, however, the first electrode may be formed by being applied to one surface of a substrate or coated in the form of a film using a method such as sputtering, E-beam, thermal deposition, spin coating, screen printing, inkjet printing, doctor blade or gravure printing.

When the first electrode is formed on a substrate, the result may go through processes of cleaning, moisture removal and modifying to be hydrophilic.

For example, after a patterned ITO substrate is cleaned with a cleaning agent, acetone and isopropyl alcohol (IPA) in consecutive order, the ITO substrate is dried for 1 minute to 30 minutes at 100° C. to 150° C., preferably for 10 minutes at 120° C., on a heating plate in order to remove moisture, and when the substrate is completely cleaned, the substrate surface is modified to be hydrophilic.

Through the surface modification such as above, the junctional surface potential may be maintained at a level suitable for the surface potential of the photoactive layer. In addition, when the surface is modified, a polymer thin film may be readily formed on the first electrode, and the quality of the thin film may be improved.

Preprocessing technologies of the first electrode include a) a surface oxidation method using parallel plate discharge, b) a method of oxidizing the surface through ozone generated by UV rays under a vacuum, and c) an oxidation method using the oxygen radicals generated by plasma.

One of the methods described above may be selected depending on the condition of the first electrode or the substrate. However, it is commonly preferred to prevent the leave of oxygen on the surface of the first electrode or the substrate and to suppress the remaining of moisture and organic materials as much as possible, no matter which method is used. In this case, practical effects of the preprocessing may be maximized.

As a specific example, a method of oxidizing the surface through ozone generated by UV rays may be used. Herein, the patterned ITO substrate may be fully dried by baking the patterned ITO substrate on a hot plate after ultrasonic cleaning, and the patterned ITO substrate is introduced into a chamber and then may be cleaned by ozone generated by reacting oxygen gas with UV light using a UV lamp.

However, the method of surface modification of the patterned ITO substrate in the present specification is not particularly limited, and any method oxidizing a substrate may be used.

The second electrode may include a metal having small work function, but is not limited thereto. Specific examples thereof may include metals such as magnesium, calcium, sodium, potassium, titanium, indium, yttrium, lithium, gadolinium, aluminum, silver, tin and lead, or alloys thereof; or multilayer structure materials such as LiF/Al, LiO$_2$/Al, LiF/Fe, Al:Li, Al:BaF$_2$ and Al:BaF$_2$:Ba, but are not limited thereto.

The second electrode may be formed by being deposited inside a thermal deposition apparatus having a degree of vacuum of 5×10$^{-7}$ torr or less, however, the formation is not limited to this method.

The hole transfer layer and/or the electron transfer layer material play a role of efficiently transferring the electrons and the holes separated in the photoactive layer to an electrode, and the material is not particularly limited.

The hole transfer layer material may include poly(3,4-ethylenediocythiophene) doped with poly(styrenesulfonic acid) (PEDOT:PSS), molybdenum oxides (MoO$_x$); vanadium oxide (V$_2$O$_5$); nickel oxide (NiO); tungsten oxides (WOO, and the like, but is not limited thereto.

The electron transfer layer material may include electron-extracting metal oxides, and may specifically include a metal complex of 8-hydroxyquinoline; a complex including Alq$_3$; a metal complex including Liq; LiF; Ca; titanium oxides (TiO$_x$); zinc oxide (ZnO); cesium carbonate (Cs$_2$CO$_3$), and the like, but is not limited thereto.

The photoactive layer may be formed by dissolving a photoactive material such as an electron donor and/or an electron acceptor in an organic solvent, and then coating the solution using a method such as spin coating, dip coating, screen printing, spray coating, doctor blade and brush painting, however, the method is not limited thereto.

Hereinafter, the present specification will be described in detail with reference to examples in order to specifically describe the present specification. However, examples according to the present specification may be modified to various other forms, and the scope of the present specification is not construed as being limited to the examples described below. Examples of the present specification are provided in order to more fully describe the present specification to those having average knowledge in the art.

SYNTHESIS OF POLYMER

Synthesis Example 1

Monomers A-1, B-1 and C-1 were introduced together with Pd$_2$(dba)$_3$ and P(o-tolyl)$_3$ using chlorobenzene as a solvent, and polymerized using a microwave reactor to prepare the following Polymer 1.

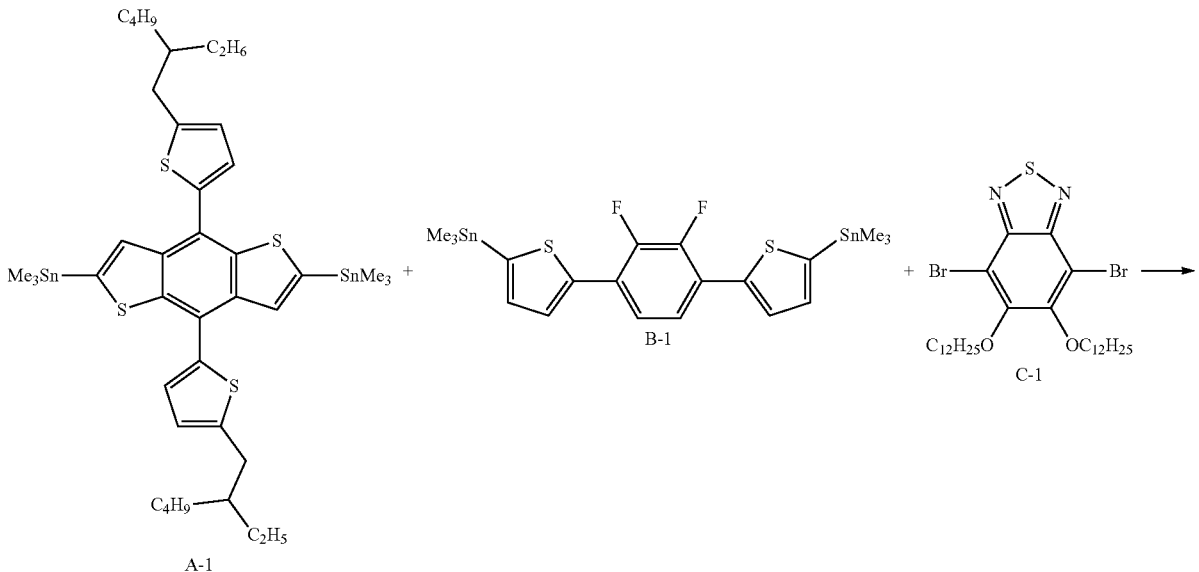

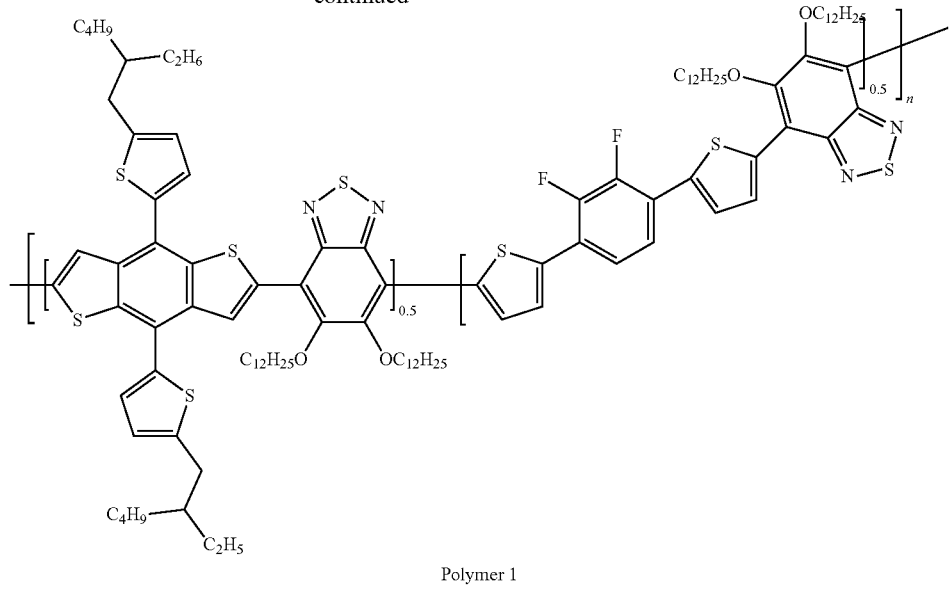
Polymer 1
Synthesis Example 2
The following Polymer 2 was prepared in the same manner as in Synthesis Example 1 except that the following Monomer A-2 was used instead of Monomer A-1.
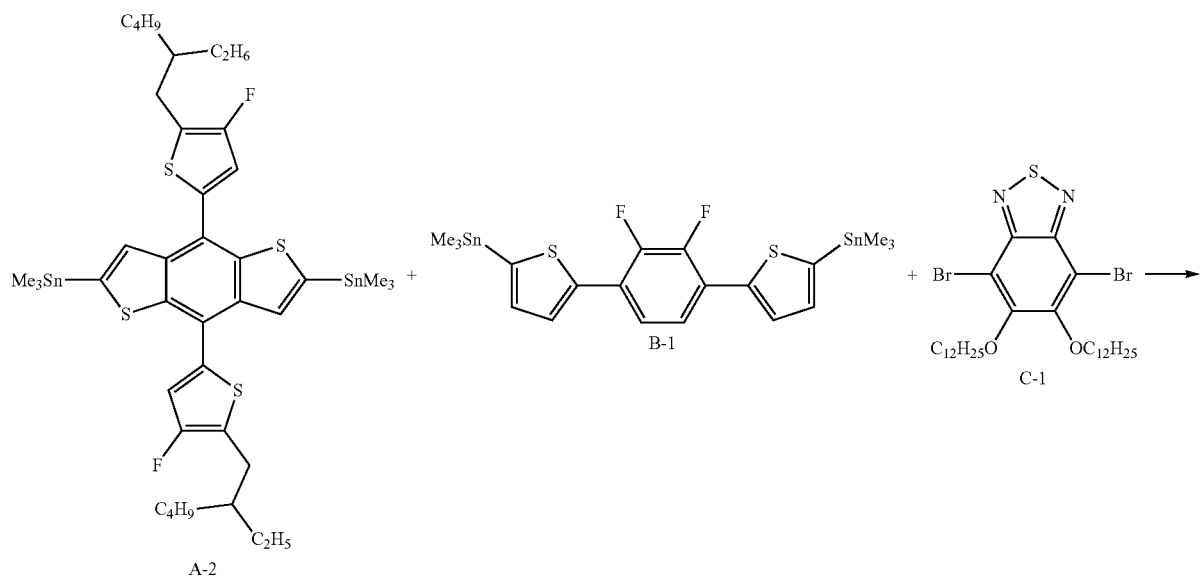

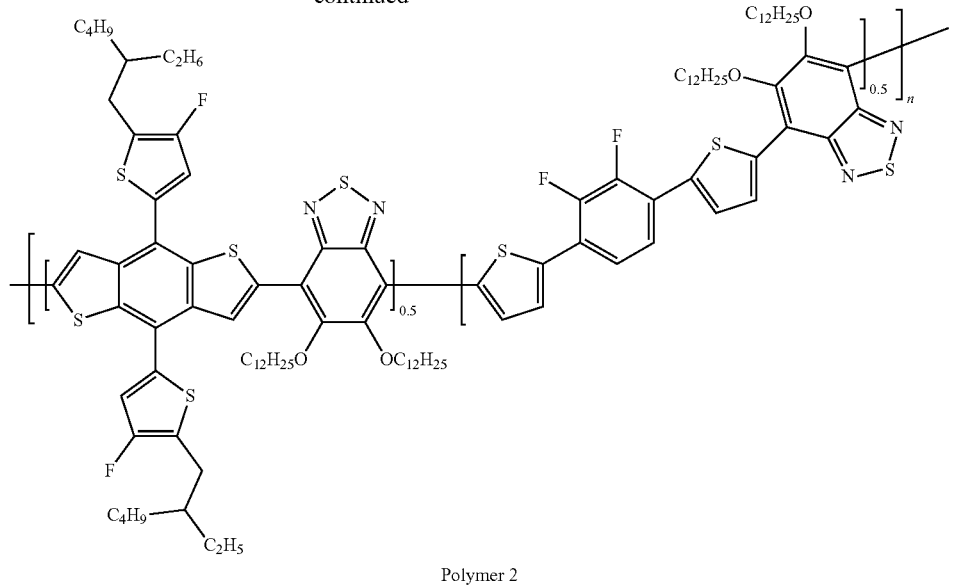
Polymer 2
Synthesis Example 3
The following Polymer 3 was prepared in the same manner as in Synthesis Example 1 except that the following Monomer C-2 was used instead of Monomer C-1.
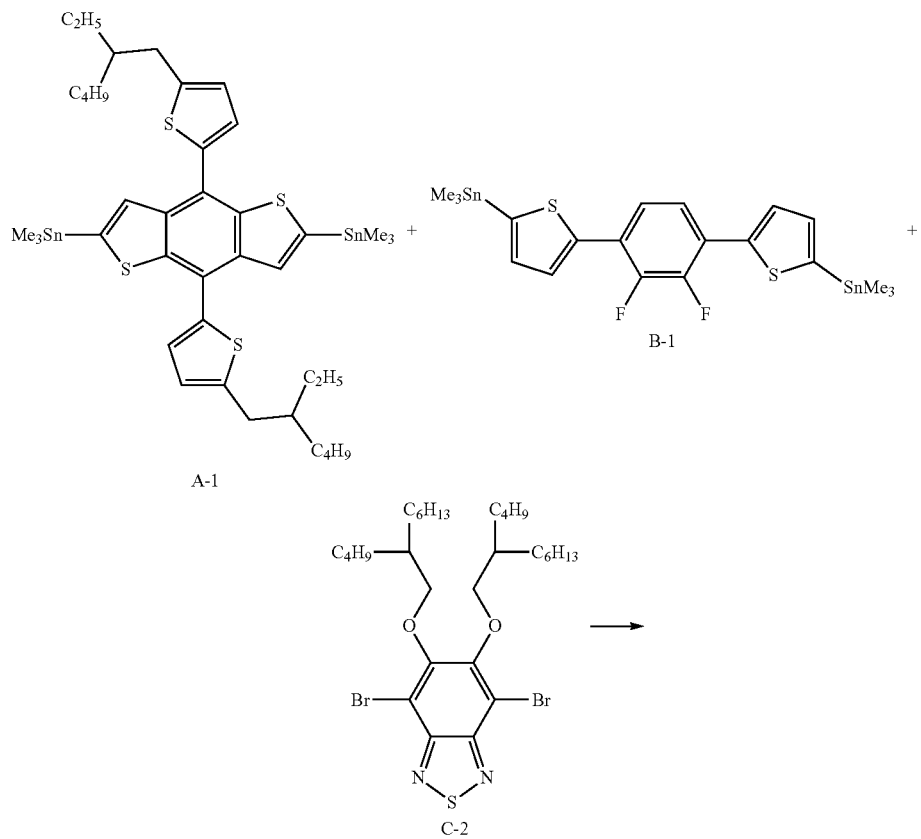

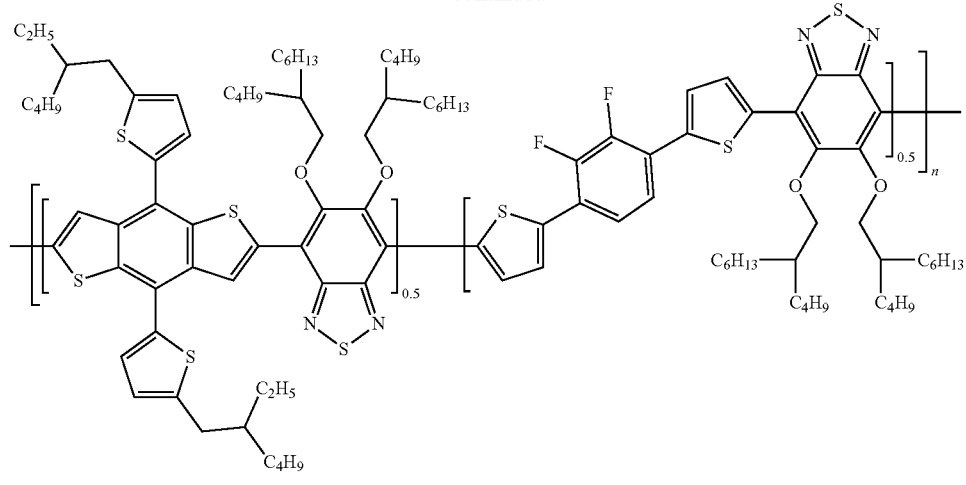
Polymer 3
Synthesis Example 4
The following Polymer 4 was prepared in the same manner as in Synthesis Example 1 except that the following Monomer A-2 was used instead of Monomer A-1, and the following Monomer C-2 was used instead of Monomer C-1.
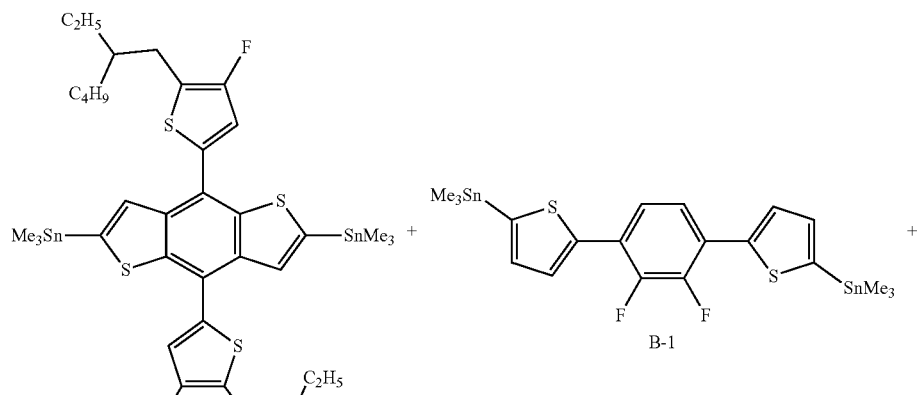
A-1
B-1
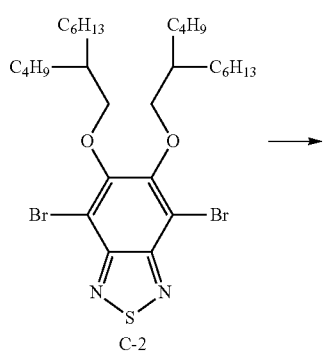
C-2

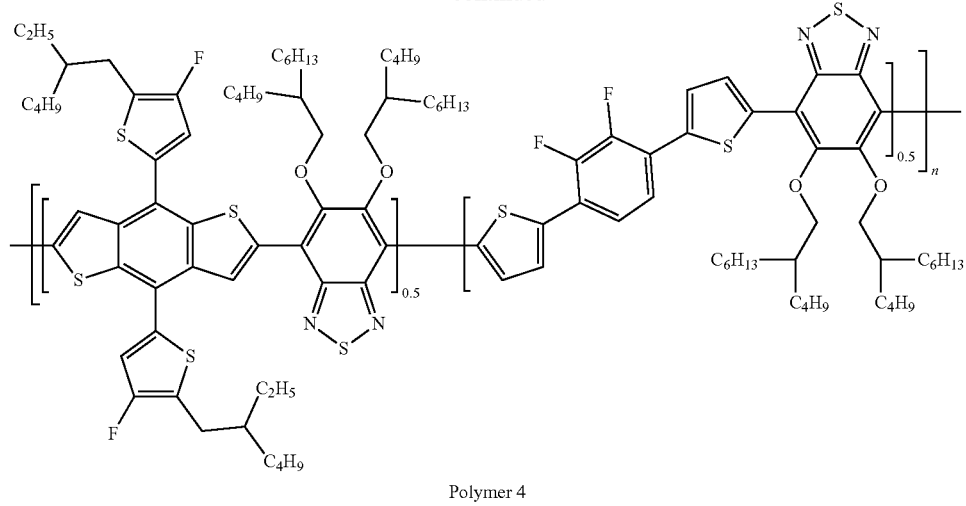
Polymer 4
Synthesis Example 5
The following Polymer 5 was prepared in the same manner as in Synthesis Example 1 except that the following Monomer A-3 was used instead of Monomer A-1. A UV-Vis spectrum of Polymer 5 in a film state is shown in FIG. 2.
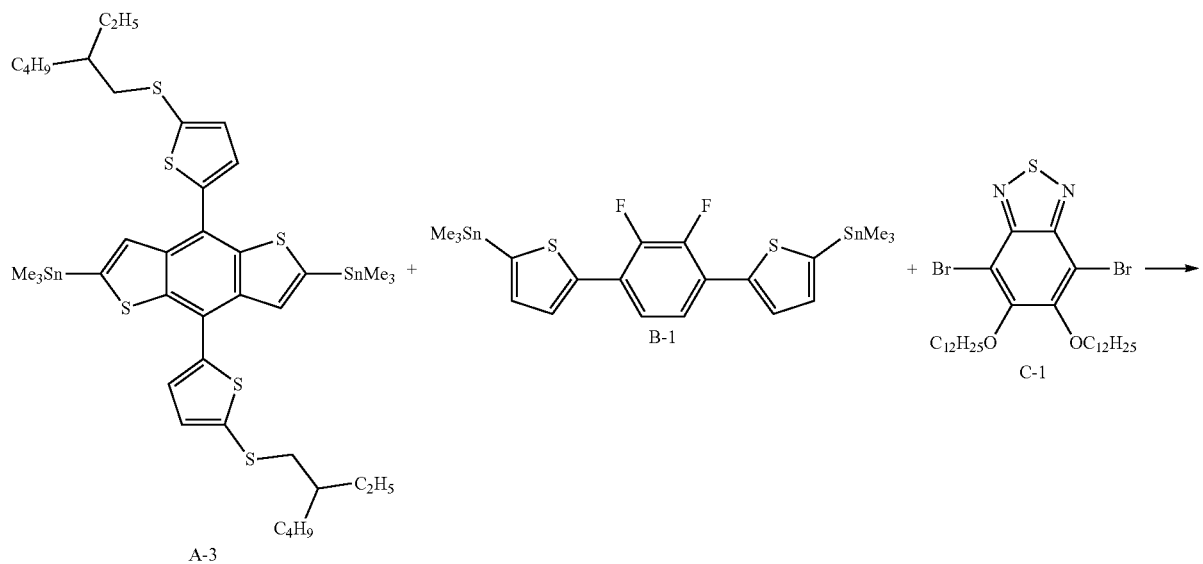

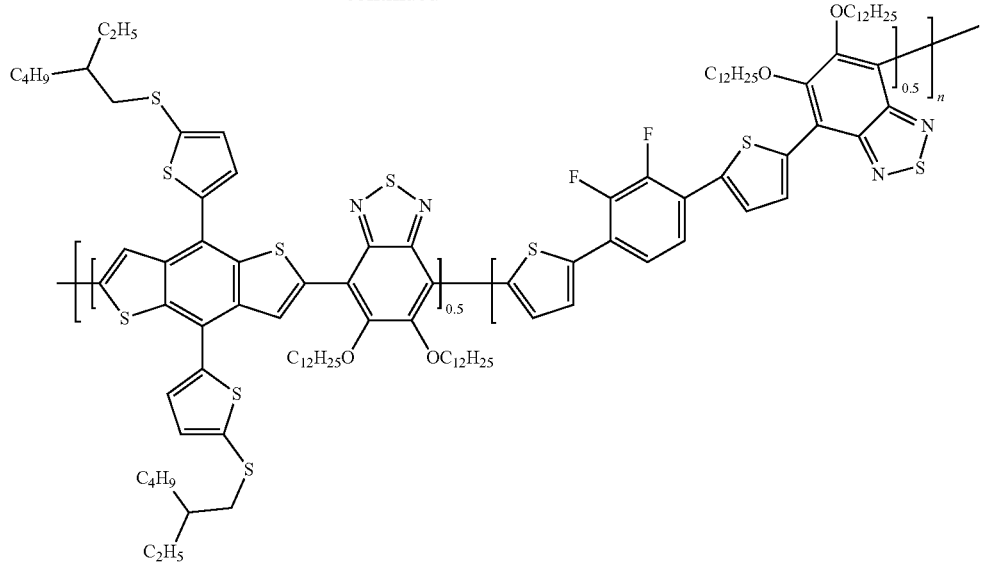
Polymer 5
Synthesis Example 6
The following Polymer 6 was prepared in the same manner as in Synthesis Example 1 except that the following Monomer A-4 was used instead of Monomer A-1.
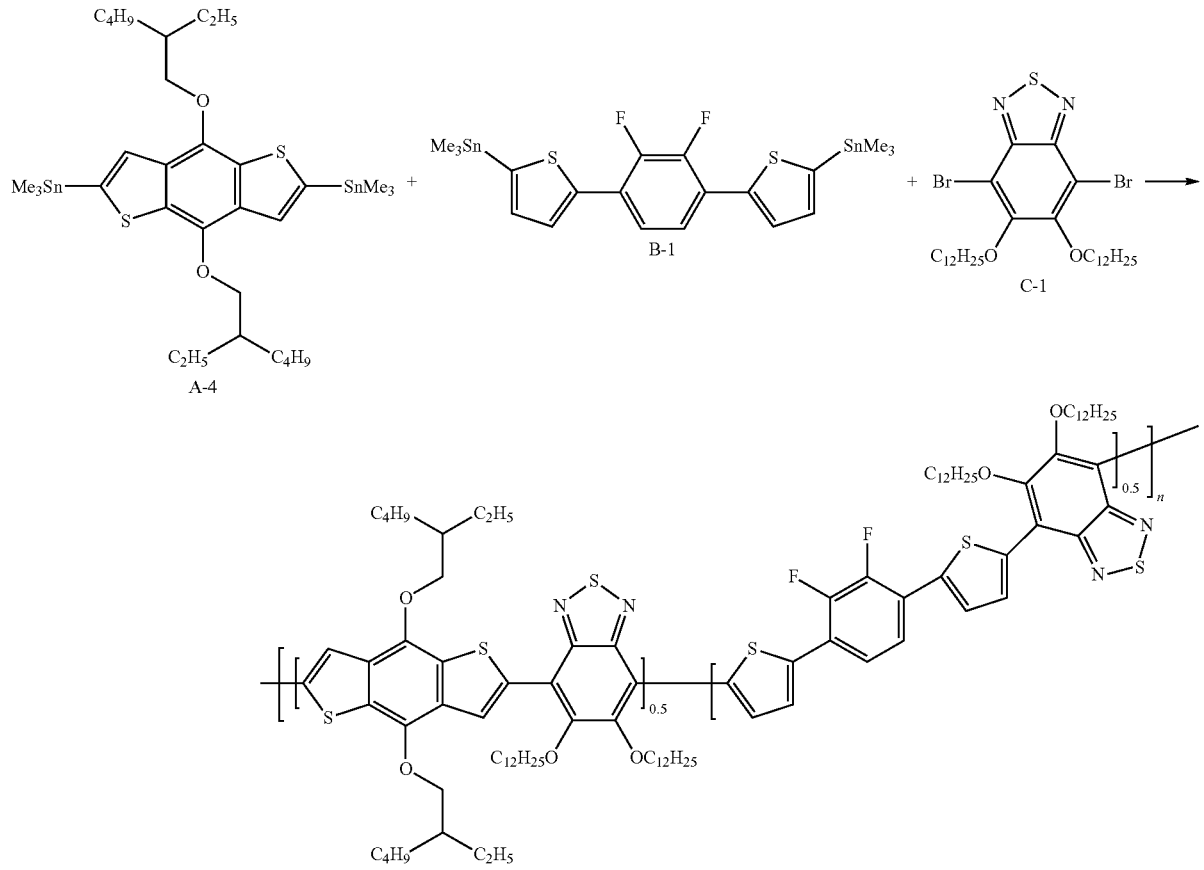
Polymer 6

Synthesis Example 7

The following Polymer 7 was prepared in the same manner as in Synthesis Example 1 except that the following Monomer C-3 was used instead of Monomer C-1.

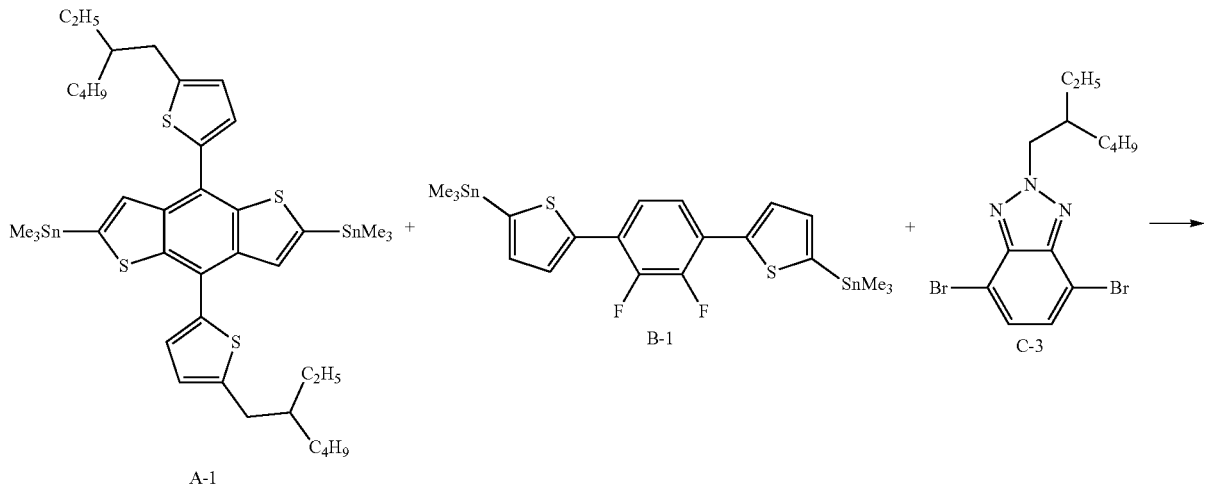

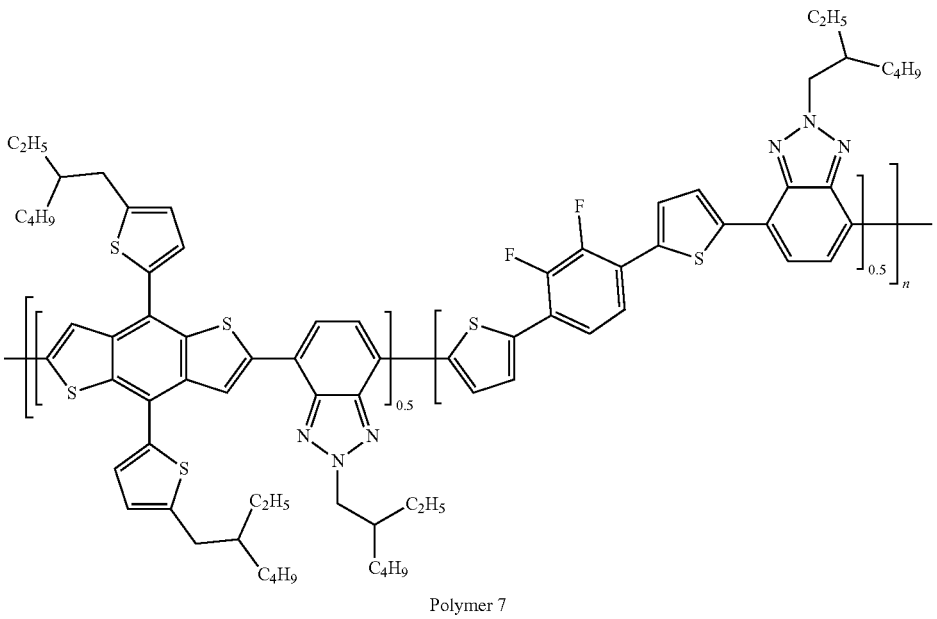

Polymer 7

Synthesis Example 8

The following Polymer 8 was prepared in the same manner as in Synthesis Example 1 except that the following Monomer A-2 was used instead of Monomer A-1, and the following Monomer C-3 was used instead of Monomer C-1.

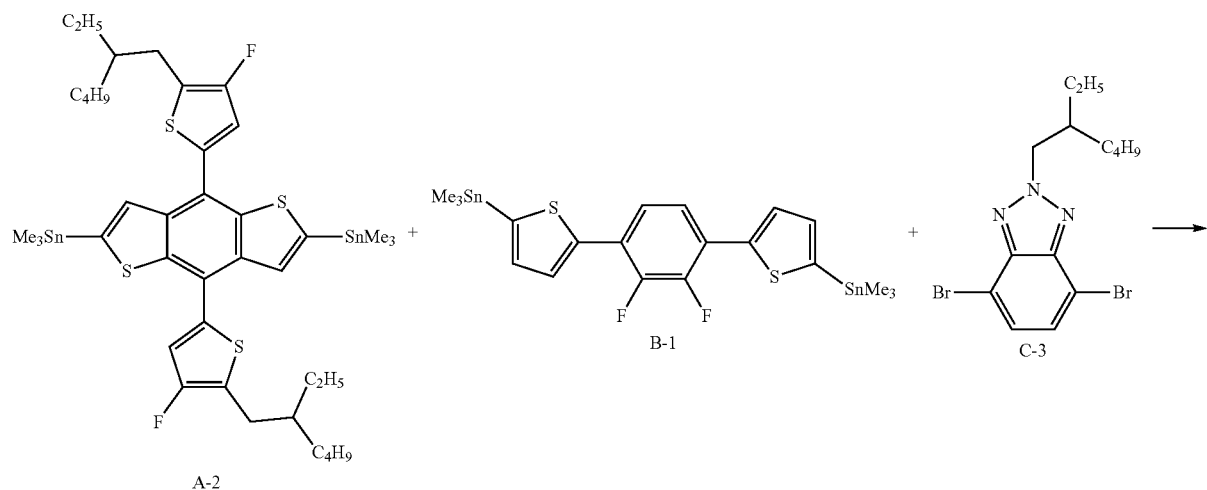
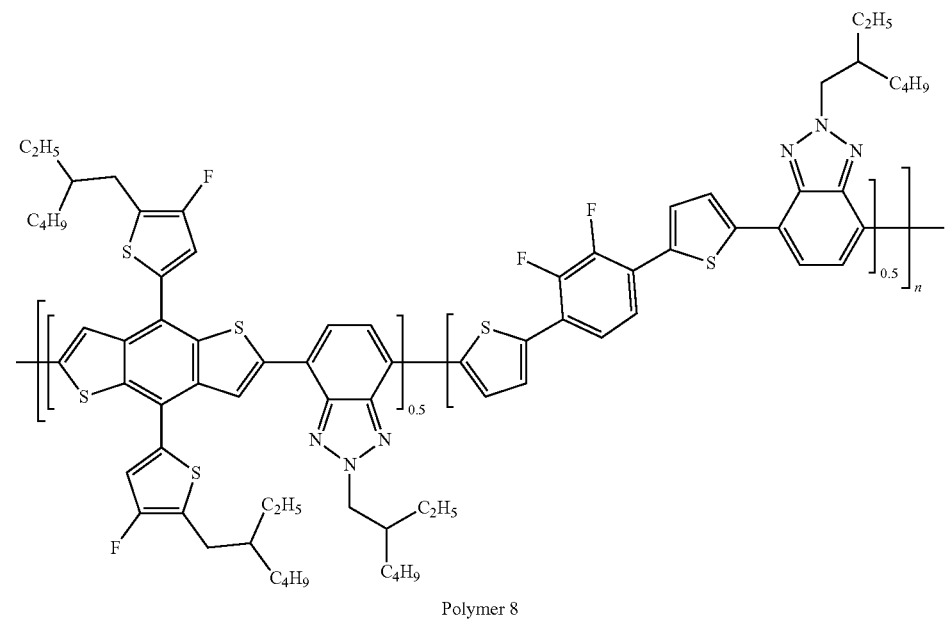
Synthesis Example 9
The following Polymer 9 was prepared in the same manner as in Synthesis Example 1 except that the following Monomer A-3 was used instead of Monomer A-1, and the following Monomer C-3 was used instead of Monomer C-1.

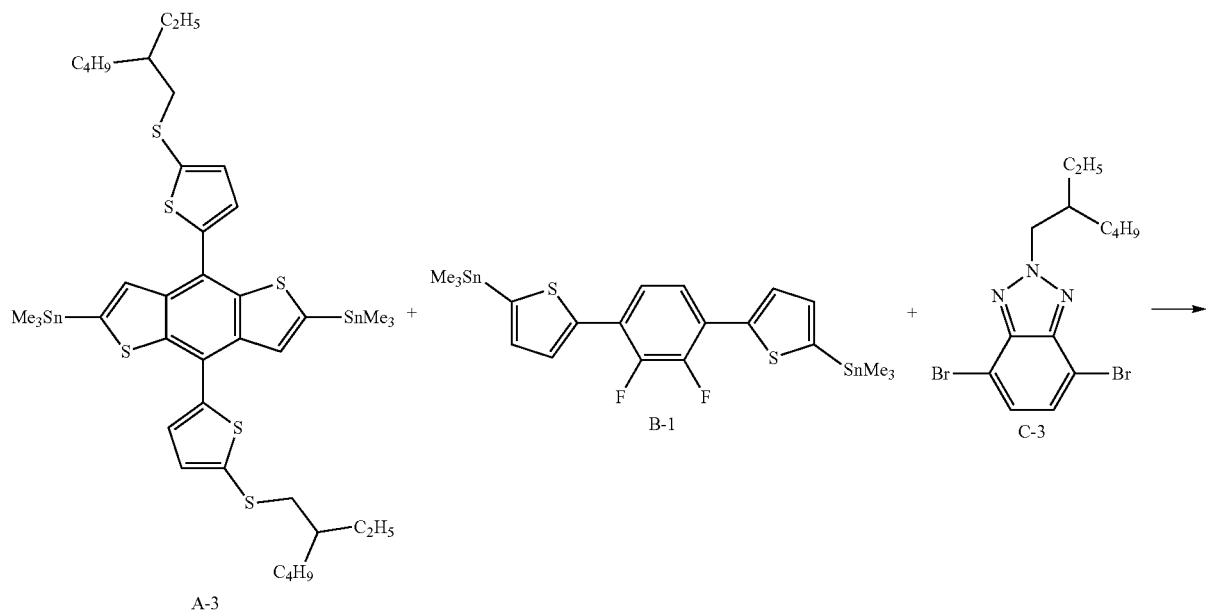
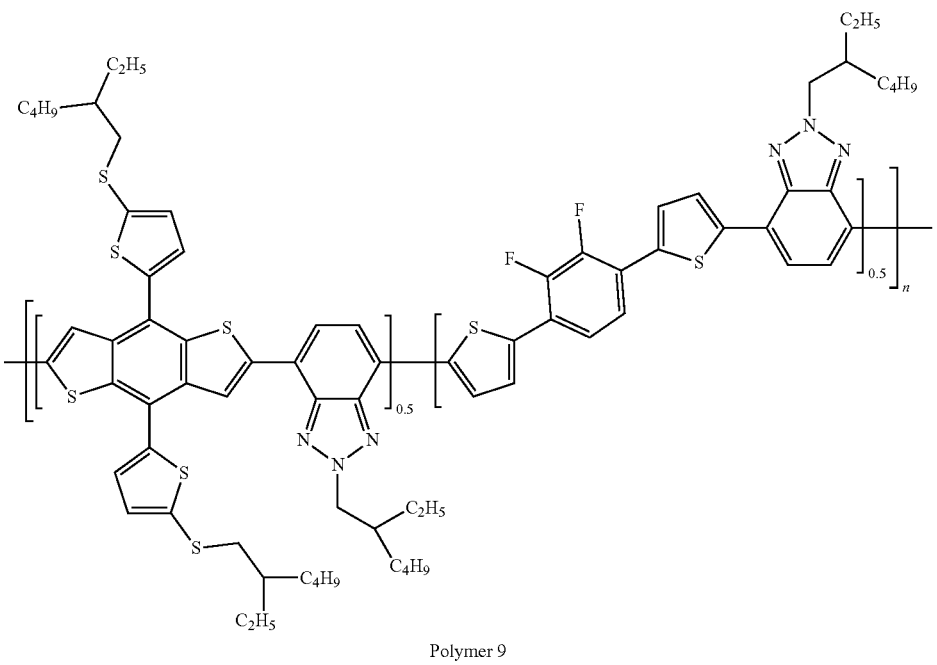
Polymer 9
Synthesis Example 10
The following Polymer 10 was prepared in the same manner as in Synthesis Example 1 except that the following Monomer C-4 was used instead of Monomer C-1.

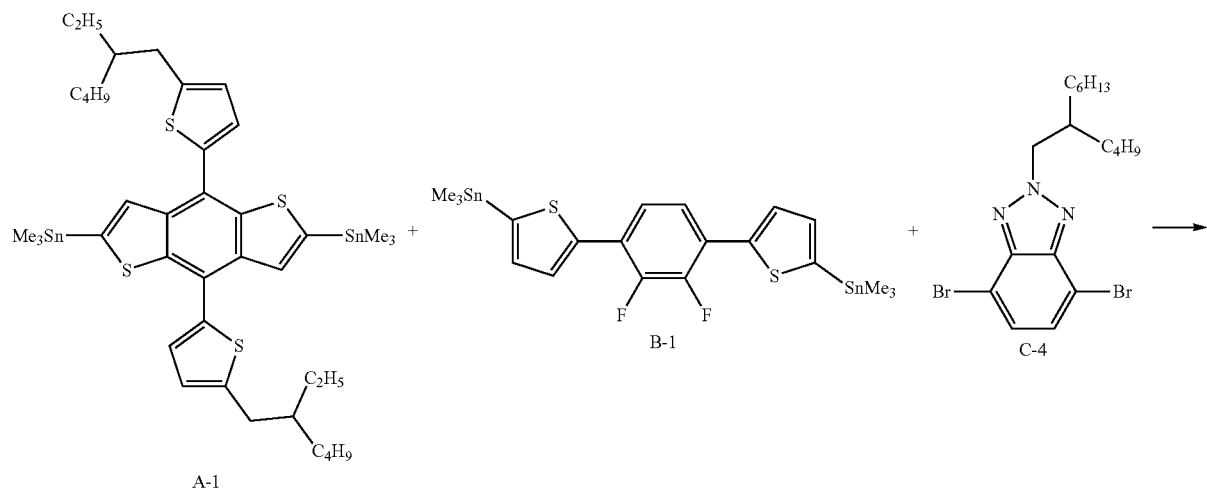
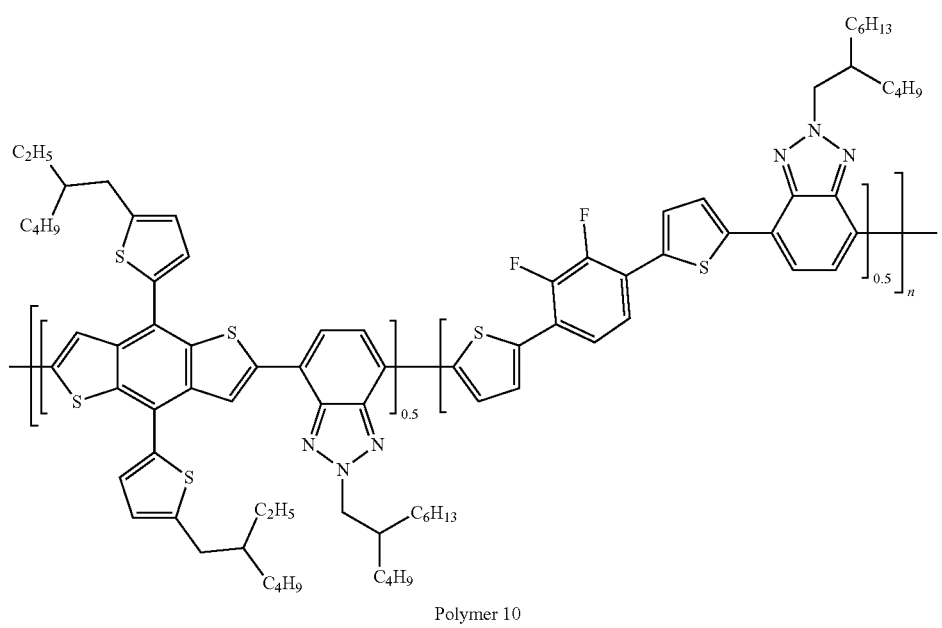
Synthesis Example 11
The following Polymer 11 was prepared in the same manner as in Synthesis Example 1 except that the following Monomer A-2 was used instead of Monomer A-1, and the following Monomer C-4 was used instead of Monomer C-1.

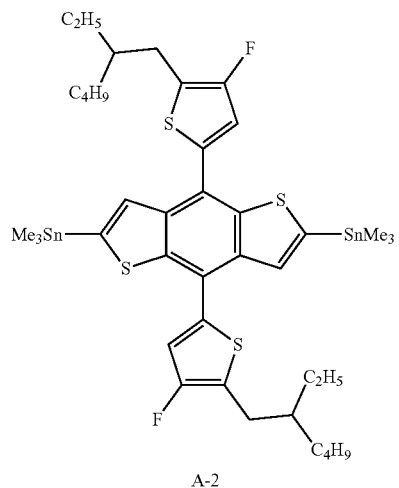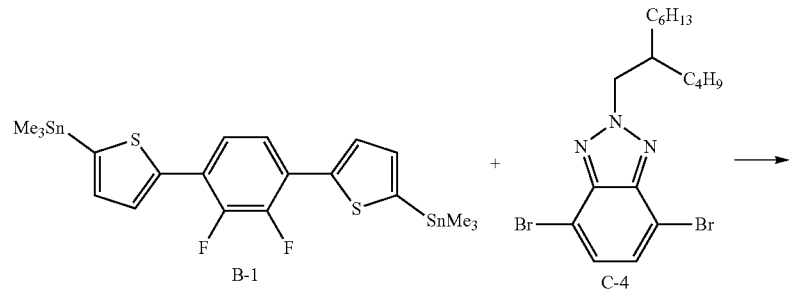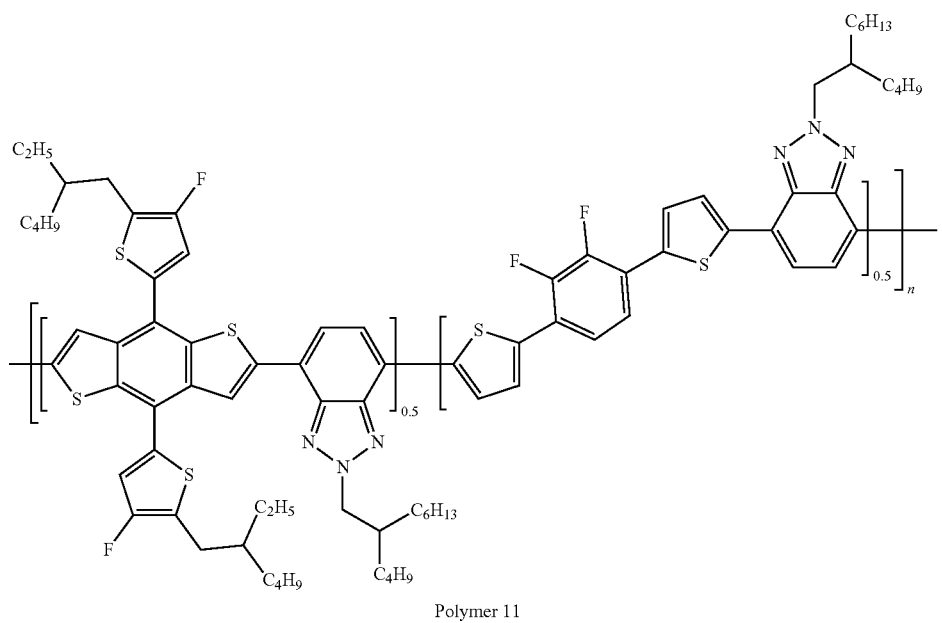
Polymer 11
Synthesis Example 12
The following Polymer 12 was prepared in the same manner as in Synthesis Example 1 except that the following Monomer A-3 was used instead of Monomer A-1, and the following Monomer C-4 was used instead of Monomer C-1.

Figure 3:
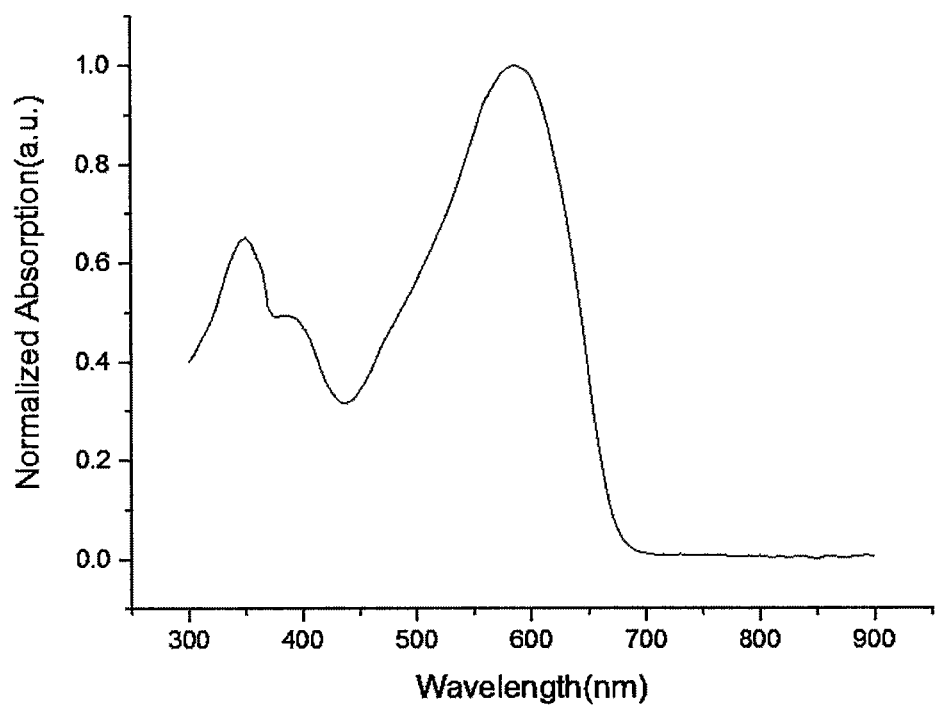
FIG. 3 is a diagram presenting a UV-Vis spectrum of Polymer 13 in a film state.

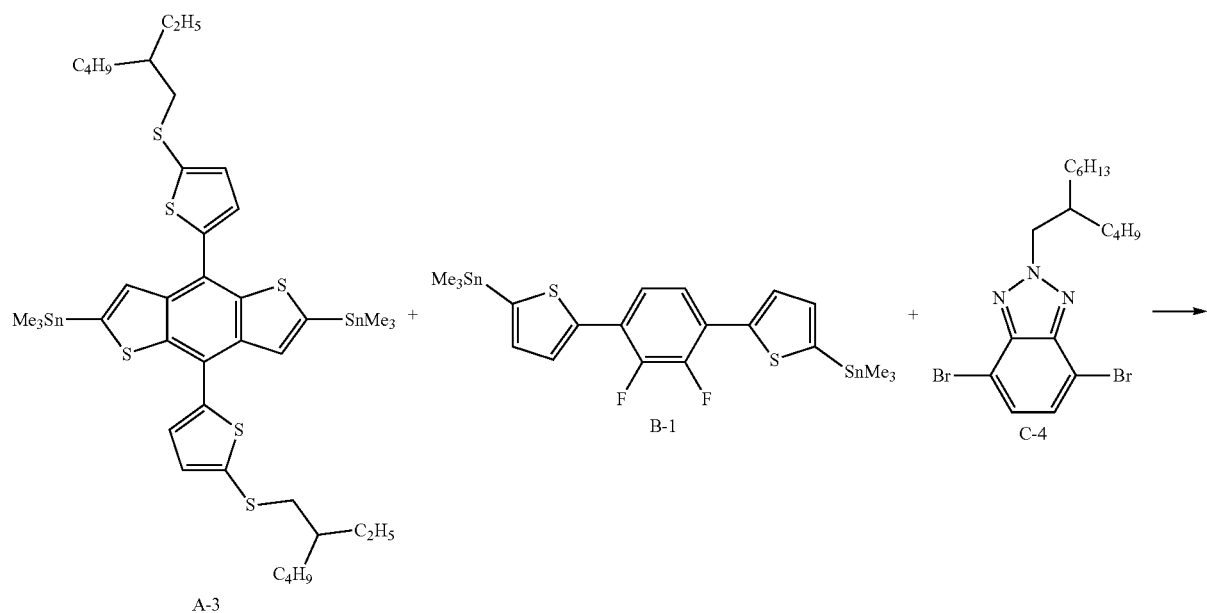
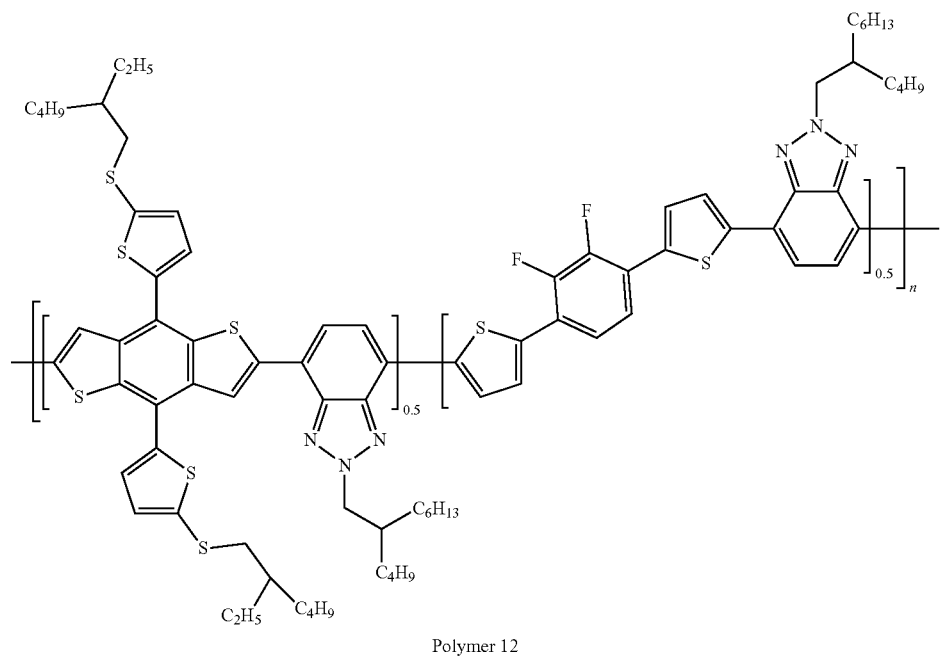
Polymer 12
Synthesis Example 13
The following Polymer 13 was prepared in the same manner as in Synthesis Example 1 except that the following Monomer A-3 was used instead of Monomer A-1. A UV-Vis spectrum of Polymer 13 in a film state is shown in FIG. 3.

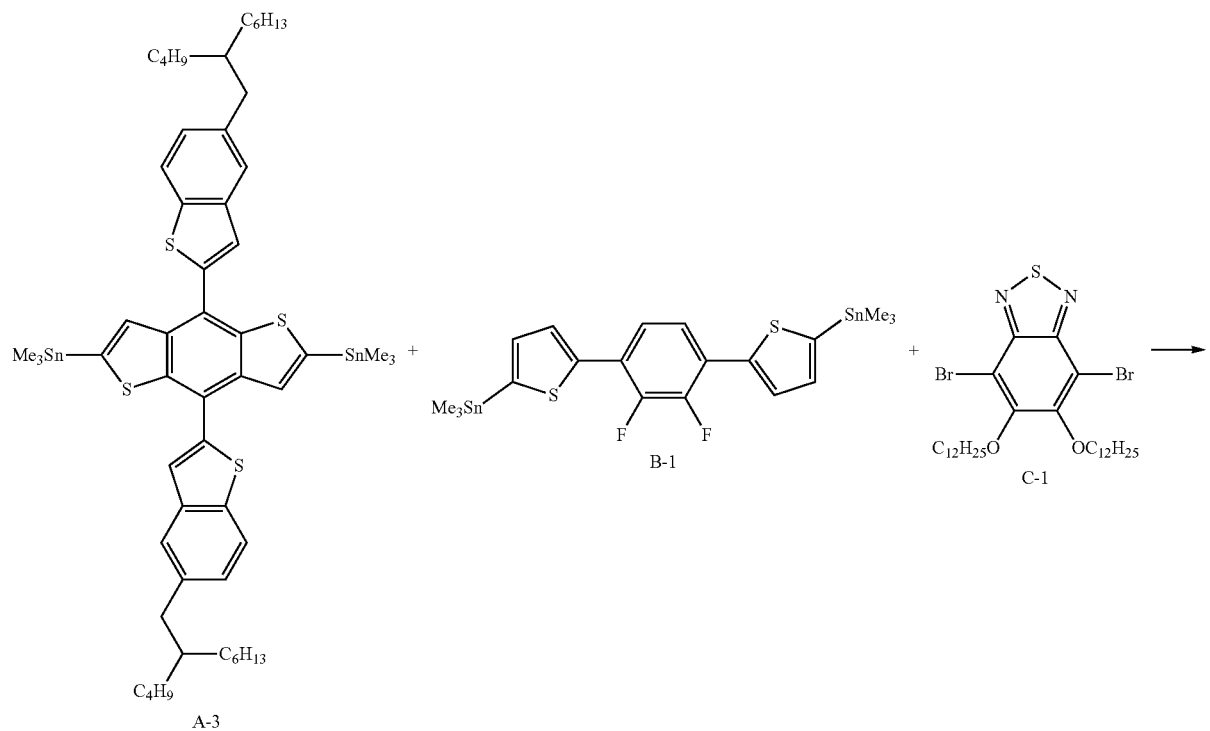
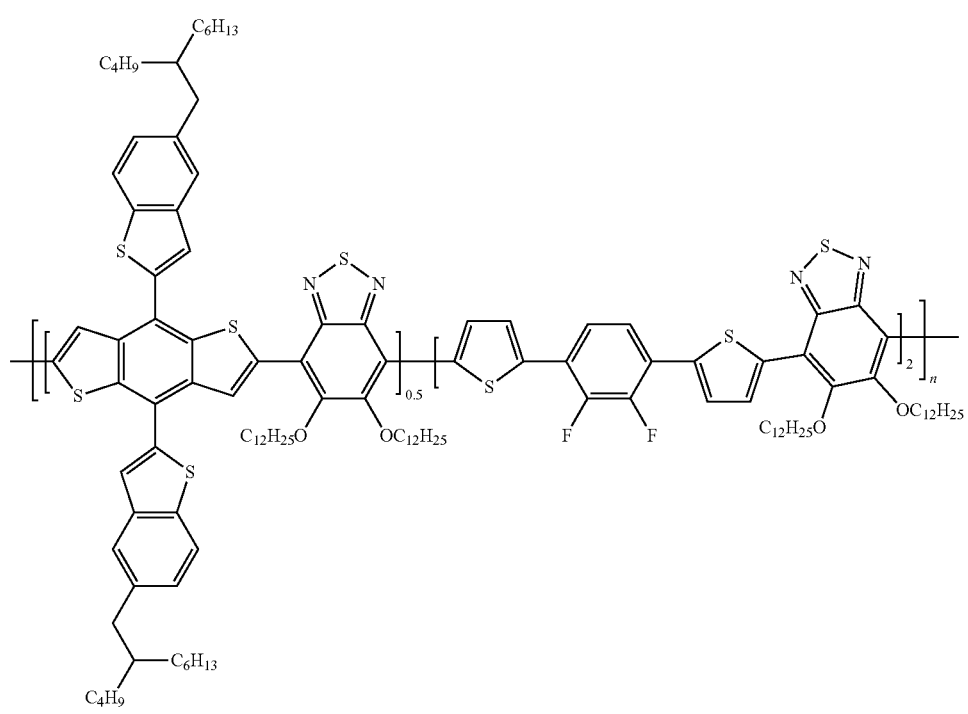
Polymer 13
Synthesis Example 14
The following Polymer 14 was prepared in the same manner as in Synthesis Example 1 except that the following Monomer A-4 was used instead of Monomer A-1.

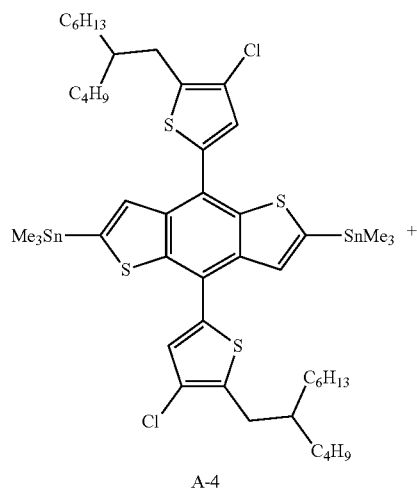
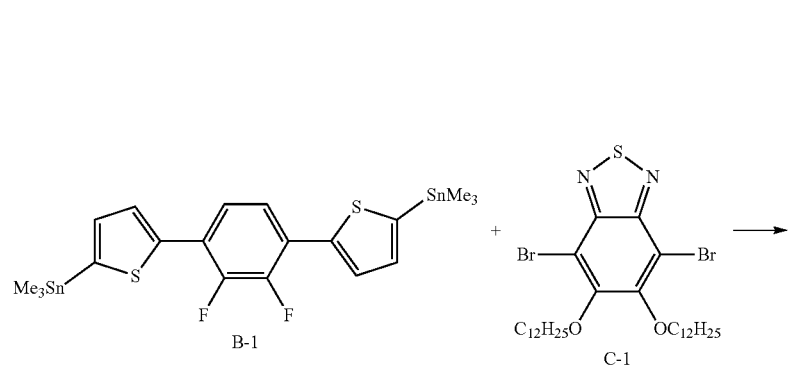
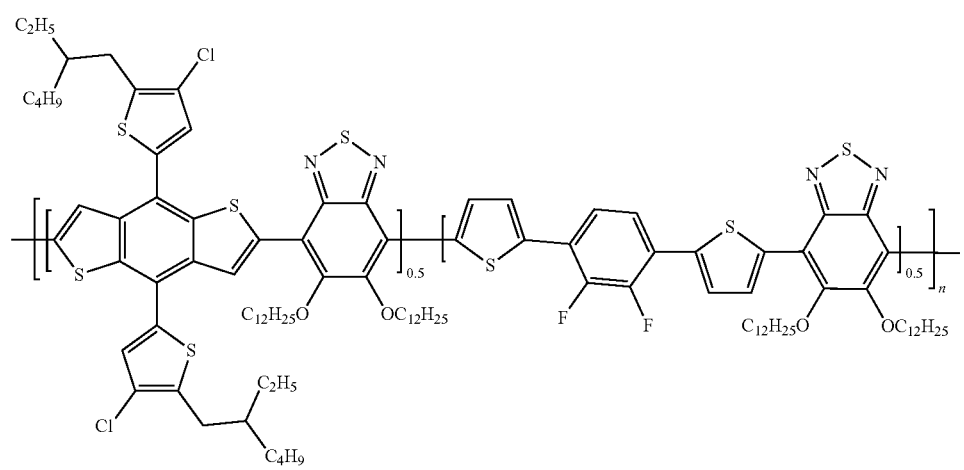
Polymer 14
Synthesis Example 15
The following Polymer 15 was prepared in the same manner as in Synthesis Example 1 except that the following Monomer A-5 was used instead of Monomer A-1.

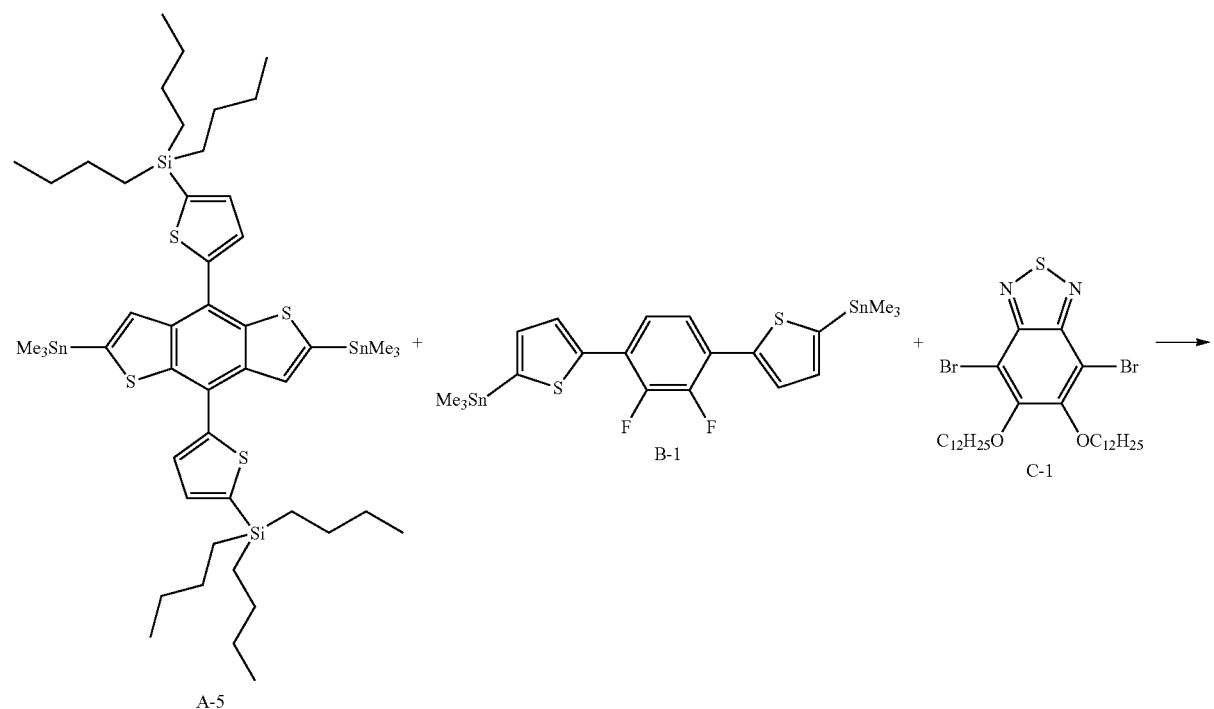
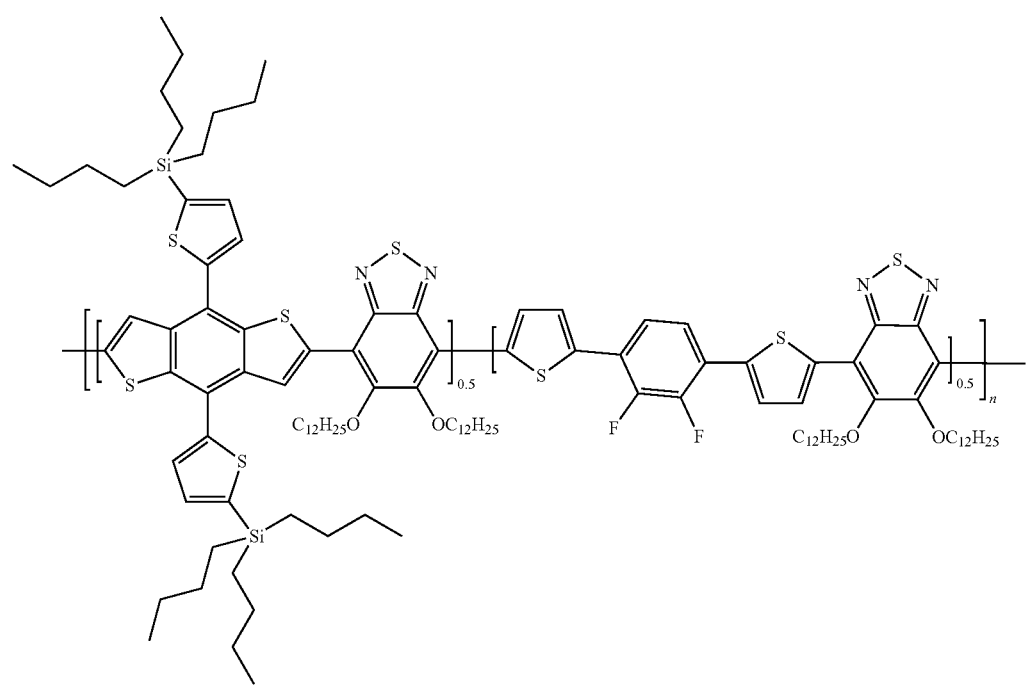
Polymer 15

Molecular weights and molecular weight distribution of the polymers prepared in Synthesis Examples 1 to 15 are shown in the following Table 1.

TABLE 1

|  | Mn (Number Average Molecular Weight) | Mw (Weight Average Molecular Weight) | PDI (Molecular Weight Distribution, Mw/Mn) |
|---|---|---|---|
| Polymer 1 | 33,860 | 57,490 | 1.7 |
| Polymer 2 | 62,300 | 71,900 | 1.15 |
| Polymer 3 | 28,500 | 42,720 | 1.50 |
| Polymer 4 | 35,870 | 48,250 | 1.34 |
| Polymer 5 | 30,300 | 59,650 | 1.97 |
| Polymer 6 | 27,850 | 36,290 | 1.3 |
| Polymer 7 | 19,930 | 28,590 | 1.43 |
| Polymer 8 | 20,080 | 30,220 | 1.50 |
| Polymer 9 | 25,370 | 34,290 | 1.35 |
| Polymer 10 | 29,930 | 40,590 | 1.35 |
| Polymer 11 | 31,220 | 39,680 | 1.27 |
| Polymer 12 | 33,420 | 42,290 | 1.26 |
| Polymer 13 | 30,090 | 58,900 | 1.96 |
| Polymer 14 | 29,100 | 52,250 | 1.80 |
| Polymer 15 | 26,088 | 63,334 | 2.43 |

In Table 1, as for the molecular weight, the number average molecular weight (Mn) and the weight average molecular weight (Mw) were measured by GPC using chlorobenzene as a solvent, and the molecular weight distribution means a number dividing the weight average molecular weight (Mw) by the number average molecular weight (Mn), that is, weight average molecular weight (Mw)/number average molecular weight (Mn).

Only synthesis methods of Polymers 1 to 15 are illustrated above, however, polymers other the above-described polymers may be synthesized by properly changing substituents of Chemical Formulae 1, 2 and 3, or 1, 2 and 4 according to one embodiment of the present specification.

Manufacture of Organic Solar Cell

Comparative Example 1

A composite solution was prepared by dissolving the following Comparative Polymer 1 and the following Chemical Formula A-1 in chlorobenzene (CB) in a weight ratio of 1:2.

Herein, the concentration was adjusted to 2 wt %, and the organic solar cell employed an inverted structure of ITO/ZnO/photoactive layer/MoO$_3$/Ag.

ITO was formed on a substrate as a first electrode, the ITO substrate was ultrasonic cleaned using distilled water, acetone and 2-propanol, and the ITO surface was ozone treated for 10 minutes.

On the ITO, ZnO was spin-coated to form an electron transfer layer to a thickness of 40 nm. Then, the composite solution of the following Comparative Polymer 1 and the following Chemical Formula A-1 was spin-coated on the electron transfer layer to form a photoactive layer to a thickness of 100 nm, and a hole transfer layer was formed on the photoactive layer by depositing MoO$_3$ to a thickness of 10 nm. Lastly, for forming a second electrode, Ag was deposited to a thickness of 100 nm using a thermal evaporator under a vacuum of $3\times10^{-8}$ torr, and an organic solar cell was manufactured.

[Comparative Polymer 1]

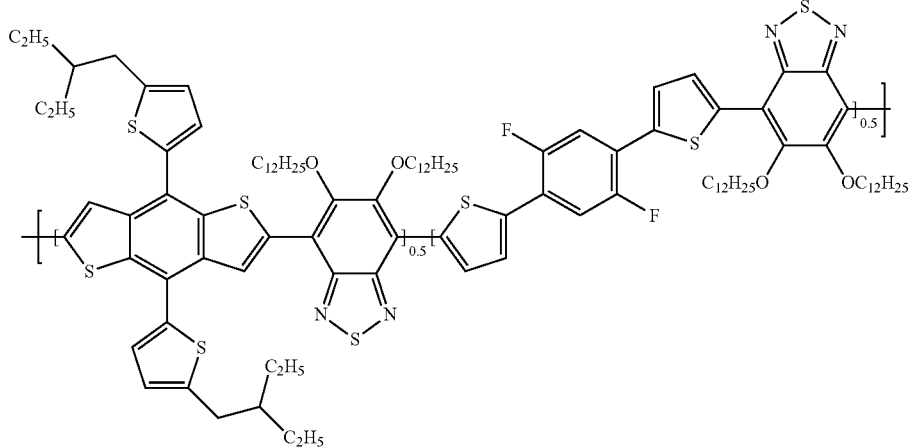

Number average molecular weight (Mn): 67,800
Weight average molecular weight (Mw): 101,460

[Chemical Formula A-1]

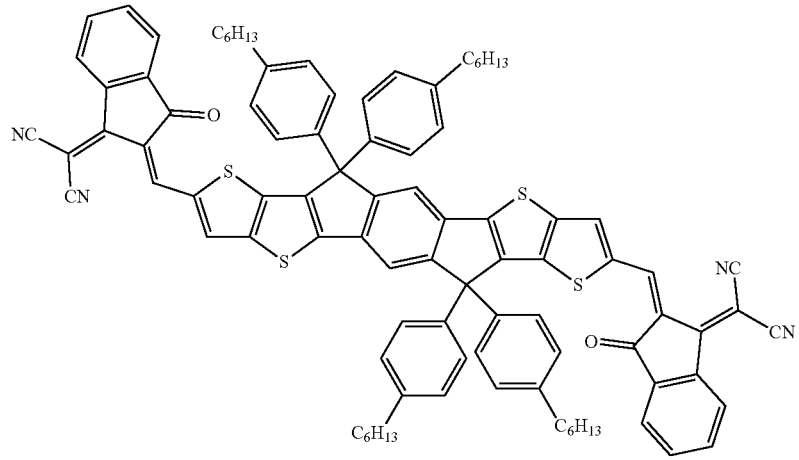

Examples 1 to 15

Organic solar cells were manufactured in the same manner as in Comparative Example 1 except that Polymers 1 to 15 were respectively used instead of Comparative Polymer 1.

Photoelectric conversion properties of the organic solar cells manufactured in Comparative Example 1 and Examples 1 to 15 were measured under a condition of 100 mW/cm² (AM 1.5), and the results are shown in the following Table 2.

TABLE 2

|  | $V_{oc}$ (V) | $J_{sc}$ (mA/cm²) | FF | η (%) |
| --- | --- | --- | --- | --- |
| Comparative Example 1 | 0.912 | 12.443 | 0.632 | 7.17 |
| Example 1 | 0.899 | 14.416 | 0.646 | 8.37 |
| Example 2 | 1.024 | 13.248 | 0.616 | 8.36 |
| Example 3 | 0.908 | 13.824 | 0.646 | 8.11 |
| Example 4 | 1.014 | 13.825 | 0.57 | 7.99 |
| Example 5 | 0.918 | 13.753 | 0.609 | 7.69 |
| Example 6 | 0.897 | 13.980 | 0.638 | 8.00 |
| Example 7 | 0.903 | 14.090 | 0.626 | 7.96 |
| Example 8 | 1.014 | 13.852 | 0.574 | 8.06 |
| Example 9 | 0.926 | 13.464 | 0.607 | 7.57 |
| Example 10 | 0.912 | 13.716 | 0.628 | 7.86 |
| Example 11 | 1.007 | 13.110 | 0.594 | 7.84 |
| Example 12 | 0.927 | 13.550 | 0.622 | 7.81 |
| Example 13 | 0.975 | 13.579 | 0.586 | 7.76 |
| Example 14 | 0.905 | 13.439 | 0.678 | 8.25 |
| Example 15 | 1.019 | 13.213 | 0.615 | 8.28 |

In Table 2, the second unit according to one embodiment of the present specification includes a structure in which two Fs substitute an ortho position of the benzene ring, and therefore, the two Fs interact with an S atom of the thiophene of the second unit, and interact with the first unit and the third unit, which increases polymer planarity, increasing solubility and having excellent electronic properties. Accordingly, it was seen that the organic solar cells of Examples 1 to 15 including the same had a higher current value, and had excellent energy conversion efficiency compared to Comparative Polymer 1 including a structure in which two Fs of the second unit substitute a para position of the benzene ring. Specifically, Polymer 1 includes a structure in which Y1 and Y2 are CR'', and R'' is a thiophene group substituted with a branched alkyl group of the first unit of the present specification, and Polymers 2 and 14 include a structure in which Y1 and Y2 are CR'', and R'' is a halogen group of fluorine or chlorine; and a thiophene group substituted with a branched alkyl group of the first unit of the present specification, and therefore, it was seen that the halogen atom and/or S of the thiophene of the first unit, O of the third unit, and S of the thiophene and two Fs bonding to an ortho position of the benzene ring of the second unit interacted with each other achieving excellent electrical properties, and efficiency of the organic solar cell including the same was very superior.

The $V_{oc}$ means an open-circuit voltage, the means a short-circuit current, the FF means a fill factor, and the η means energy conversion efficiency. The open-circuit voltage and the short-circuit current are respectively an x-axis and a y-axis intercept in the four quadrants of a voltage-current density curve, and as these two values increase, solar cell efficiency is preferably enhanced. In addition, the fill factor is a value dividing the rectangle area that may be drawn inside the curve by the product of the short-circuit current and the open-circuit voltage. The energy conversion efficiency may be obtained when these three values are divided by the intensity of irradiated light, and it is preferred as the value is higher.

What is claimed is:

1. A polymer selected from one of the following structures:

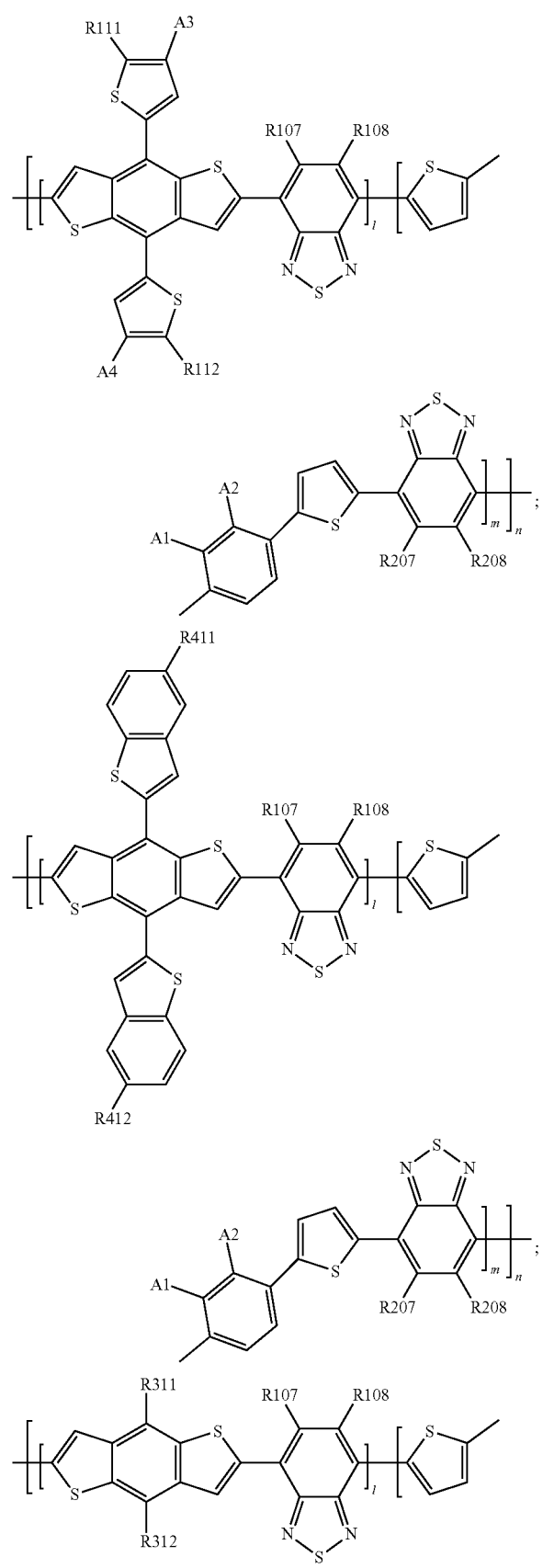
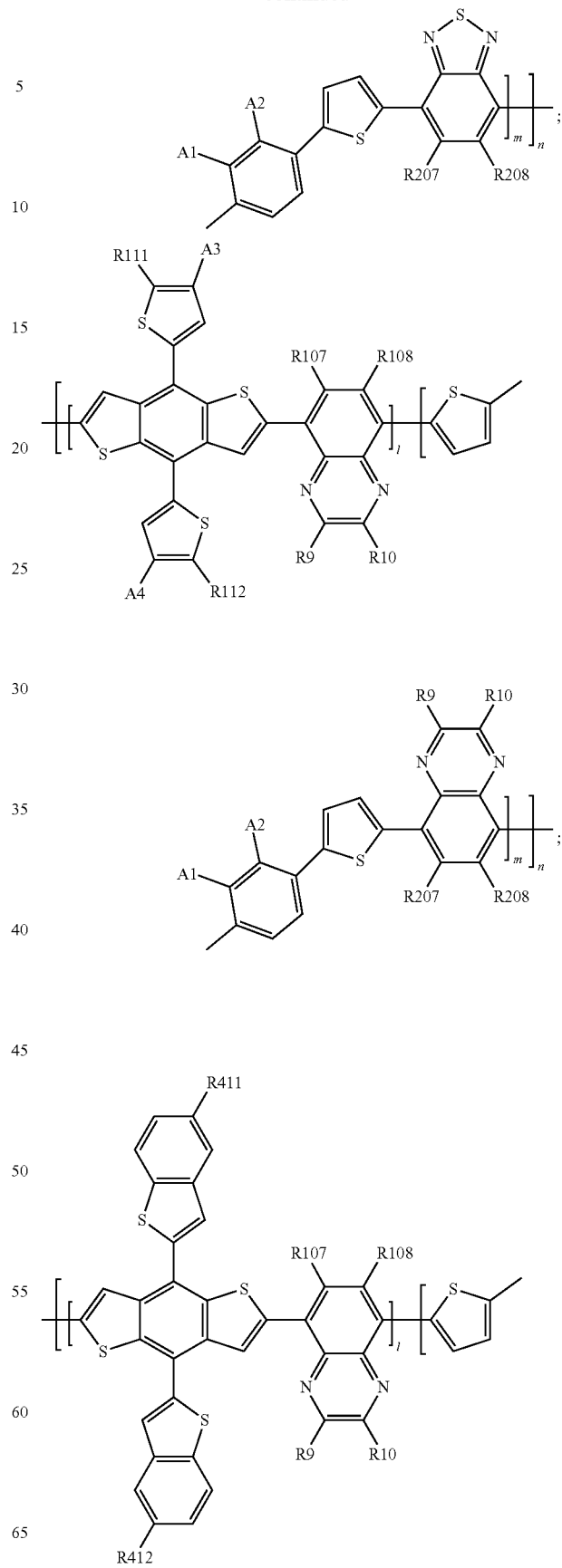

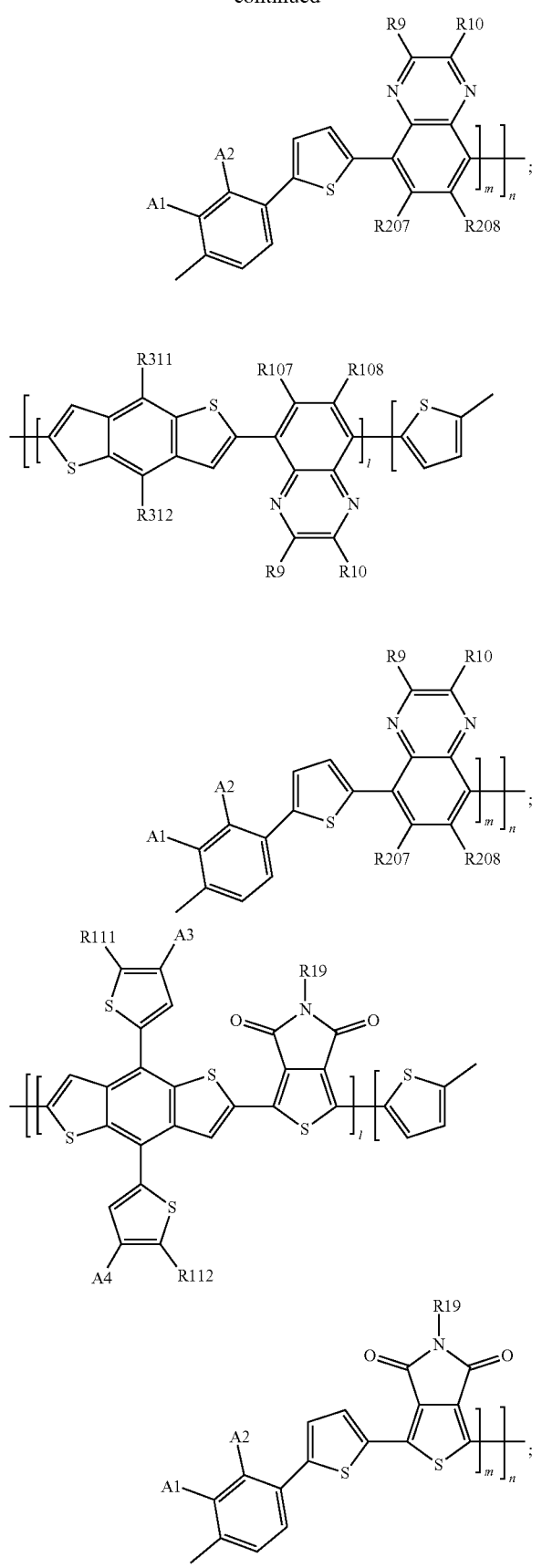
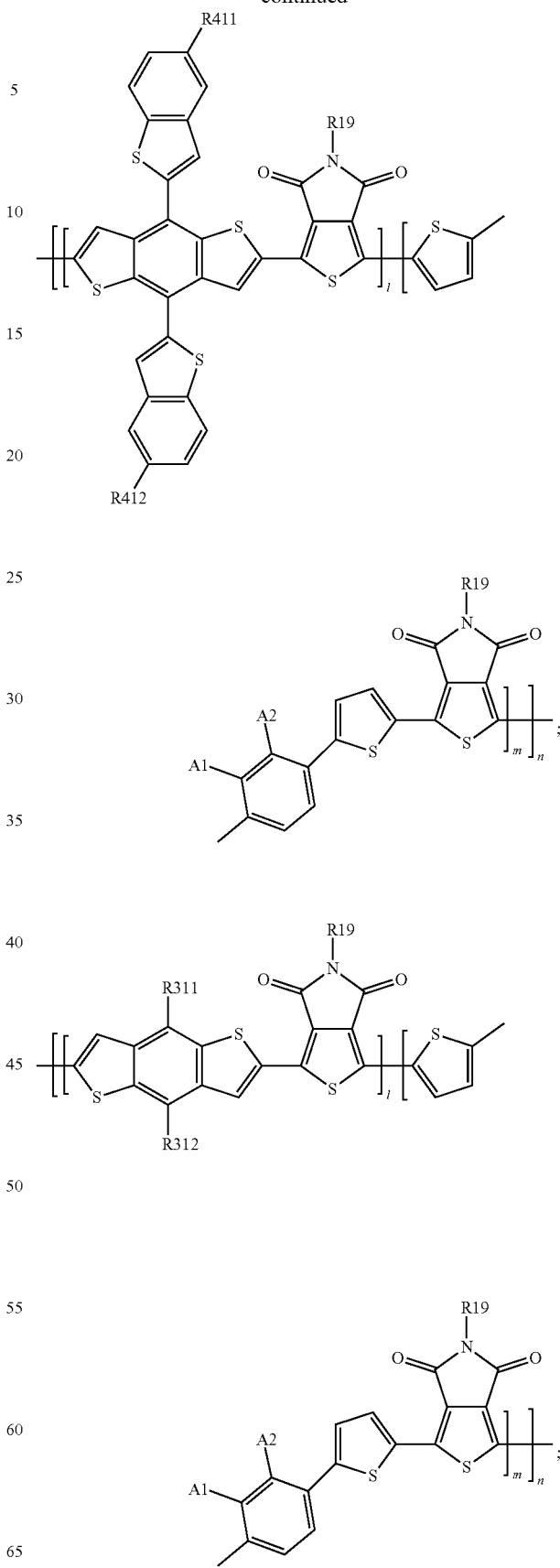

117
-continued
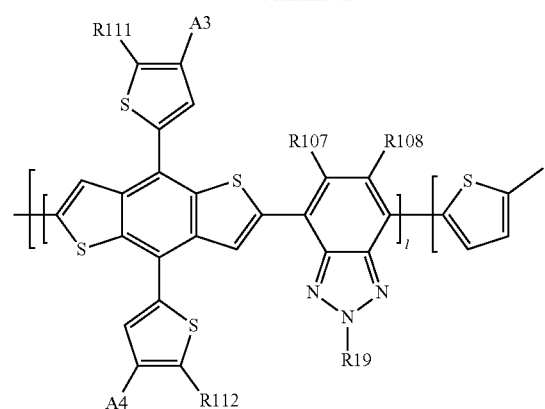
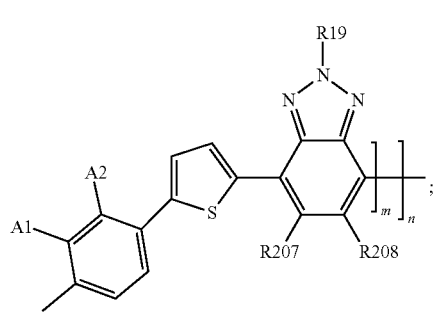
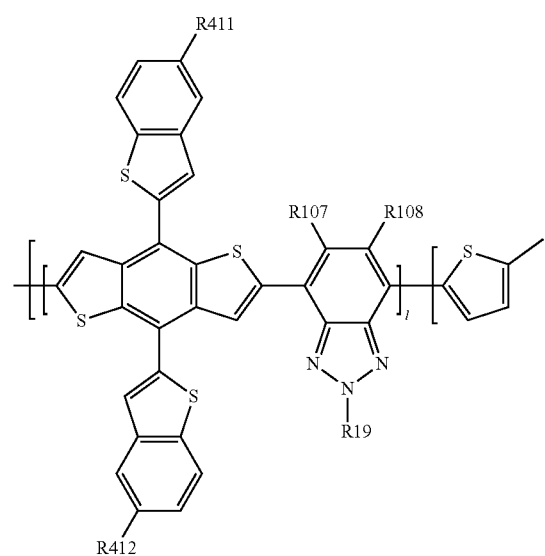
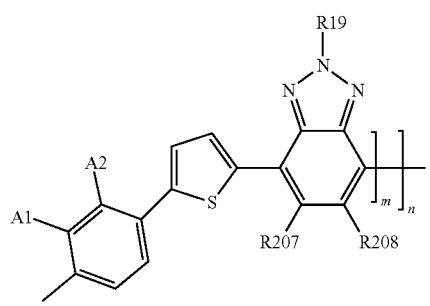
118
-continued
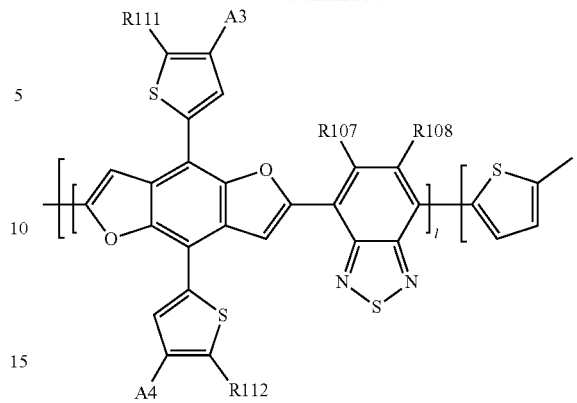
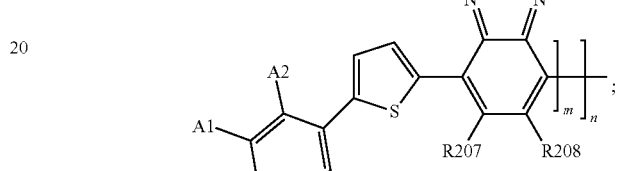
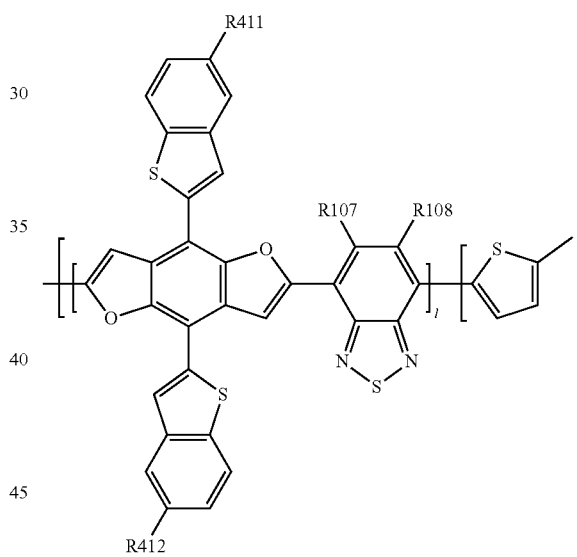
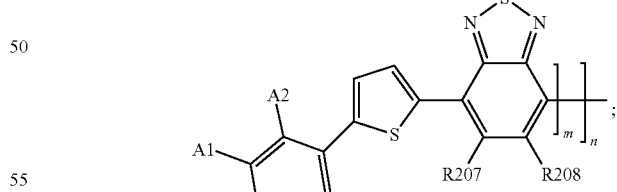
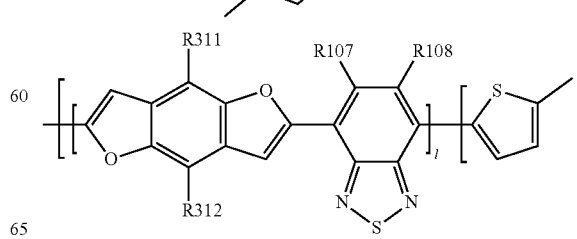

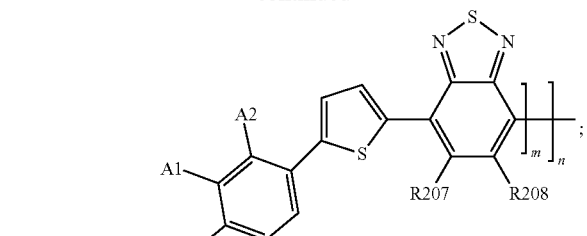
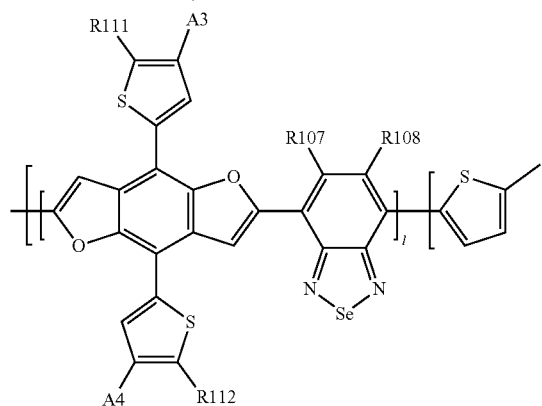
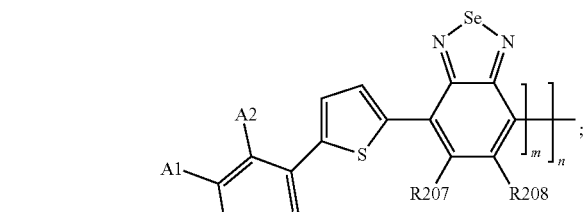
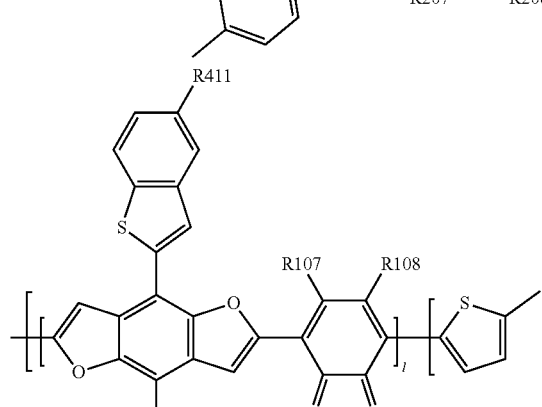
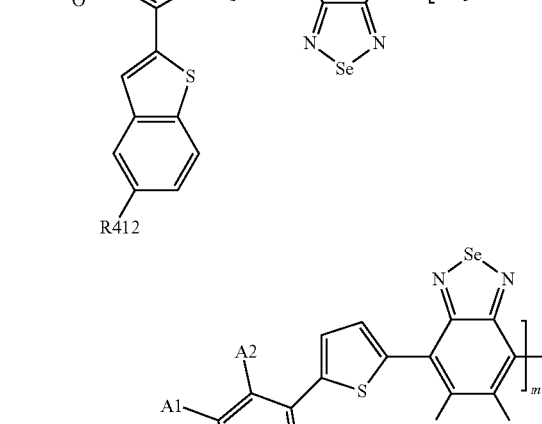
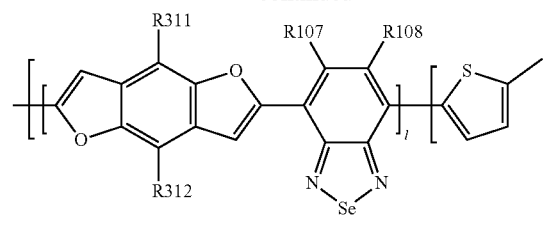
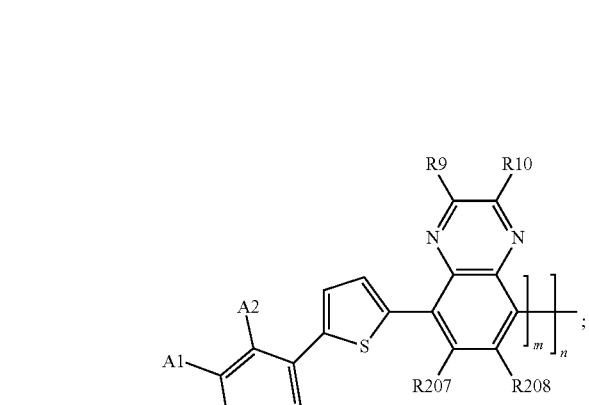
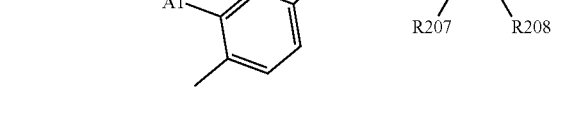

121
-continued
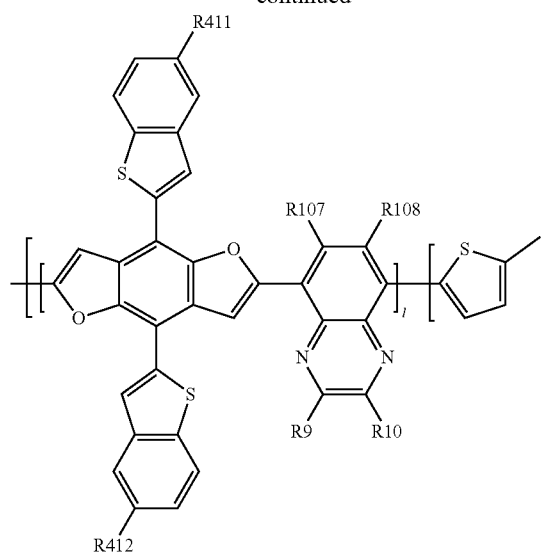
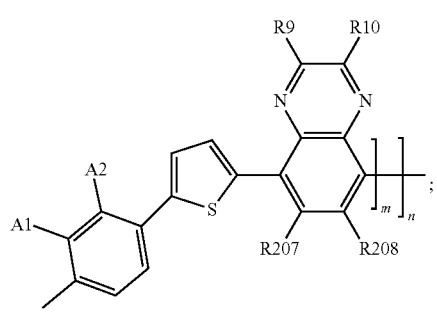
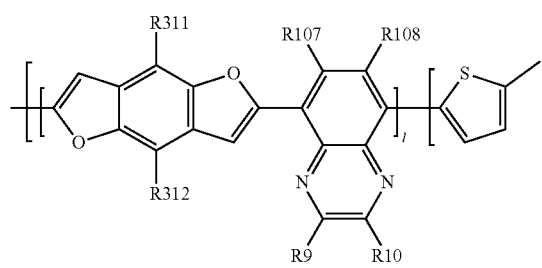
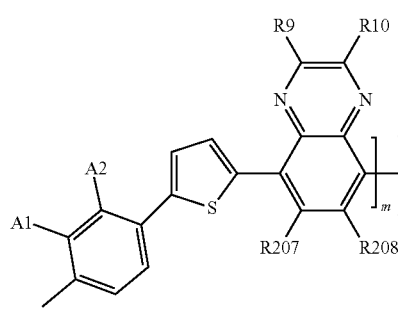
122
-continued
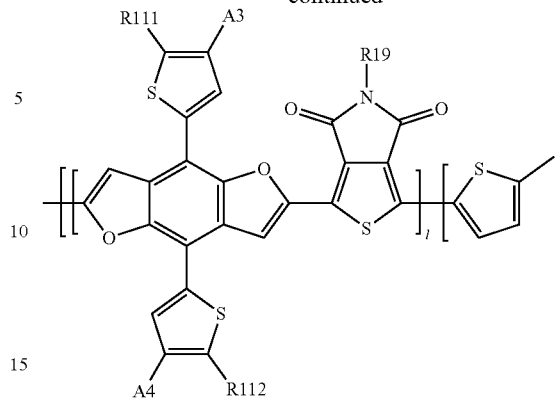
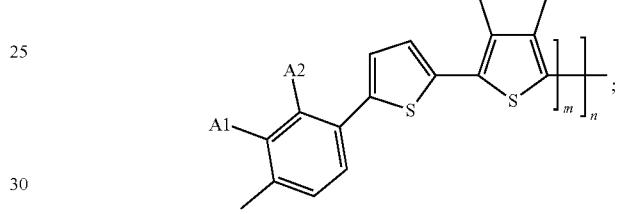
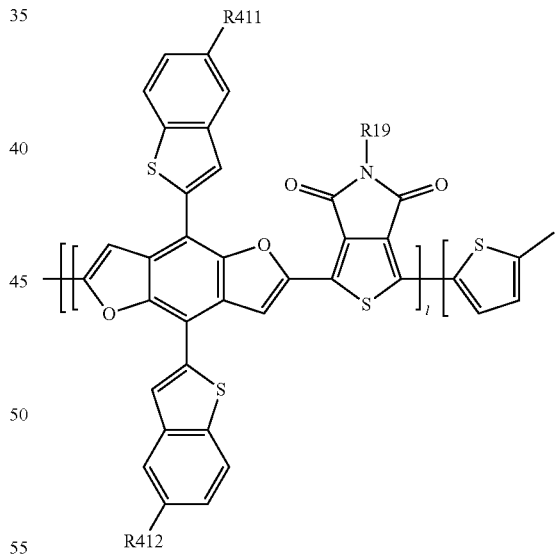
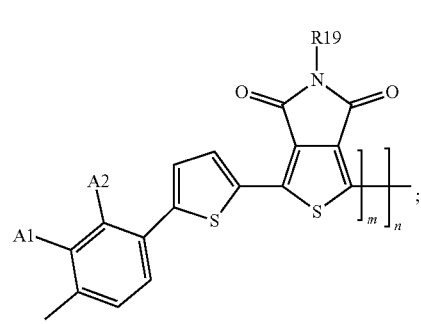

123
-continued

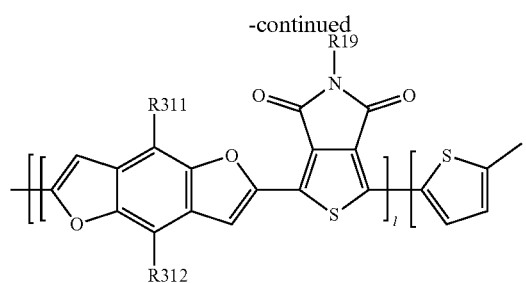

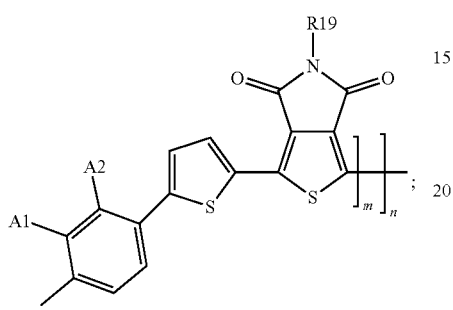

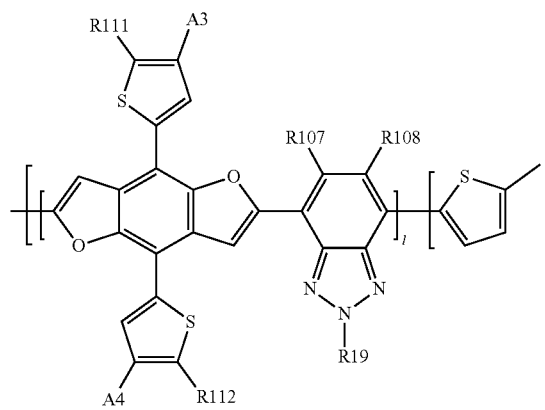

124

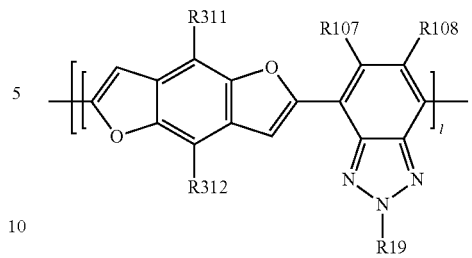

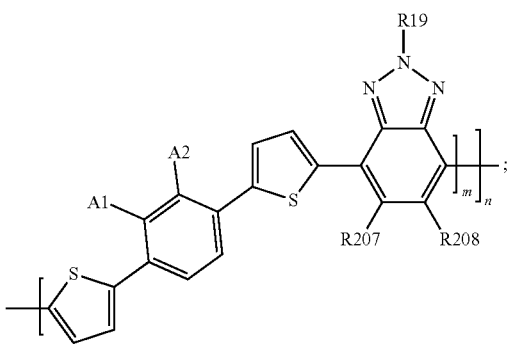

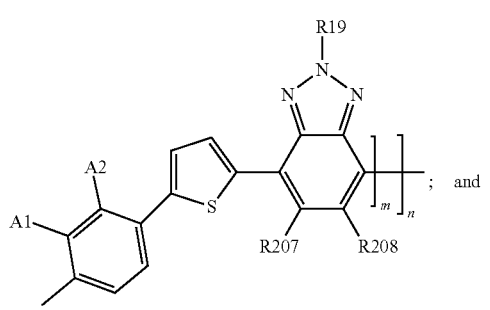; and wherein

A1 and A2, are independently a halogen group;

A3, and A4 are independently hydrogen or a halogen group;

R107, R108, R207 and R208 are the same as or different from each other, and are each independently a substituted or unsubstituted alkoxy group;

R111 and R112 are independently a substituted or unsubstituted alkyl group, a substituted or unsubstituted silyl group, or a substituted or unsubstituted alkylthio group when A3 or A4 is a halogen group, and independently a substituted or unsubstituted silyl group or a substituted or unsubstituted alkylthio group when A3 and A4 are hydrogen and an acceptor unit of the polymer is benzothiadiazole;

R311 and R312 are independently a substituted or unsubstituted alkoxy group or a substituted or unsubstituted alkoxy substituted phenyl group;

R411 and R412 are independently a substituted or unsubstituted alkyl group or a substituted or unsubstituted alkoxy group;

R9, R10 and R19 are independently hydrogen, a substituted or unsubstituted alkyl group, a substituted or unsubstituted alkoxy group, a substituted or unsubstituted aryloxy group, a substituted or unsubstituted alkylthio group, a substituted or unsubstituted arylthio group, a substituted or unsubstituted aryl group, or a substituted or unsubstituted heterocyclic group; l is a mole fraction and is a real number of 0<l<1;

m is a mole fraction and is a real number of 0<m<1;

l+m=1; and n is a repetition number of the unit and is an integer of 1 to 10,000.

2. A polymer comprising a unit of any one of the following Chemical Formulae 5-5, 5-6, 5-10, 5-11, 5-15, 5-16, 5-19 to 5-23, 5-25, 5-26, 5-30, 5-32, 5-33, 5-37 and 5-40 to 5-60:

[Chemical Formula 5-5]
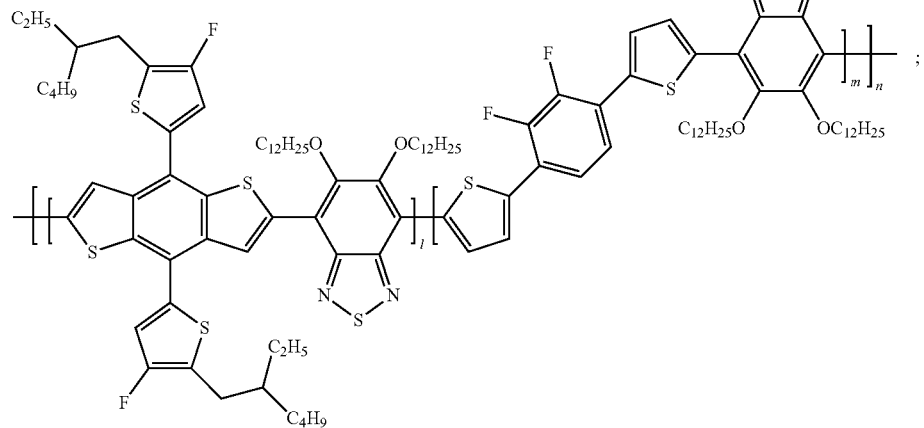
[Chemical Formula 5-6]
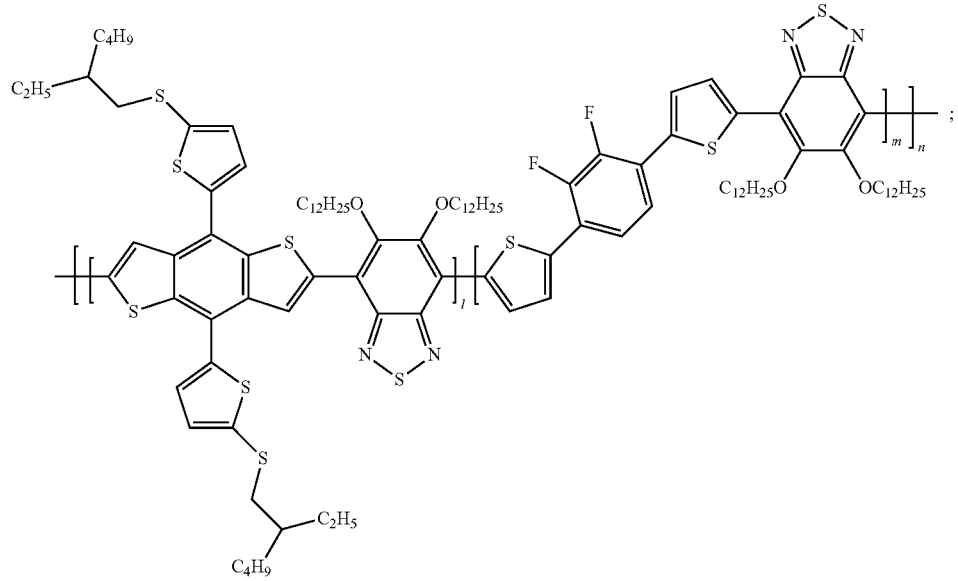
[Chemical Formula 5-10]
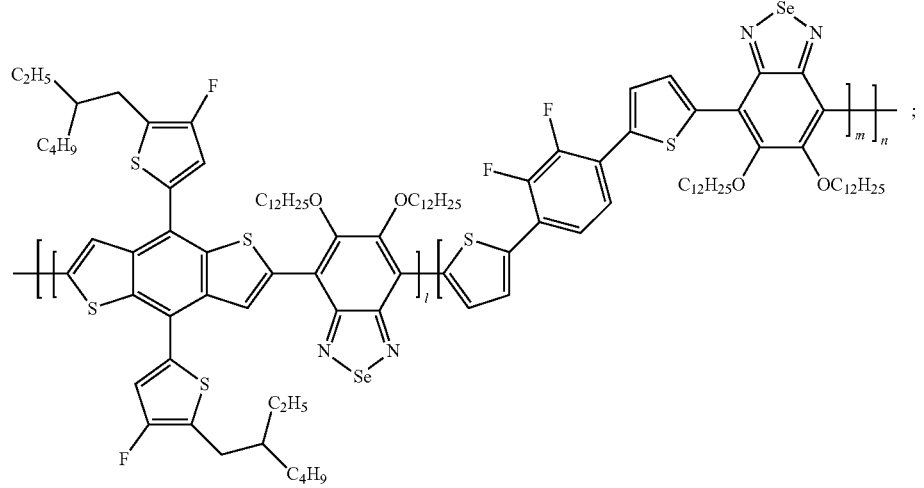

[Chemical Formula 5-11]
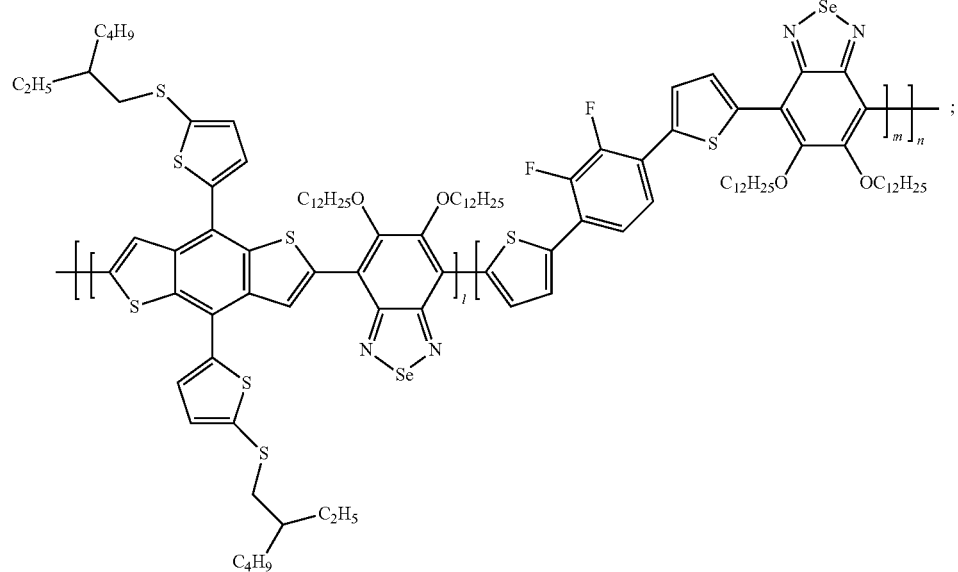
[Chemical Formula 5-15]
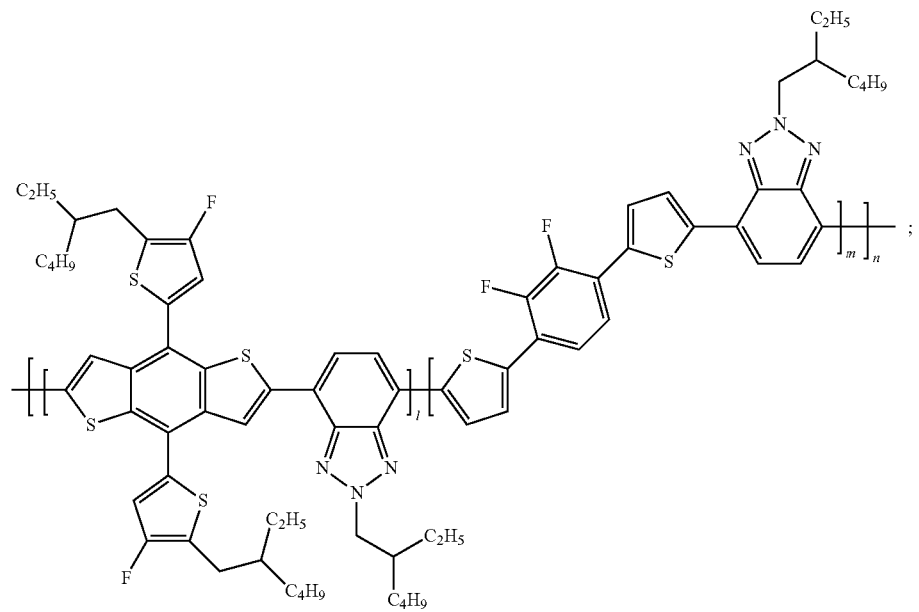

-continued
[Chemical Formula 5-16]
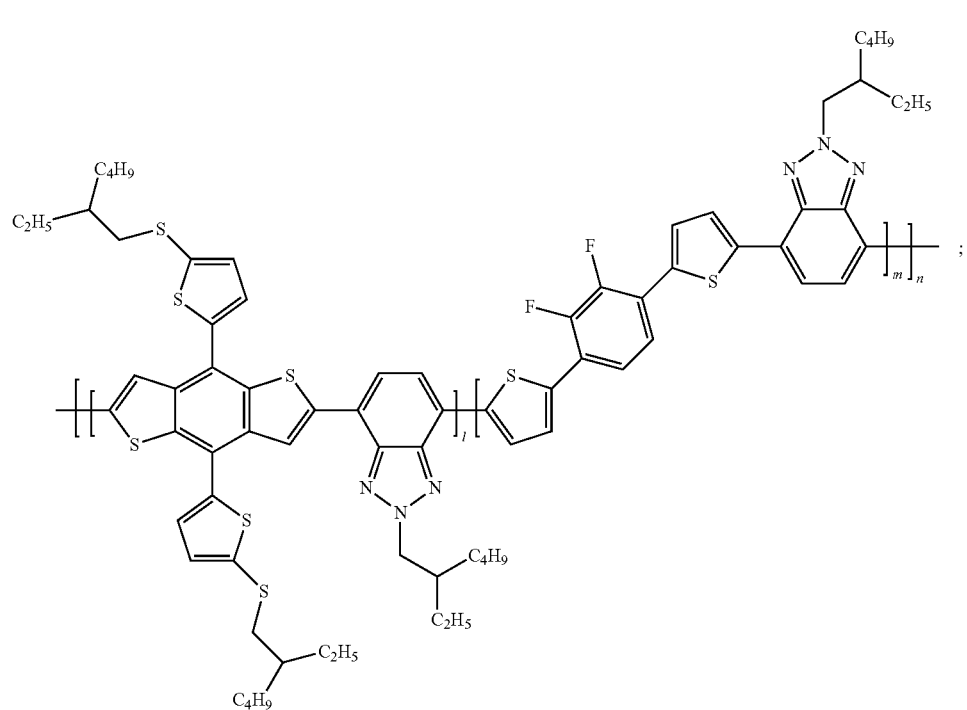
[Chemical Formula 5-19]
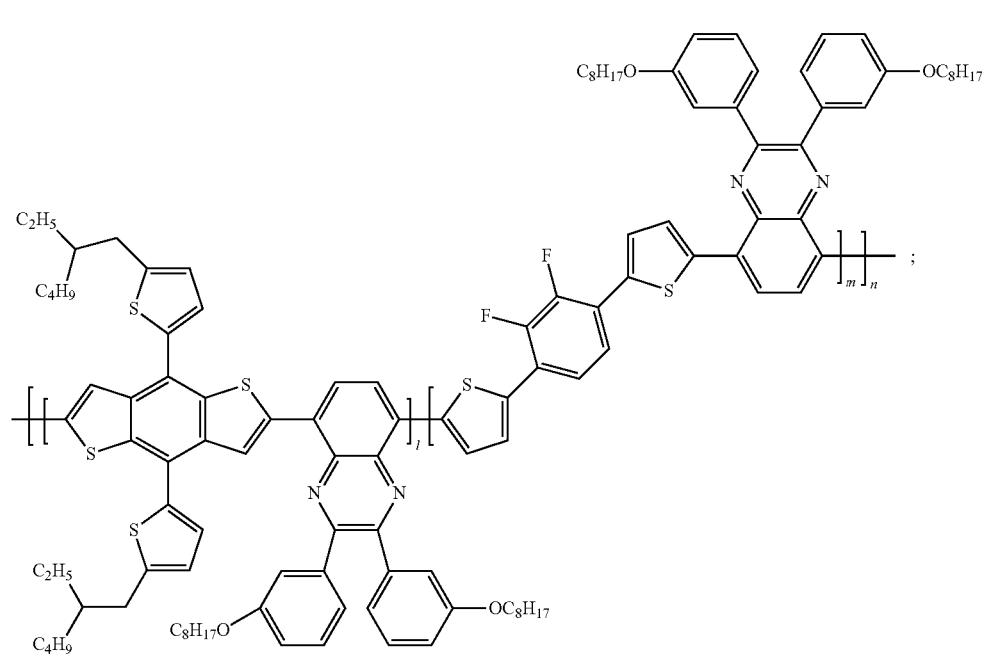

[Chemical Formula 5-20]
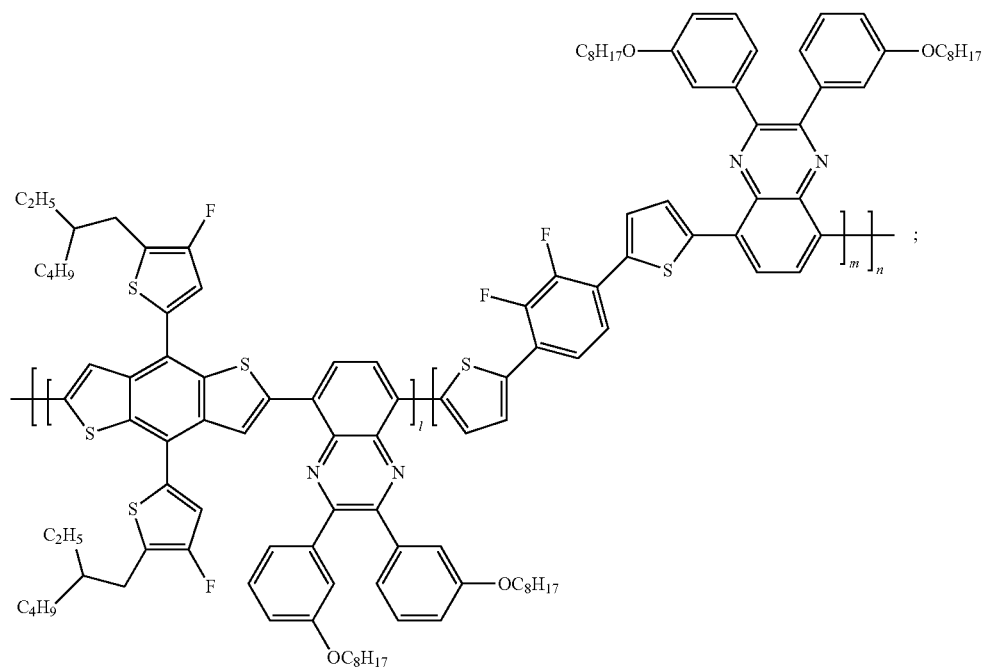
[Chemical Formula 5-21]
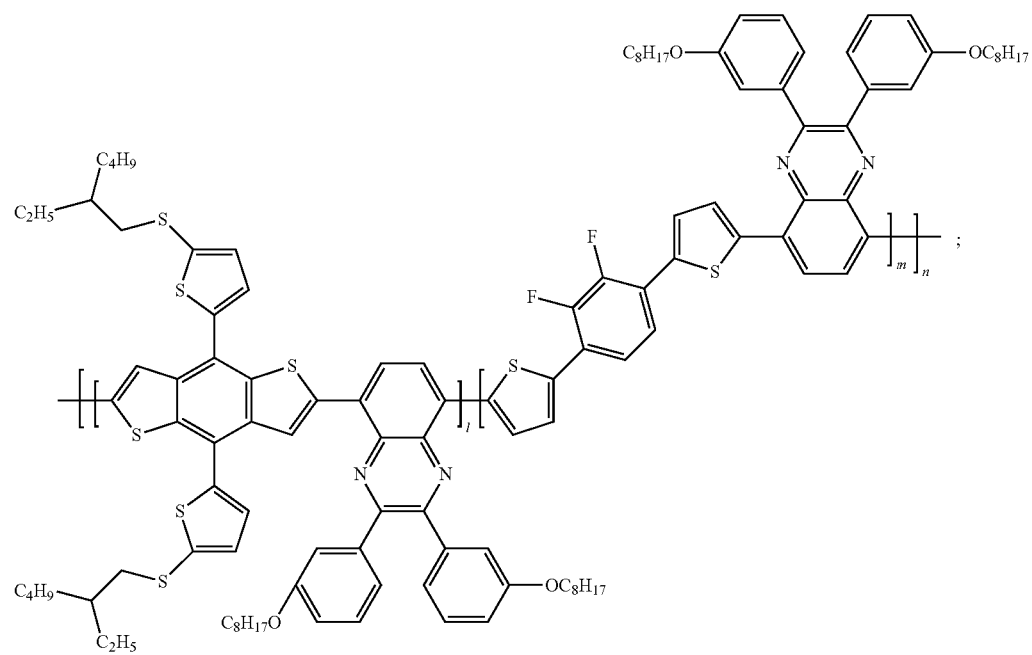

-continued
[Chemical Formula 5-22]
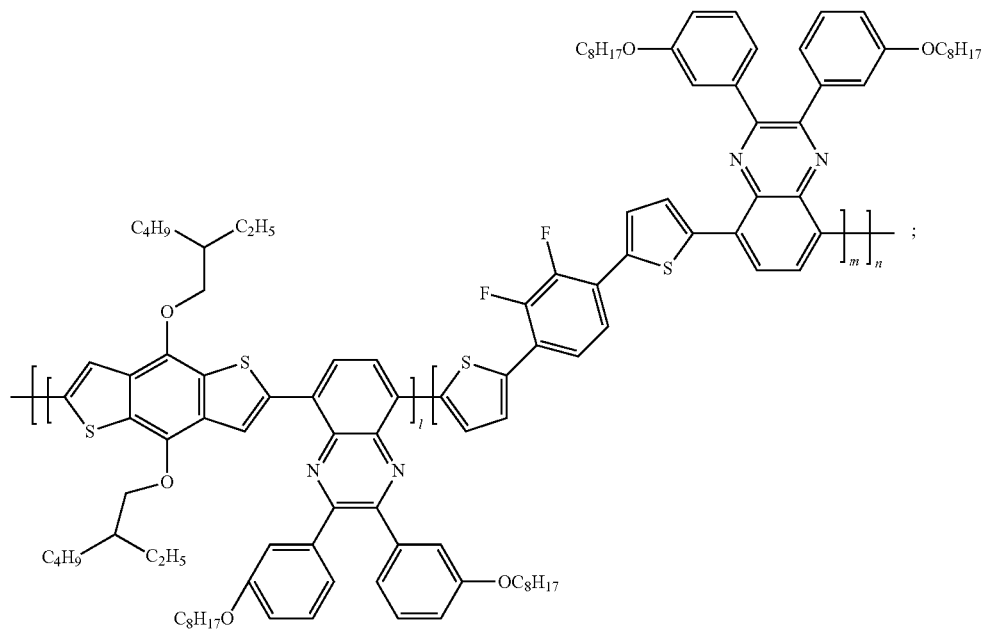
[Chemical Formula 5-23]
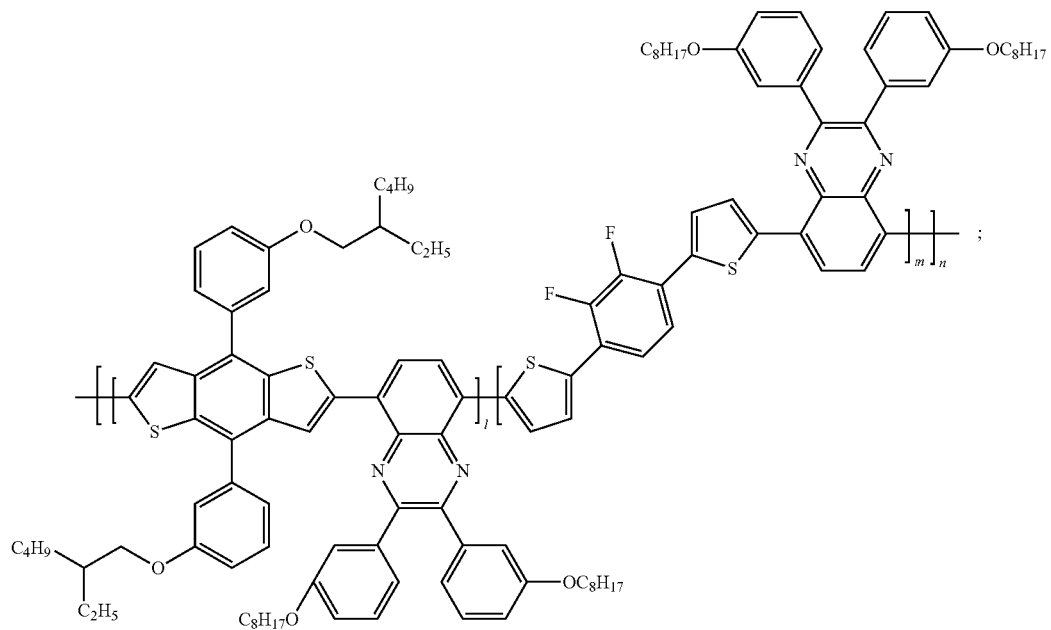

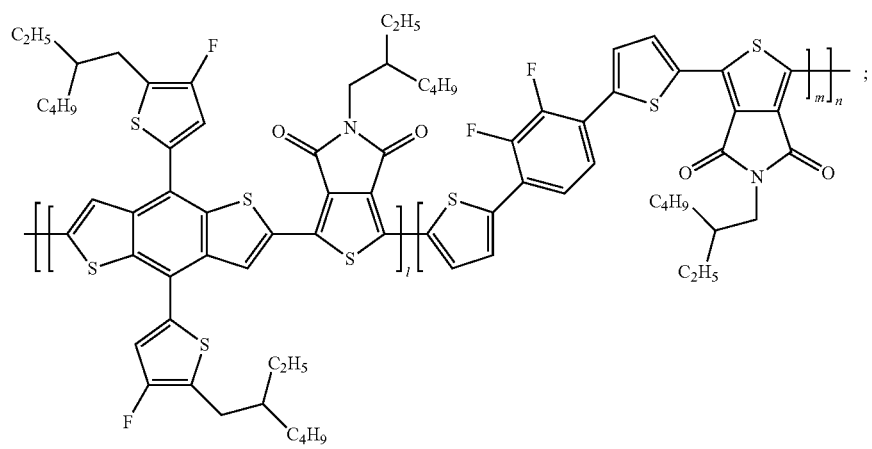
[Chemical Formula 5-25]
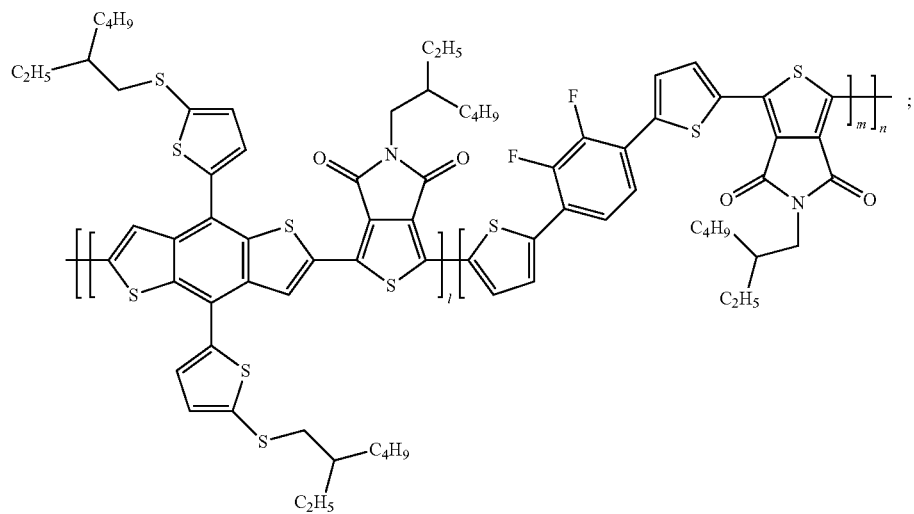
[Chemical Formula 5-26]
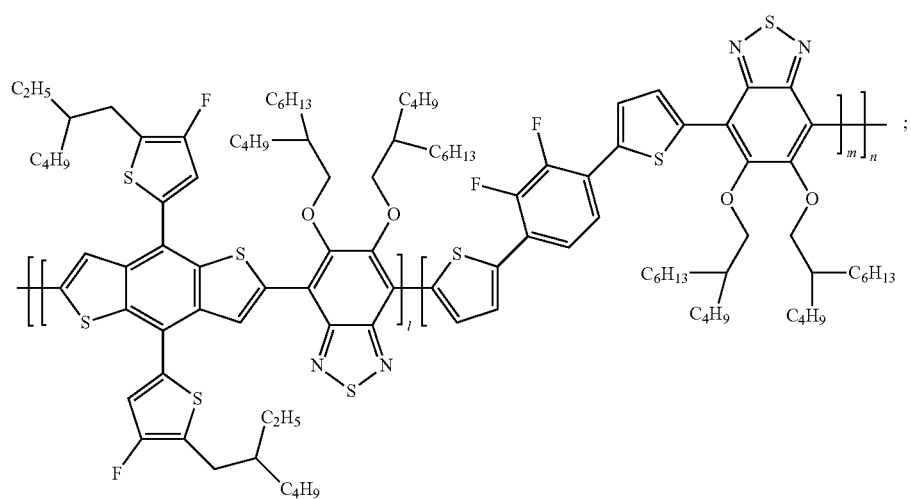
[Chemical Formula 5-30]

[Chemical Formula 5-32]
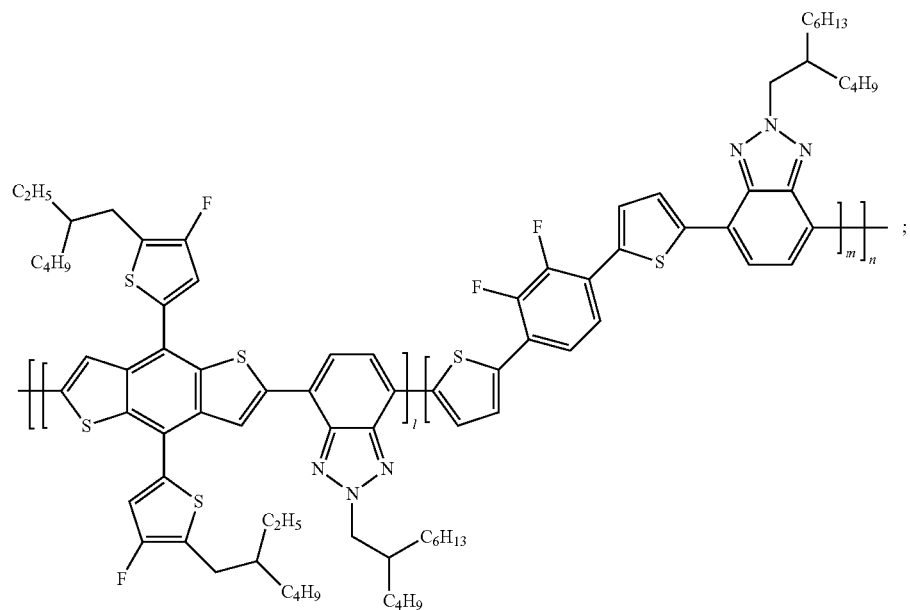
[Chemical Formula 5-33]
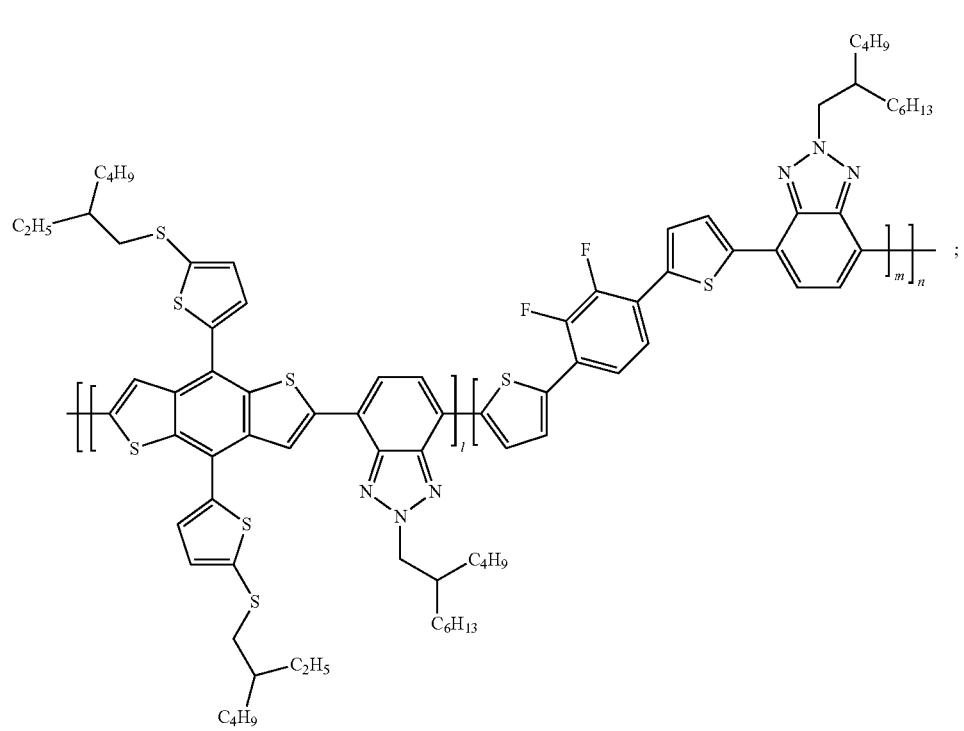

[Chemical Formula 5-37]
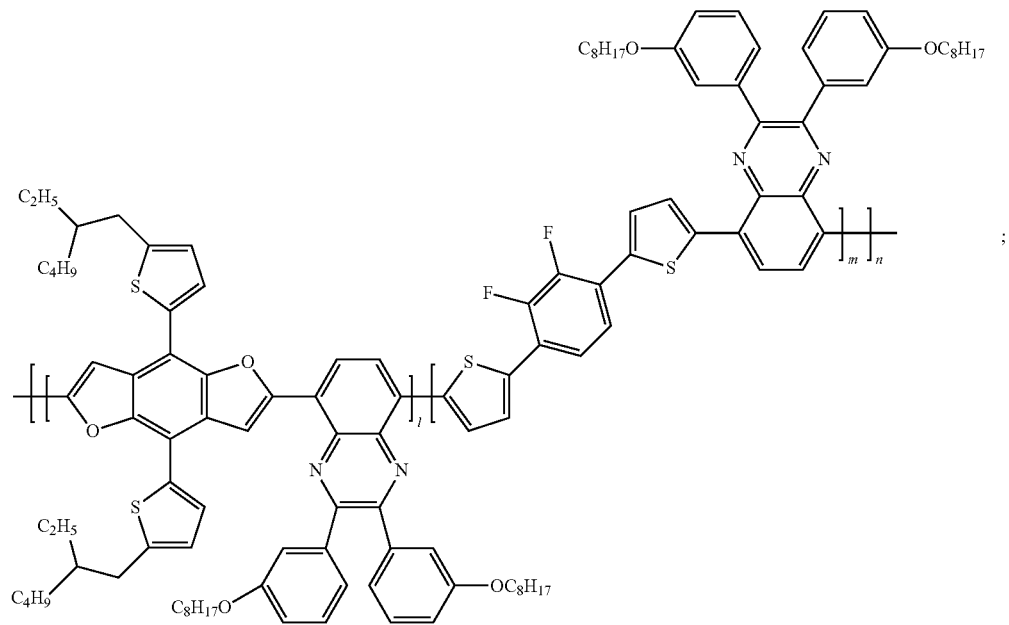
[Chemical Formula 5-40]
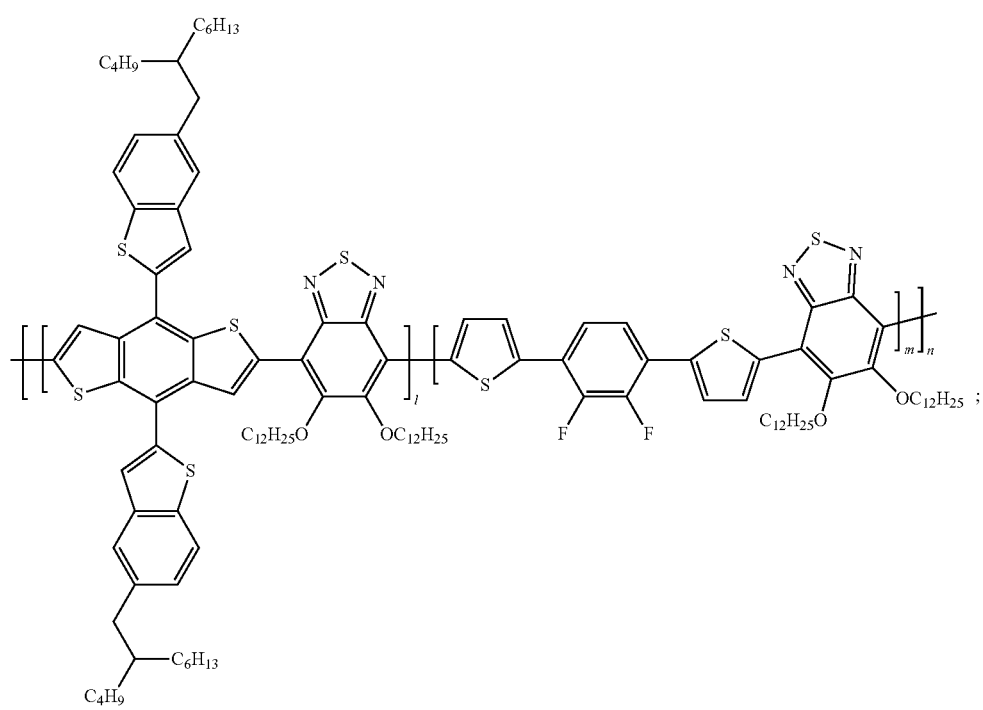

[Chemical Formula 5-41]
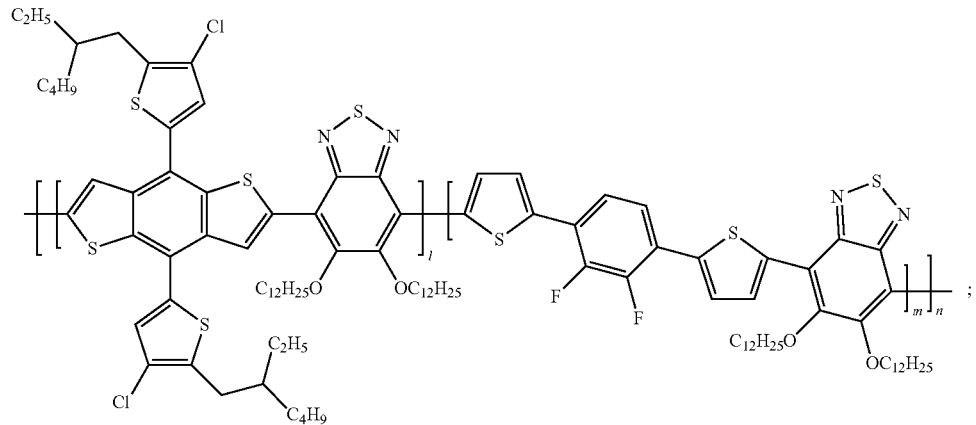
[Chemical Formula 5-42]
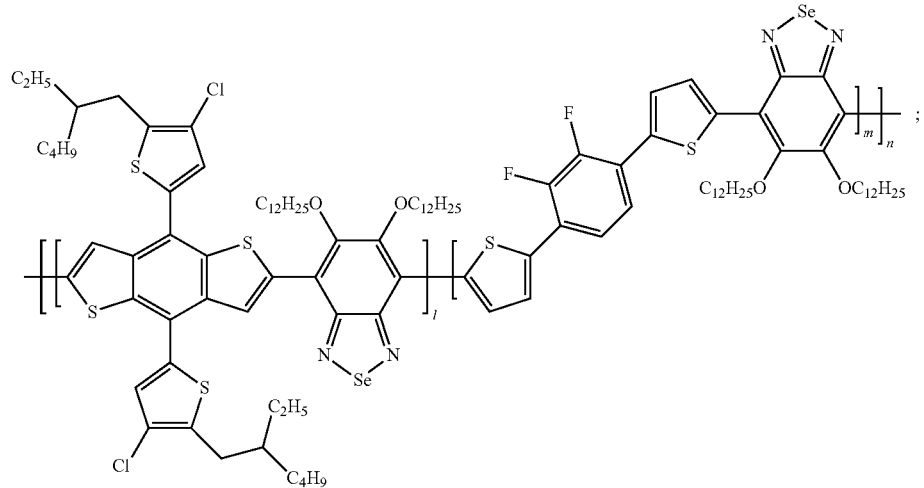
[Chemical Formula 5-43]
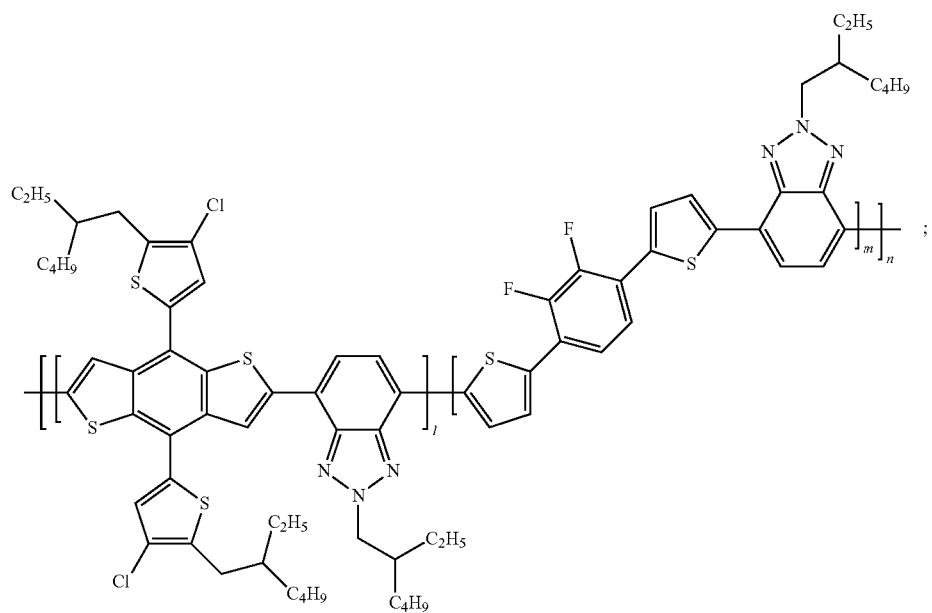

[Chemical Formula 5-44]
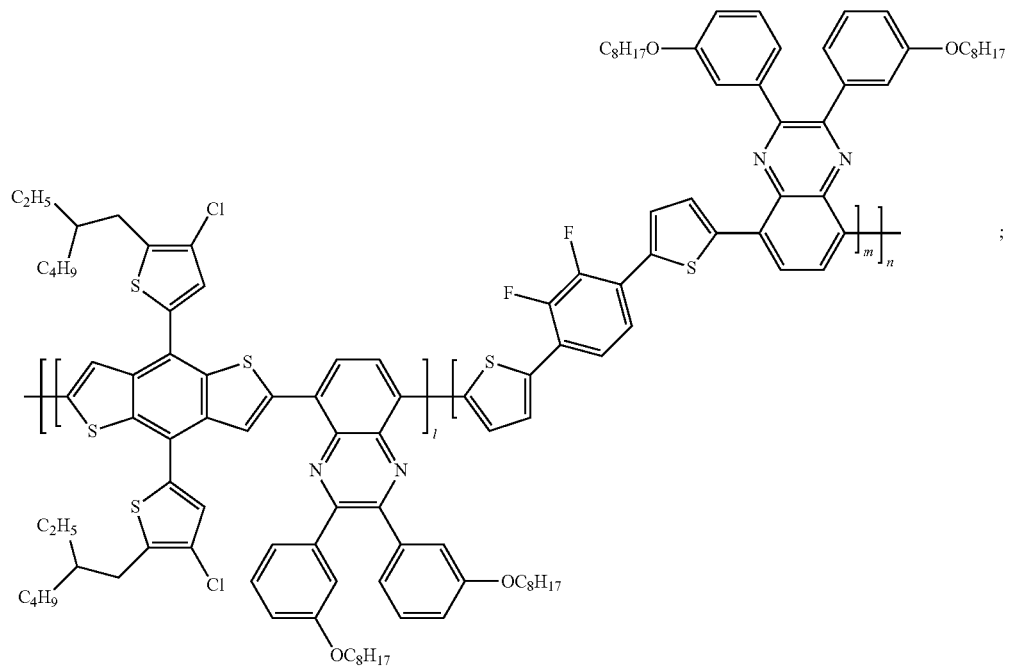
[Chemical Formula 5-45]
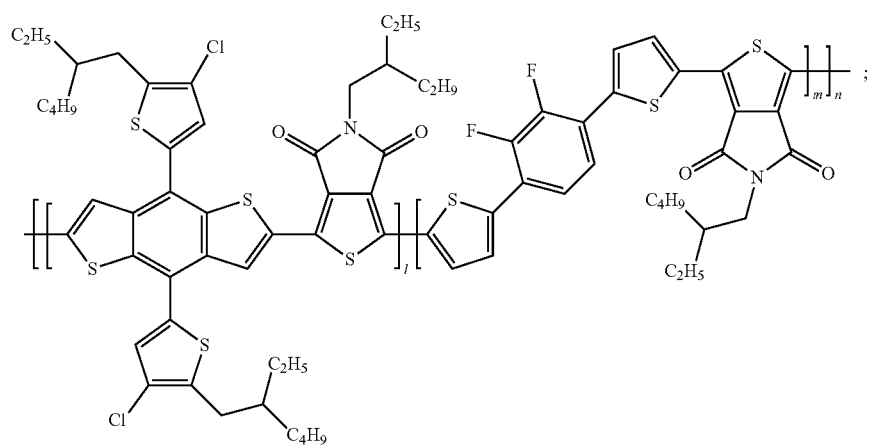
[Chemical Formula 5-46]
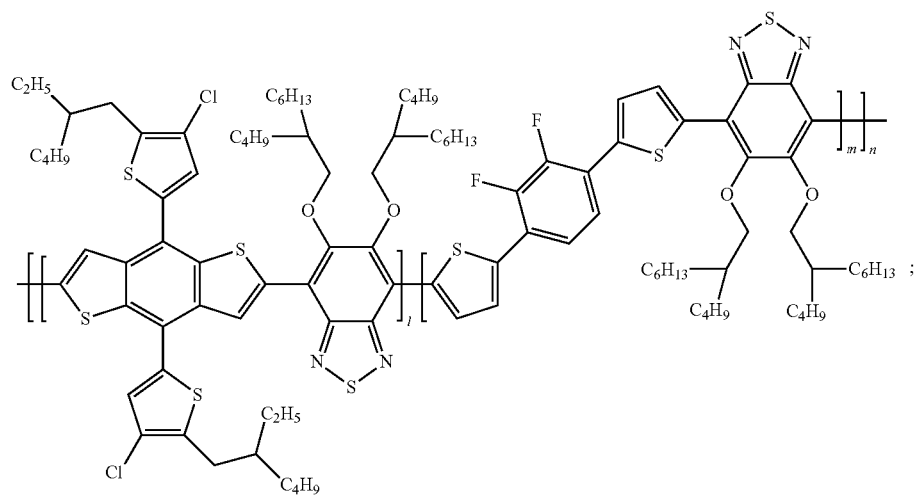

[Chemical Formula 5-47]
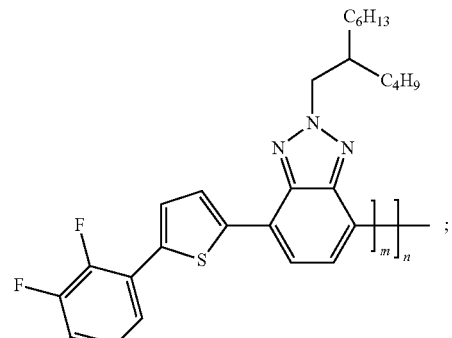
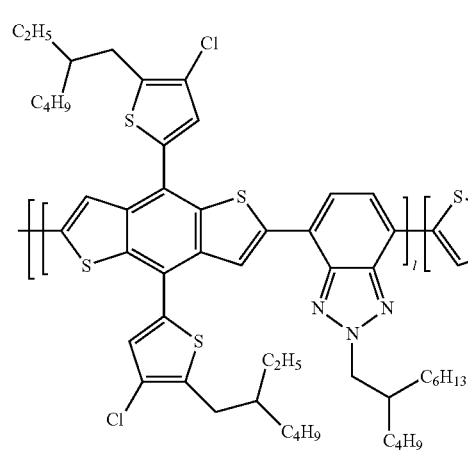
[Chemical Formula 5-48]
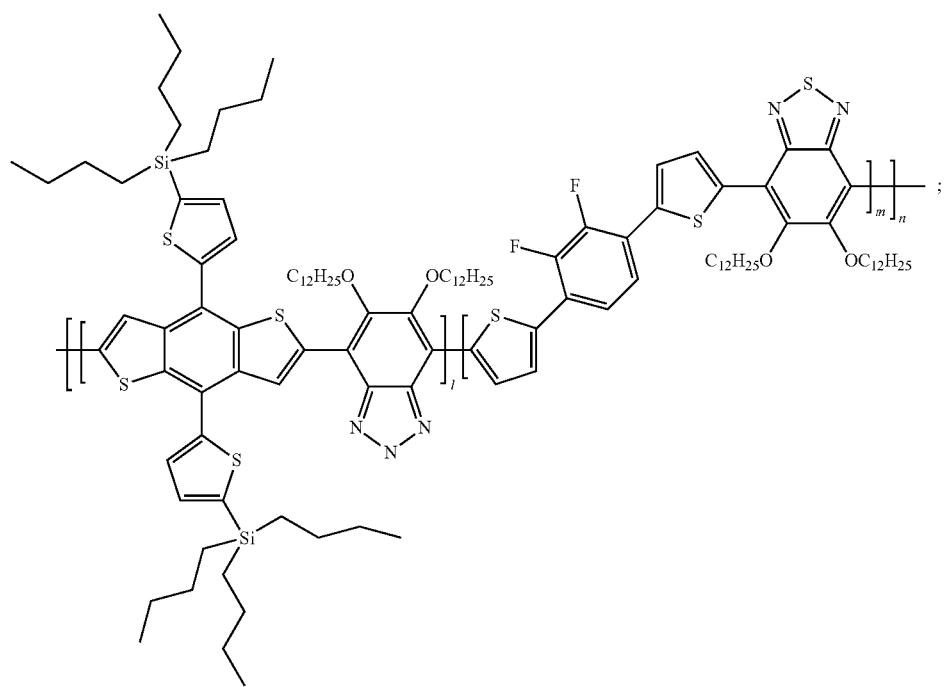

[Chemical Formula 5-49]
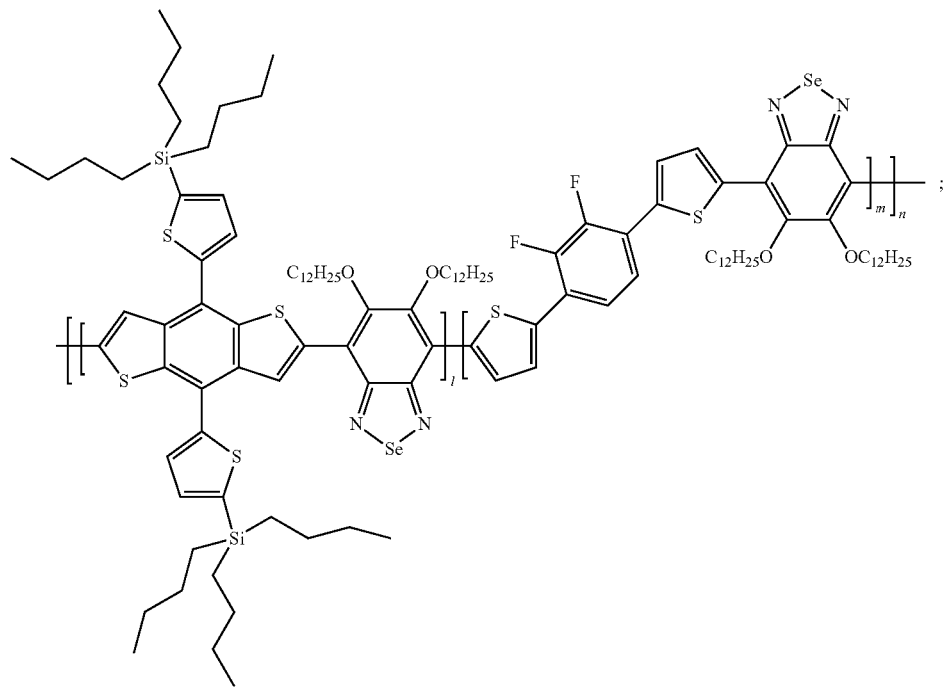
[Chemical Formula 5-50]
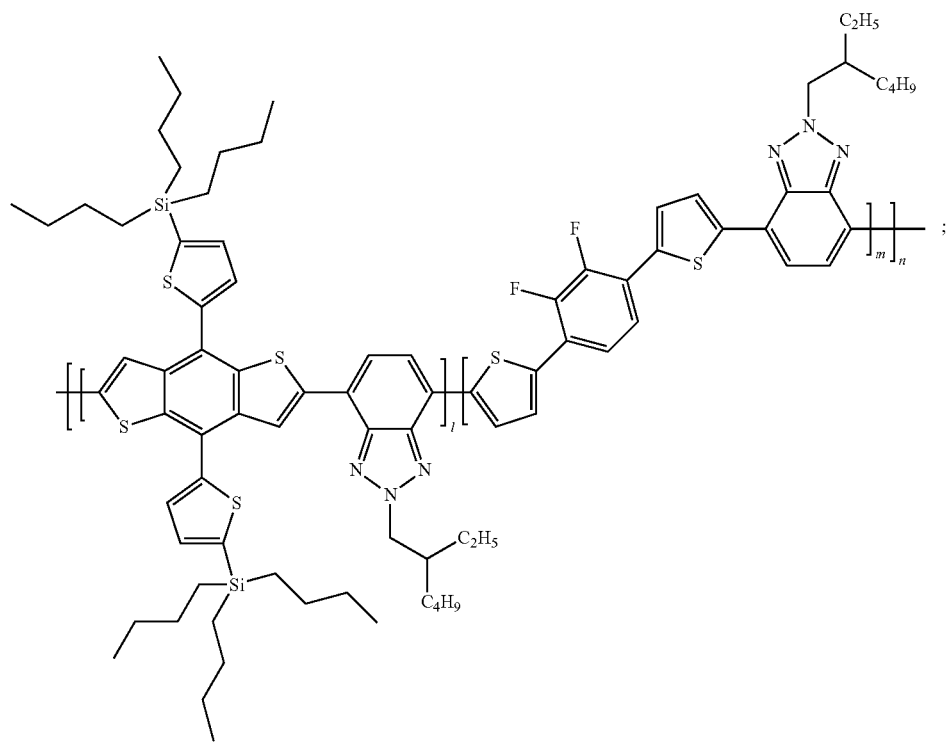

[Chemical Formula 5-51]
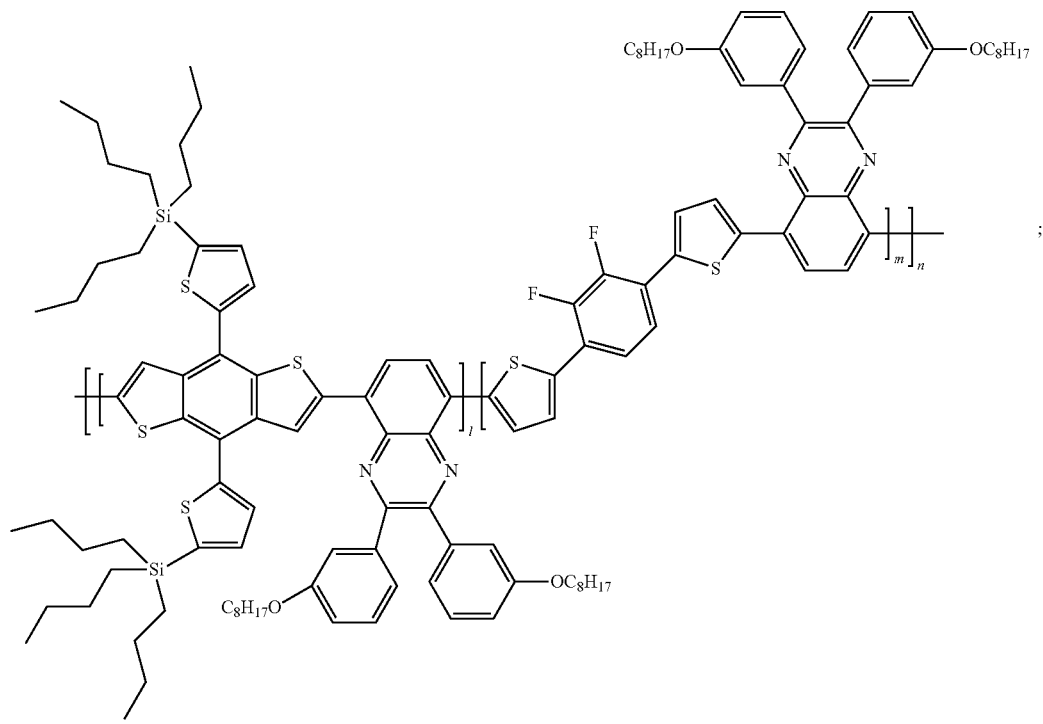
[Chemical Formula 5-52]
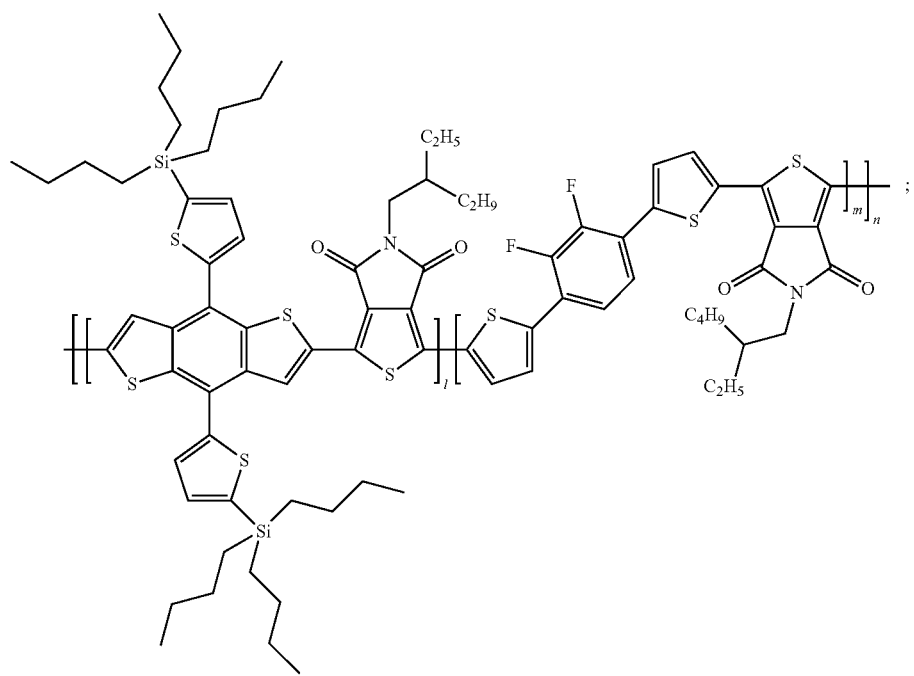

[Chemical Formula 5-53]
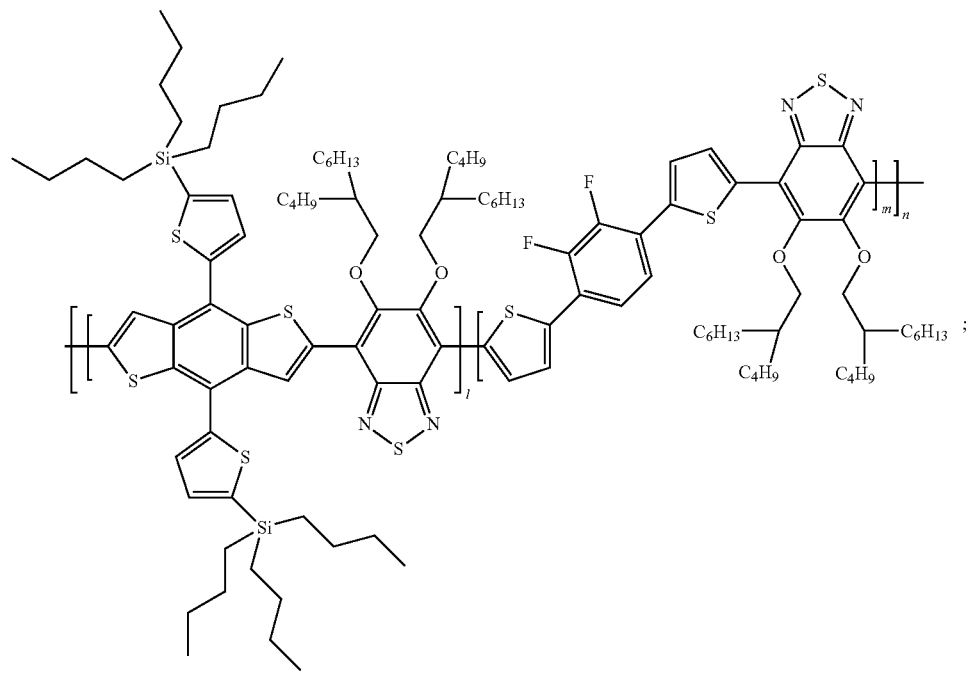
[Chemical Formula 5-54]
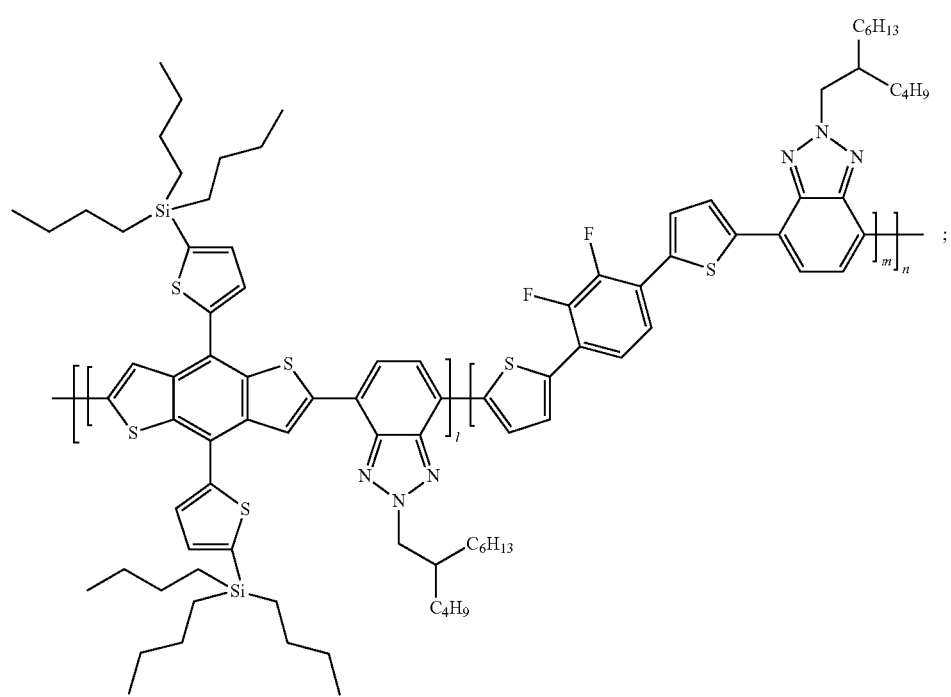

[Chemical Formula 5-55]
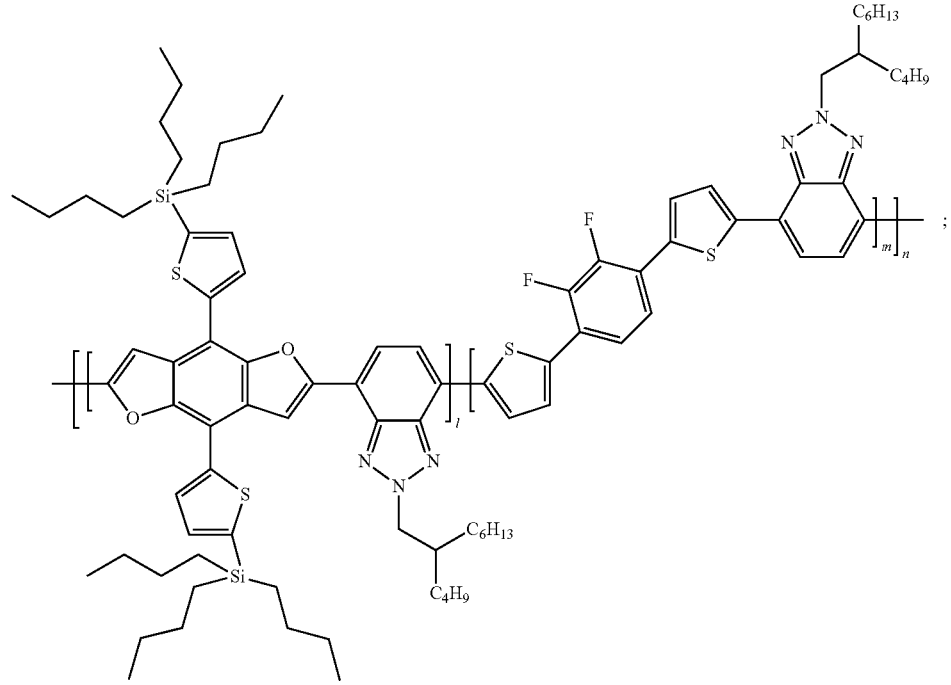
[Chemical Forula 5-56]
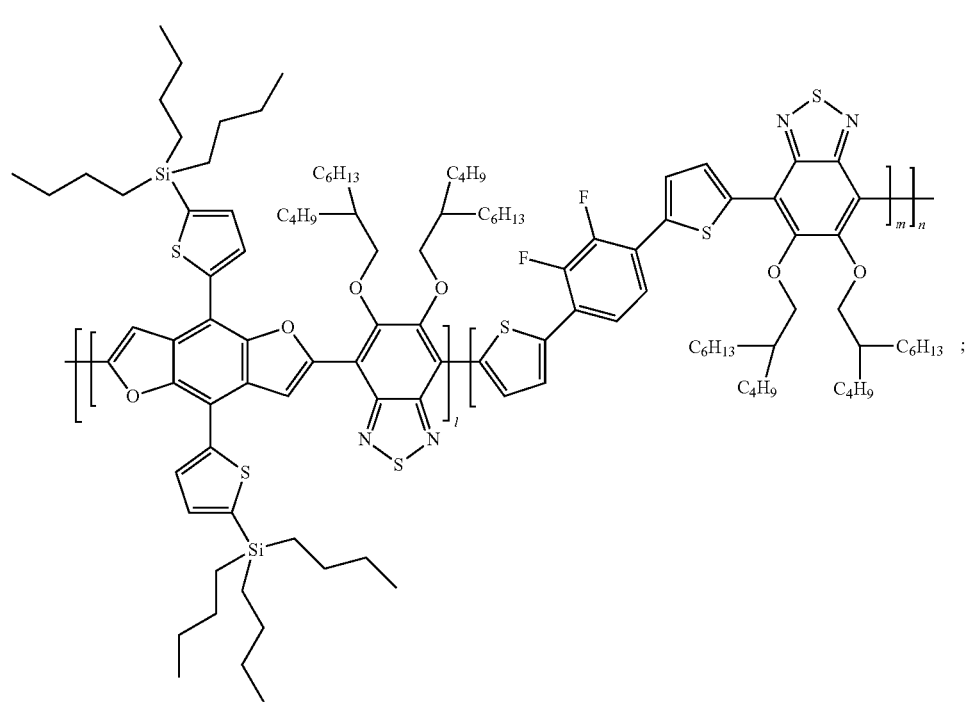

[Chemical Formula 5-57]
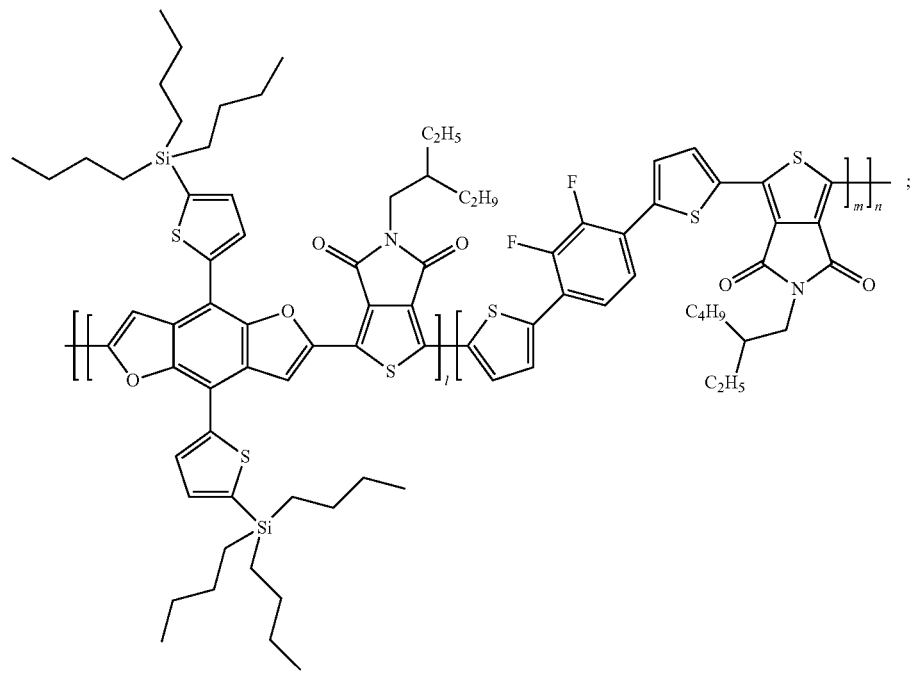
[Chemical Formula 5-58]
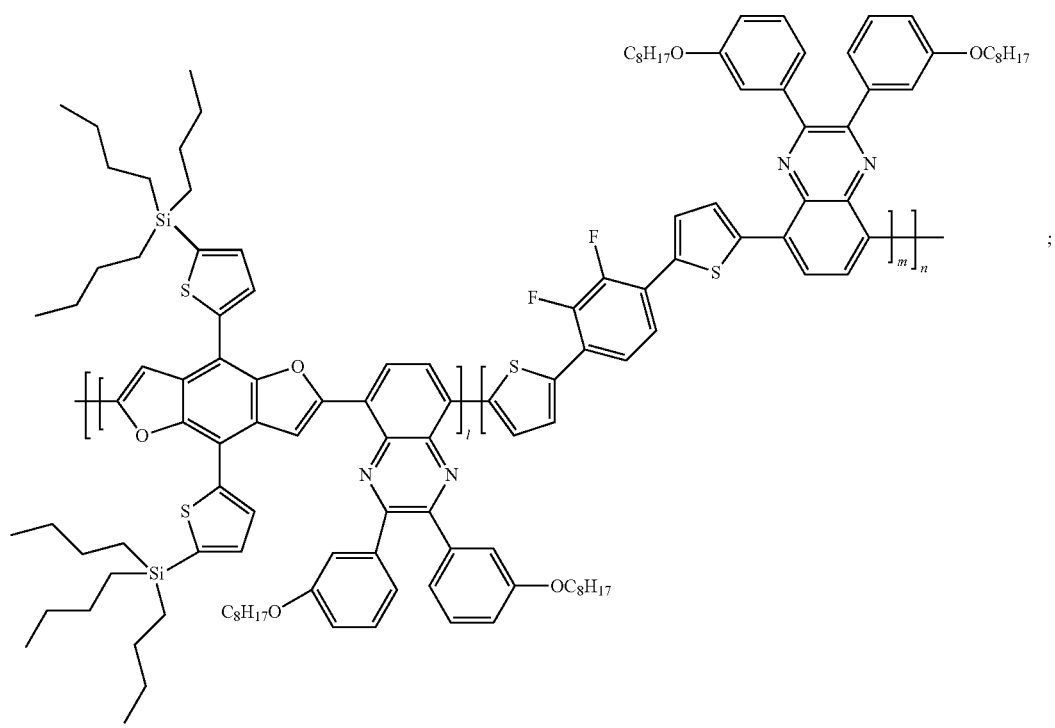

-continued

[Chemical Formula 5-59]

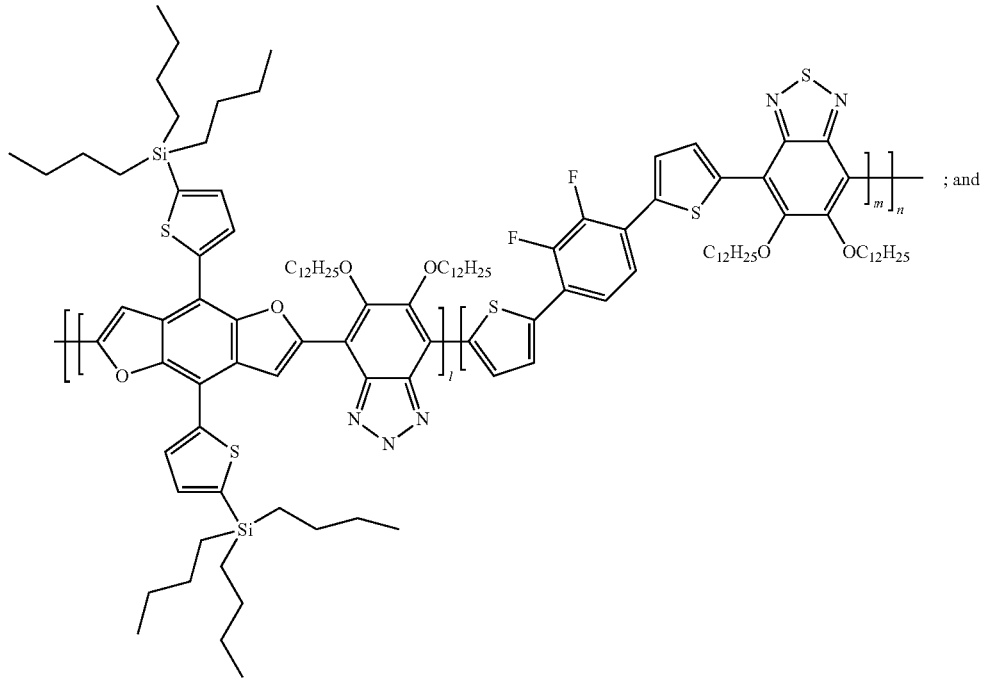

; and

[Chemical Formula 5-60]

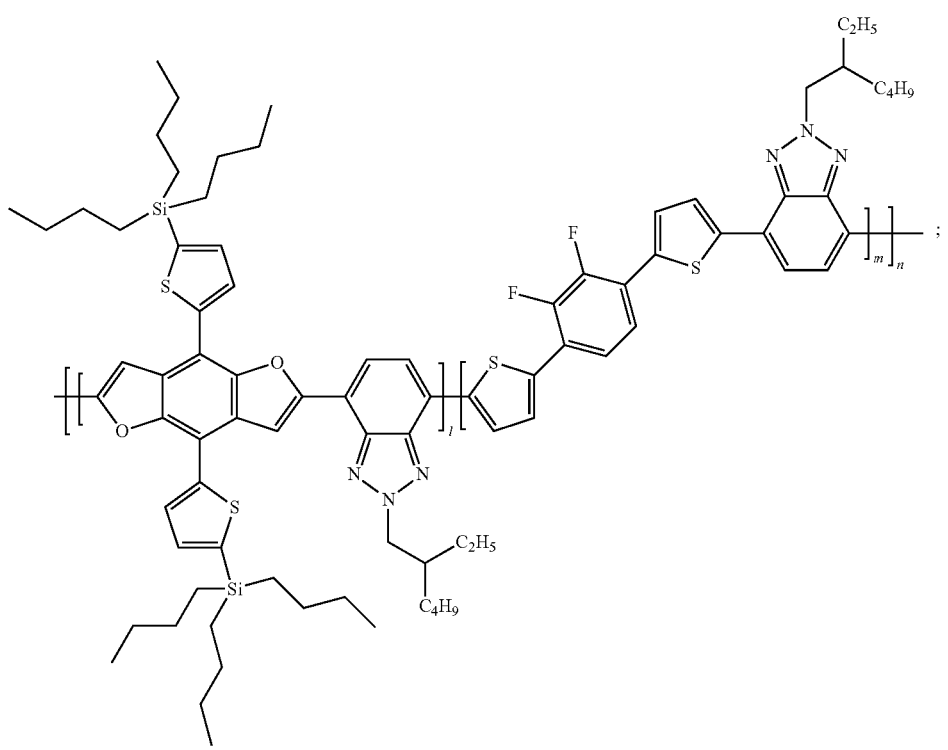

;

wherein:
l is a mole fraction and is a real number of 0<l<1;
m is a mole fraction and is a real number of 0<m<1;
l+m=1; and
n is a repetition number of the unit and is an integer of 1 to 10,000.

3. An organic solar cell comprising:
a first electrode;
a second electrode on the first electrode; and
one or more organic material layers that are between the first electrode and the second electrode and include a photoactive layer,
wherein the one or more organic material layers include the polymer of claim 1.

4. The organic solar cell of claim 3, wherein the photoactive layer includes one, two or more selected from the group consisting of an electron donor and an electron acceptor, and the electron donor includes the polymer.

5. The organic solar cell of claim 4, wherein the photoactive layer comprises the electron donor and the electron acceptor, and
   wherein the electron donor and the electron acceptor form a bulk heterojunction (BHJ).

\* \* \* \* \*